United States Patent
Yan et al.

(10) Patent No.: US 12,181,908 B2
(45) Date of Patent: Dec. 31, 2024

(54) PHOTOELECTRIC COMPUTING UNIT, PHOTOELECTRIC COMPUTING ARRAY, AND PHOTOELECTRIC COMPUTING METHOD

(71) Applicant: NANJING UNIVERSITY, Jiangsu (CN)

(72) Inventors: Feng Yan, Jiangsu (CN); Hongbing Pan, Jiangsu (CN); Haowen Ma, Jiangsu (CN); Donghai Shi, Jiangsu (CN); Zhangnan Li, Jiangsu (CN); Yuxuan Wang, Jiangsu (CN); Chenxi Wang, Jiangsu (CN); Xuan Chen, Jiangsu (CN); Tao Yue, Jiangsu (CN); Di Zhu, Jiangsu (CN); Yuanyong Luo, Jiangsu (CN); Zihao Wang, Jiangsu (CN); Sheng Lou, Jiangsu (CN)

(73) Assignee: NANJING UNIVERSITY, Jiangsu (CN)

( * ) Notice: Subject to any disclaimer, the term of this patent is extended or adjusted under 35 U.S.C. 154(b) by 955 days.

(21) Appl. No.: 17/278,567

(22) PCT Filed: Oct. 16, 2019

(86) PCT No.: PCT/CN2019/111513
§ 371 (c)(1),
(2) Date: Mar. 22, 2021

(87) PCT Pub. No.: WO2020/103615
PCT Pub. Date: May 28, 2020

(65) Prior Publication Data
US 2021/0382516 A1    Dec. 9, 2021

(30) Foreign Application Priority Data

Nov. 22, 2018    (CN) ......................... 201811398206.9

(51) Int. Cl.
*G06E 3/00*      (2006.01)
*G06F 15/78*      (2006.01)

(52) U.S. Cl.
CPC .......... *G06E 3/005* (2013.01); *G06F 15/7896* (2013.01)

(58) Field of Classification Search
CPC .................................................. G06E 3/005
See application file for complete search history.

(56) References Cited

FOREIGN PATENT DOCUMENTS

| CN | 102938409 A | 2/2013 |
|---|---|---|
| CN | 107180844 A | 9/2017 |
| CN | 107658321 A | 2/2018 |

(Continued)

OTHER PUBLICATIONS

Herrington, William et al., "Design, fabrication, and testing of zone-plate interconnects for a compact optoelectronic integrated neural coprocessor" Appied Optics, vol. 66, No. 16, Jun. 1, 2017, 7pgs.

(Continued)

*Primary Examiner* — Michael D. Yaary
(74) *Attorney, Agent, or Firm* — VOLPE KOENIG

(57) ABSTRACT

A photoelectric computing unit, a photoelectric computing array and a photoelectric computing method. The photoelectric computing unit includes a semiconductor multifunctional region structure, which includes at least one carrier control region, at least one coupling region, and at least one photon-generated carrier collection region and readout region.

25 Claims, 24 Drawing Sheets

(56) References Cited

FOREIGN PATENT DOCUMENTS

| CN | 110275569 A | 9/2019 |
| CN | 110276046 A | 9/2019 |
| JP | H0490015 A | 3/1992 |

OTHER PUBLICATIONS

Qin, Shuchao et al., "A light-stimulated synaptic device based on graphene hybrid phototransistor" 2D Materials, 4 (2017) (9 pgs.).

Gjesteby, Lars et al. "Hybrid Imaging System for Simultaneous Spiral MR and X-ray (MRX) Scans" IEEE Access, (2016) (12 pgs.).

Control gate

Top dielectric layer

Charge coupled layer

Bottom dielectric layer

N-type substrate    Shallow trench isolation    P-type doping

Collection region    Readout region

| Convolution layer 1 32*32*3 | 128 convolution kernels each having a size of 3*3, with a step of 1, Activation function RELU |
|---|---|
| Convolution layer 2 32*32*128 | 128 convolution kernels each having a size of 3*3, with a step of 1, activation function RELU |
| Convolution layer 3 16*16*128 | 256 convolution kernels each having a size of 3*3, with a step of 1, Activation function RELU |
| Convolution layer 4 16*16*256 | 256 convolution kernels each having a size of 3*3, with a step of 1, activation function RELU, Pooling, size =2, step=2 |
| Convolution layer 5 8*8*256 | 512 convolution kernels each having a size of 3*3, with a step of 1, Activation function RELU |
| Convolution layer 6 8*8*512 | 512 convolution kernels each having a size of 3*3, with a step of 1, activation function RELU Pooling 1, size =2, step=2 Pooling 2, size =2, step=2 Pooling 3, size =1, step=1 |
| Convolution layer 7 2048*1024 | 1024 neural cells |
| Convolution layer 8 1024*10 | 10 neural cells |

FIG. 42

PHOTOELECTRIC COMPUTING UNIT, PHOTOELECTRIC COMPUTING ARRAY, AND PHOTOELECTRIC COMPUTING METHOD

The present application claims priority to Chinese Patent Application No. 201811398206.9 filed on Nov. 22, 2018, the disclosure of which is incorporated herein by reference in its entirety as part of the present application.

TECHNICAL FIELD

The present invention relates to a photoelectric computing unit, a photoelectric computing array and a photoelectric computing method. More particularly, the present invention integrates some technologies in the fields of computation and semiconductor devices, and the technical solutions of the present invention can be used for operations independently or in combination with the existing electronic computation technologies.

BACKGROUND OF THE PRESENT INVENTION

In principle, the existing electronic computers can complete extremely complex operations by unification and integration, according to the characteristics that semiconductor materials can transfer, add/subtract and invert particular electrical signals. In fact, this computation has become an important foundation of the modern civilization.

Most of conventional computers use the Von Neumann architecture. However, the memory unit and the computing unit in the Von Neumann architecture are separate. In the process of processing algorithms represented by neural network algorithms, the weights of the network need to be invoked repetitively, so the separation of the memory unit and the computing unit will lead to great energy consumption in data transmission and influences the operation speed. Moreover, in a series of algorithms represented by neural network algorithms and CT algorithms, a large amount of matrix vector multiplication operations are required. However, since the conventional multipliers often have tens of thousands of transistors, the energy efficiency ratio and level of integration in the process of processing such algorithms by conventional computation will be greatly influenced.

To overcome this restriction, in-memory computing devices have been proposed. Typical in-memory computing devices mainly include two categories, i.e., RRAMs (memristors) and FLASHs (flash memories). The RRAMs can save the resistance value affected by the input quantity from their electrical input terminal for a long period of time after a power failure. However, the RRAMs cannot be produced through a standard CMOS process, and it is unable to ensure the yield and uniformity of such devices. This is unacceptable in neural network algorithms that can be accelerated only by constructing a network by a large amount of in-memory computing devices. If FLASHs are to be used as in-memory computing devices, it means that a single floating gate transistor must store more than one bit of data, i.e., multi-level storage. It is very difficult to do it for conventional FLASHs that can change thresholds only by erasing and programming.

Moreover, most of the known optical computing methods are pure optical computations that realize interaction between light and optical devices based on the light propagation rule.

SUMMARY OF THE PRESENT INVENTION

In accordance with one aspect of the present invention, a photoelectric computation apparatus is provided which modulates, according to photoelectric properties of a semiconductor material, electrical signals transmitted in the semiconductor material by using externally input optical signals, so as to realize adders, multipliers and some advanced operations. Moreover, the apparatus can realize an in-memory computing function with high precision, and can store, by a single device, optical signals from an optical input terminal and save the optical signals for a long period of time after light is cut off.

In accordance with an aspect of the present invention, a photoelectric computation unit is provided, into which operation quantities are input in two manners, i.e., optical inputting and electrical inputting, the photoelectric computation unit comprising one semiconductor multifunctional area structure, wherein the semiconductor multifunctional area comprises at least one carrier control region, at least one coupled region and at least one photo-generated carrier collection and readout region, wherein: an operation quantity to be input optically, i.e., an optical input quantity, is input by converting incident photons into photo-generated carriers, and an operation quantity to be input electrically, i.e., an electrical input quantity, is input by directly injecting carriers; the carrier control region is configured to control and modulate carriers in the photoelectric computation unit and used as an electrical input terminal of the photoelectric computation unit to be input with one operation quantity as an electrical input quantity; or, the carrier control region is configured to just control and modulate carriers in the photoelectric computation unit, with an electrical input quantity being input from other regions; the coupled region is configured to connect a collection region with a readout region in the photo-generated carrier collection and readout region, so that photo-generated carriers generated by incidence of photons affect carriers in the photoelectric computation unit to form an operation relationship; and in the photo-generated carrier collection and readout region, the collection region is configured to absorb incident photons and collect the generated photo-generated carriers and is used as an optical input terminal of the photoelectric computation unit to be input with one operation quantity as an optical input quantity; the readout region is configured as an electrical input terminal of the photoelectric computation unit to be input with one operation quantity as an electrical input quantity and is also configured as an output terminal of the photoelectric computation unit to output carriers affected by the optical input quantity and the electrical input quantity as a unit output quantity; or, the electrical input quantity is input from other regions, and the readout region is used only as an output terminal of the photoelectric computation unit to output carriers affected by the optical input quantity and the electrical input quantity as a unit output quantity.

In accordance with an aspect of the present invention, the photoelectric computation unit comprises a control gate as the carrier control region, a charge coupled layer as the coupled region and an N-type substrate as the photo-generated carrier collection and readout region, wherein: the N-type semiconductor substrate as the photo-generated carrier collection and readout region comprises a collection region on the left and a readout region on the right, wherein the collection region on the left is configured to form a depletion layer used for collecting optical holes, and the quantity of charges of the collected optical holes is read by the readout region on the right as an input quantity from an optical input terminal; and, the readout region on the right comprises a shallow trench isolation, a P-type drain and a P-type source and is used for reading, and can also be used as an electrical input terminal to be input with one operation quantity; the charge coupled layer as the coupled region is configured to connect the collection region with the readout region in the photo-generated carrier collection and readout region, so that the surface potential of the substrate in the collection region is influenced by the number of the collected optical holes after a depletion region in the substrate in the collection region begins collecting optical holes; and, through the connection by the charge coupled layer, the surface potential of the semiconductor substrate in the readout region is influenced by the surface potential of the semiconductor substrate in the collection region and further the source-drain current in the readout region is influenced, and thus the number of optical holes collected in the collection region is read by determining the source-drain current in the readout region; the control gate as the carrier control region is configured to form, in the readout region of the N-type semiconductor substrate, a depletion region used for exciting optical holes by applying one negative pulse voltage to the control gate, and can also be used as an electrical input terminal to be input with one operation quantity; and a bottom dielectric layer used for isolation is arranged between the N-type semiconductor substrate and the charge coupled layer, and a top dielectric layer used for isolation is arranged between the charge coupled layer and the control gate.

In accordance with an aspect of the present invention, the photoelectric computation unit comprises a reset transistor as the carrier control region, a photoelectron coupled lead as the coupled region, and a photodiode and a readout transistor as the photo-generated carrier collection and readout region, and further comprising an address transistor that is used for row and column addressing when the photoelectric computation units are arranged in an array, wherein: in the photodiode and the readout transistor as the photo-generated carrier collection and readout region, the photodiode is configured to sense light, and an N region of the photodiode is connected to a control gate of the readout transistor and a source of the reset transistor through the photoelectron coupled lead as the coupled region; and, a source of the readout transistor is connected to a drain of the address transistor, and the readout transistor is used for reading and can also be used as an electrical input terminal to be input with one operation quantity; the photoelectron coupled lead as the coupled region is configured to connect the photodiode as the collection region and the readout region in the photo-generated carrier collection and readout region with the readout transistor as the readout region, and apply the potential of the N region of the photodiode onto the control gate of the readout transistor; the reset transistor as the carrier control region is configured to be input with one positive voltage to the photodiode through its drain; the positive voltage affects the photodiode once the reset transistor is turned on, so that the photodiode forms a depletion region and senses light; and, the reset transistor can also be used as an electrical input terminal to be input with one operation quantity; and the address transistor is configured to control the output of the whole photoelectric computation unit.

In accordance with an aspect of the present invention, the photoelectric computation unit is configured to form a photoelectric computation vector adder for performing an addition operation on at least two groups of vectors each having at least two dimensions, wherein the photoelectric computation adder comprises at least two addend input terminals and a result output terminal, wherein: the at least two photoelectrical computation adders are arranged in parallel; the input terminals of each of the adders are configured to be input with at least two addends representing corresponding elements having a same serial number of at least two vectors to be added, wherein the number of the used input terminals of the adders is not less than the number of the vectors to be added; and the output terminal of each of the adders is configured to output a result of adding corresponding elements having a same serial number of two vectors, the at least two results are combined and spliced to obtain a complete vector, and the complete vector is used as a result of operation of the vector adder.

In accordance with an aspect of the present invention, the photoelectric computation unit is configured to form a photoelectric computation vector dot multiplier for performing a dot multiplication operation on vectors each having at least two dimensions, wherein the photoelectric computation multiplier comprises at least two multiplier factor input terminals and a result output terminal, wherein: the at least two photoelectrical computation multipliers are arranged in parallel independently; the input terminals of each of the multipliers are configured to be input with multiplier factors of corresponding elements having a same serial number of the vectors to be multiplied; and the output terminal of each of the multipliers is configured to output a result of multiplying corresponding elements having a same serial number of two vectors to be multiplied, the at least two results are spliced to obtain a complete vector, and the complete vector is used as a result of operation of the vector dot multiplier.

In accordance with an aspect of the present invention, the photoelectric computation unit is configured to form a high-bit-width multiplier, wherein each photoelectric computation multiplier comprises two multiplier factor input terminals and a result output terminal, further comprising: at least four photoelectrical computation multipliers arranged in parallel; input terminals of the at least four multipliers, wherein input quantities from the input terminals of the at least four multipliers are set as multiplier factors of partial data of numbers to be multiplied that is subjected to high-low bit splitting; and output terminals of the at least four multipliers, wherein the output terminals of the at least four multipliers are configured to output results obtained after multiplying corresponding high and lower bits of two numbers to be multiplied, and the results output from the at least four multipliers are shifted and accumulated correspondingly according to the bit weight of the input data to obtain a complete high-bit-width number as a final result of multiplication.

In accordance with an aspect of the present invention, a photoelectric computation method executed by a photoelectric computation unit is provided, the photoelectric computation unit comprising at least one light emitting unit and at least one photoelectric computation unit, the photoelectric computation unit comprising one semiconductor multifunctional area structure, the semiconductor multifunctional area comprising a carrier control region, a coupled region and a photo-generated carrier collection and readout region, wherein the method comprises steps of: configuring the light emitting unit to emit light, irradiating the light onto the photoelectric computation unit, and generating, under the control of the carrier control region, photo-generated carriers in a collection region in a photo-generated carrier collection and readout region as a first operation quantity for the photoelectric computation unit; generating an electrical operation quantity in one region in the multifunctional area, and inputting corresponding carriers, the carriers being used as a second operation quantity for the photoelectric computation unit; affecting carriers in the photo-generated carrier readout region by using both the photo-generated carriers as the first operation quantity and the carriers as the second operation quantity, the affected carriers being used as the result of photoelectric operation; and outputting, from an output terminal of the readout region in the photo-generated carrier collection and readout region, the carriers as the result of photoelectric operation.

In accordance with an aspect of the present invention, the photoelectric computation unit is configured to form a photoelectric computation vector adder for performing an addition operation on at least two groups of vectors each having at least two dimensions, wherein the photoelectric computation adder comprises at least two addend input terminals and a result output terminal, wherein: the at least two photoelectrical computation adders are arranged in parallel; the input terminals of each of the adders are configured to be input with at least two addends representing corresponding elements having a same serial number of at least two vectors to be added, wherein the number of the used input terminals of the adders is not less than the number of the vectors to be added; and the output terminal of each of the adders is configured to output a result of adding corresponding elements having a same serial number of two vectors, the at least two results are combined and spliced to obtain a complete vector, and the complete vector is used as a result of operation of the vector adder.

In accordance with an aspect of the present invention, the photoelectric computation unit is configured to form a photoelectric computation vector dot multiplier for performing a dot multiplication operation on vectors each having at least two dimensions, wherein the photoelectric computation multiplier comprises at least two multiplier factor input terminals and a result output terminal, wherein: the at least two photoelectrical computation multipliers are arranged in parallel independently; the input terminals of each of the multipliers are configured to be input with multiplier factors of corresponding elements having a same serial number of the vectors to be multiplied; and the output terminal of each of the multipliers is configured to output a result of multiplying corresponding elements having a same serial number of two vectors to be multiplied, the at least two results are spliced to obtain a complete vector, and the complete vector is used as a result of operation of the vector dot multiplier.

In accordance with an aspect of the present invention, the photoelectric computation unit is configured to form a high-bit-width multiplier, wherein each photoelectric computation multiplier comprises two multiplier factor input terminals and a result output terminal, wherein: at least four photoelectrical computation multipliers are arranged in parallel; input quantities from the input terminals of the at least four multipliers are used as multiplier factors of partial data of numbers to be multiplied that is subjected to high-low bit splitting; and the output terminals of the at least four multipliers are configured to output results obtained after multiplying corresponding high and lower bits of two numbers to be multiplied, and the results output from the at least four multipliers are shifted and accumulated correspondingly according to the bit weight of the input data to obtain a complete high-bit-width number as a final result of multiplication.

In accordance with an aspect of the present invention, a photoelectric computation method executed by a photoelectric computation unit is provided, the photoelectric computation unit comprising at least one light emitting unit and at least one photoelectric computation unit, the photoelectric computation unit comprising one semiconductor multifunctional area structure, the semiconductor multifunctional area comprising a carrier control region, a coupled region and a photo-generated carrier collection and readout region, wherein the method comprises steps of: configuring the light emitting unit to emit light, irradiating the light onto the photoelectric computation unit, and generating, under the control of the carrier control region, photo-generated carriers in a collection region in a photo-generated carrier collection and readout region as a first operation quantity for the photoelectric computation unit; generating an electrical operation quantity in one region in the multifunctional area, and inputting corresponding carriers, the carriers being used as a second operation quantity for the photoelectric computation unit; affecting carriers in the photo-generated carrier readout region by using both the photo-generated carriers as the first operation quantity and the carriers as the second operation quantity, the affected carriers being used as the result of photoelectric operation; and outputting, from an output terminal of the readout region in the photo-generated carrier collection and readout region, the carriers as the result of photoelectric operation.

In accordance with an aspect of the present invention, the photoelectric computation method according is used to perform a vector addition operation, to perform an addition operation on at least two groups of vectors each having at least two dimensions, wherein: the at least two vectors to be added are split according to the dimension to obtain a plurality of groups of independent addends; independent addends in each group are input into an addend input terminal of each adder, the number of the used input terminals of the adders being not less than the number of the vectors to be added; and output results from the output terminals of the at least two adders are spliced into a complete vector again according to the serial number of the input vector elements, and the complete vector is used as a result vector obtained after adding the at least two vectors to be added.

In accordance with an aspect of the present invention, the photoelectric computation method is used to perform a vector dot multiplication operation, to perform a dot multiplication operation on vectors each having at least two dimensions, wherein: two vectors to be multiplied are split according to the dimension to obtain a plurality of groups of independent multiplier factors; independent multiplier factors in each group are input into a multiplier factor input terminal of each multiplier; and output results from the output terminals of the at least two multipliers are spliced into a complete vector again according to the serial number of the input vector elements, and the complete vector is used as a result vector obtained after multiplying the two vectors to be multiplied.

In accordance with an aspect of the present invention, the photoelectric computation method is used to perform a high-bit-width multiplication operation, wherein: high-low bit splitting is performed bitwise on two high-bit-width numbers to be multiplied to split two high-bit-width multiplier factors into two groups of low-bit-width multiplier factors, the number of parts obtained by splitting the high-bit-width multiplier factor depending upon the specific bit width of the high-bit-width multiplier factor; according to a combination rule of multiplying in pairs, the two groups of low-bit-width multiplier factors obtained after splitting are input into the multiplier factor input terminals of the at least four multipliers, the number of the used multipliers depending upon the specific bit width of the high-bit-width multiplier factors to be multiplied; and the output results from the output terminals of the at least four multipliers are correspondingly shifted according to the bit width of the input multiplier factors, the shifted results are accumulated, and the final result of accumulation is a result of multiplying the two high-bit-width multiplier factors.

In accordance with an aspect of the present invention, a single-precision floating-dot multiplier is provided, comprising the photoelectric computation unit and the photoelectric computation unit, used to perform multiplication on single-precision floating-dot numbers, wherein the high-bit-width photoelectric computation multiplier comprises two high-bit-width multiplier factor input terminals and a result output terminal, and the photoelectric adder comprises two addend input terminals and a result output terminal, wherein: the two high-bit-width multiplier factor input terminals of the high-bit-width photoelectric computation multiplier are used as mantissa input terminals, mantissa bit data of two single-precision floating-dot numbers to be multiplied that have been added by 1 is input into the two high-bit-width input terminals of the high-bit-width multiplier, and a result of mantissa bit operation is output to a control system at the end of multiplication; the two addend input terminals of the photoelectric adder are used as exponent input terminals, exponent bit data of two single-precision floating-dot numbers to be multiplied are input into the addend input terminals, and a result of exponent bit operation is output to the control system at the end of addition; and the control system is configured to determine sign bits of the two single-precision floating-dot numbers to be multiplied and output sign bit data at the end of multiplication, the sign bit data is recombined with the result of mantissa bit operation and the result of exponent bit operation output to the control system to obtain a floating-dot number, and the final result is a result of multiplying the two single-precision floating-dot numbers to be multiplied.

In accordance with an aspect of the present invention, a single-precision floating-dot multiplication computation method is provided, which uses the photoelectric computation method for high-bit-width multiplication and the photoelectric computation method, wherein: two single-precision floating-dot numbers to be multiplied are split into two pieces of exponent bit data, two pieces of sign bit data and two pieces of mantissa bit data, and the two pieces of mantissa bit data are added by 1; the two pieces of exponent bit data are input into two addend input terminals of a photoelectric computation adder, and the output result is used as a result of exponent bit operation; the two pieces of mantissa bit data that have been added by 1 are input into two high-bit-width multiplier factor input terminals of a high-bit-width multiplier, and the output result is a result of mantissa bit operation; and the two pieces of sign bit data are subjected to positive/negative determination by a control system and then recombined with the result of mantissa bit operation and the result of exponent bit operation to obtain floating-dot numbers, and the obtained two single-precision floating-dot numbers to be multiplied are used as a final result of multiplication.

In accordance with another aspect of the present invention, a novel photoelectric computing method is provided which modulates, according to the photoelectric properties of a semiconductor material, electrical signals transmitted in the semiconductor material by using input optical signals, so as to realize new mechanisms for basic operations such as adders and multipliers and so on.

The present invention designs a photoelectric computation device according to the photoelectric properties of a semiconductor material, and discloses a variety of adders, multipliers and algorithm accelerators including the photoelectric computation device, and corresponding photoelectric computing methods thereof. Thus, according to the photoelectric properties of semiconductor materials and the extensions, in the computation field, of the technologies which have been commonly used in the conventional optical field, the present invention provides a novel photoelectric device and a kind of photoelectric computing methods, which can realize an in-memory computing function with high precision, can store, by a single device, optical signals from an optical input terminal and save the optical signals for a long period of time after light is cut off, and can complete the multiplication by a single device. Therefore, the device is very suitable for accelerating algorithms, represented by neural network algorithms, which need to "store parameters".

Other features and advantages of the present invention will be explained in the following description, and will partially become apparent from the description or be appreciated by implementing the present invention. The objectives and other advantages of the present invention may be realized and obtained by structures particularly specified in the description, the appended claims and the accompanying drawings.

BRIEF DESCRIPTION OF THE DRAWINGS

The accompanying drawings are provided for further understanding of the present invention, and constitute part of the description. The accompanying drawings are used, together with embodiments of the present invention, to further explain the present invention, rather than constituting any limitations to the present invention, in which:

FIG. 42 shows a schematic view of an AlexNet-like network for simulation according to the present invention.

DETAILED DESCRIPTION OF THE PRESENT INVENTION

Figure 1:
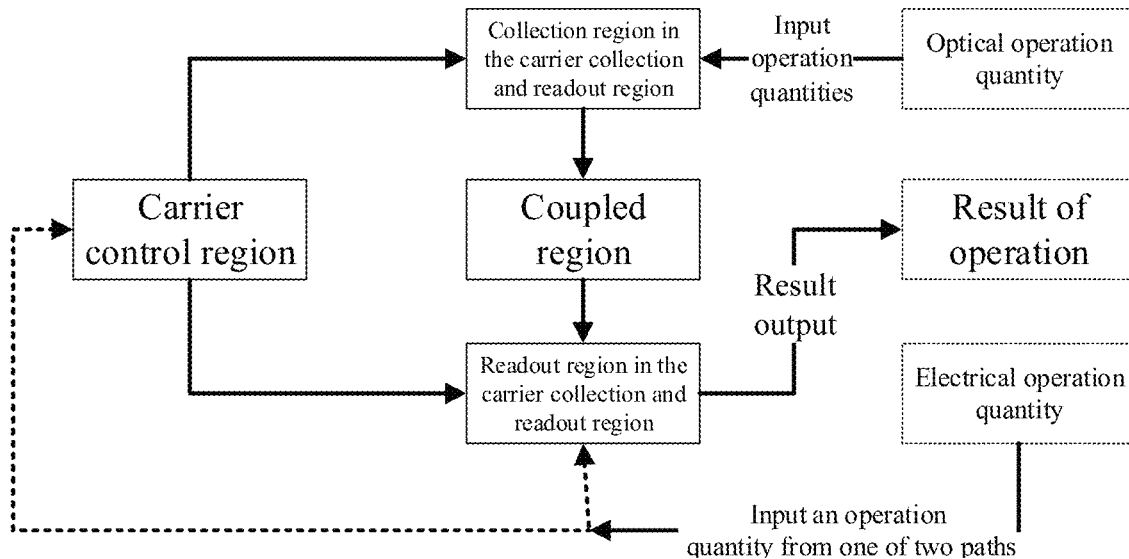
FIG. 1 shows a schematic view of a basic structure of a multifunctional area of a photoelectric computing unit according to the present invention.

To make the objectives, technical solutions and advantages of the embodiments of the present invention clearer, various embodiments of the present invention will be described below in detail with reference to the accompanying drawings. Throughout this description and the accompanying drawings, steps and elements that are substantially the same are denoted by the same reference numerals, and the repeated explanation of these steps and elements will be omitted.

It should be understood that the embodiments to be described herein are some but not all of the embodiments of the present invention. All other embodiments obtained by those skilled in the art without paying any creative effort on the basis of the embodiments described in the present invention shall fall into the protection scope of the present invention. Moreover, to make this description clearer and more concise, the detailed description of the functions and constructions known in the art will be omitted.

Firstly, a schematic view of a basic structure of a multifunctional area of a photoelectric computing unit according to the present invention will be described with reference to FIG. 1. Generally, the photoelectric computing unit according to the present invention includes one semiconductor multifunctional area structure, where the semiconductor multifunctional area includes a carrier control region, a coupled region and a photo-generated carrier collection and readout region, and the multifunctional area may be of a multilayer structure or a structure of any layers or areas that realizes the same photoelectric effect and control by various spatial arrangements and transformations. Four preferred embodiments of the photoelectric computing unit according to the present invention will be described below in detail with reference to the accompanying drawings.

Photoelectric Computing Unit Scheme

First Embodiment

The photoelectric computing unit according to the first embodiment of the present invention will be described with reference to FIGS. 2-5.

Figure 2:
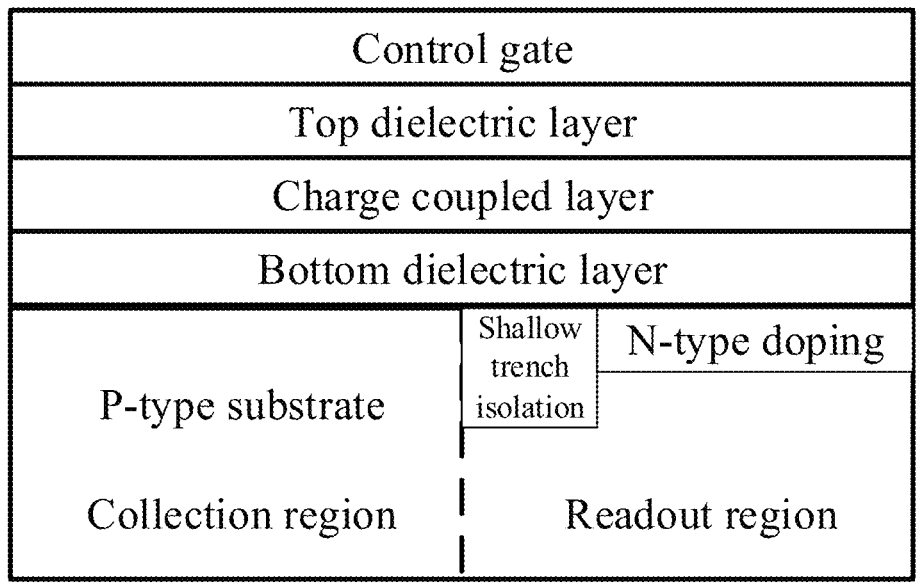
FIG. 2 shows a front view of a photoelectric computing unit according to a first embodiment of the present invention.
Figure 3:
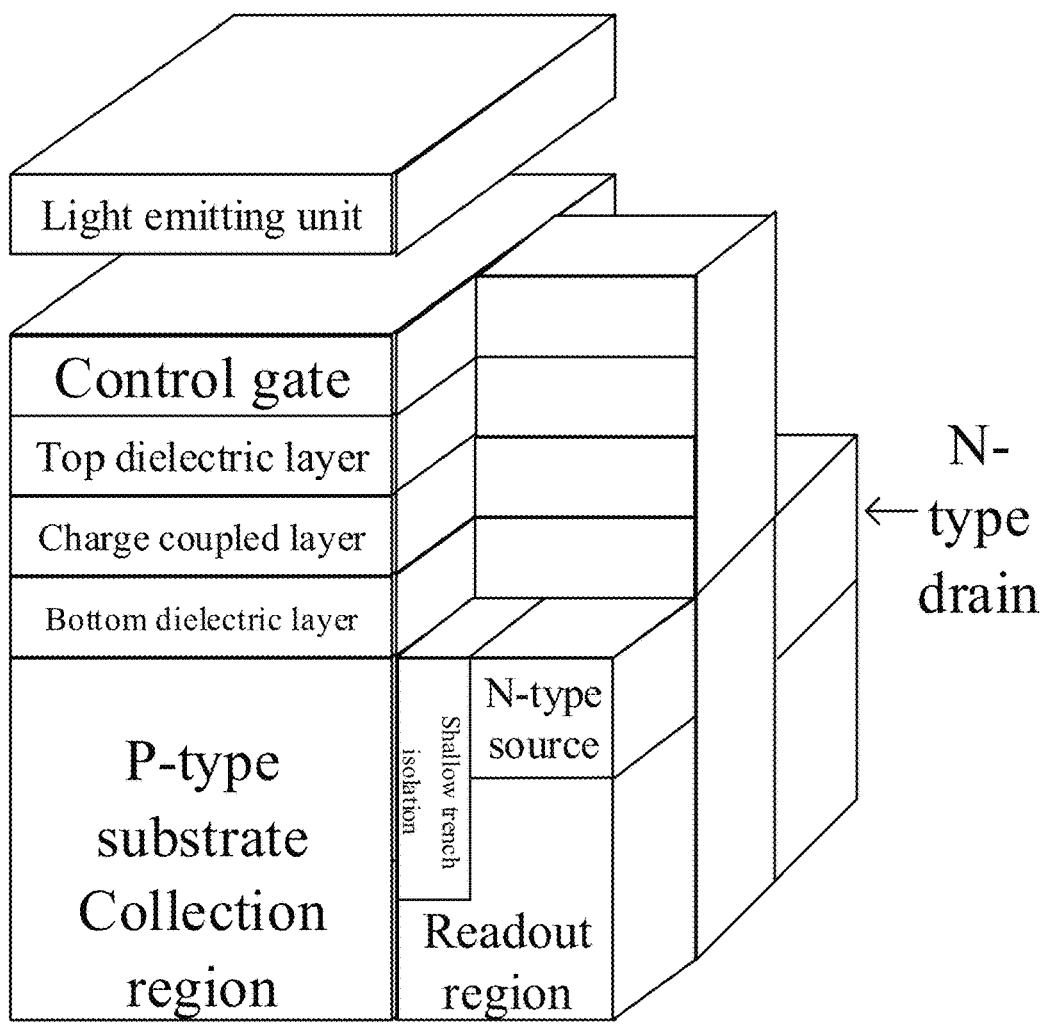
FIG. 3 shows a stereoscopic view of the photoelectric computing unit according to the first embodiment of the present invention.

As shown in the front view and the stereoscopic view of the photoelectric computing unit in FIGS. 2 and 3, there is a P-type semiconductor substrate as the photo-generated carrier collection and readout region. The P-type semiconductor substrate is divided into a collection region on the left and a readout region on the right, wherein the collection region on the left is configured to form, in the substrate in the collection region, a depletion layer used for collecting photoelectrons by applying a pulse that is at a negative voltage to the substrate or applying a pulse that is at a positive voltage to the control gate, and the number of the collected photoelectrons is read by the readout region on the right as an input quantity from an optical input terminal. The readout region on the right includes a shallow trench isolation, an N-type drain terminal and an N-type source terminal. The shallow trench isolation is located in the middle of the semiconductor substrate and between the collection region and the readout region, and the shallow trench isolation is formed by etching and filling silicon dioxide and is used for isolating electrical signals in the collection region from electrical signals in the readout region. The N-type source is located on a side of the readout region close to a bottom dielectric layer, and is formed by doping by ion implantation. The N-type drain is located on the other side of the semiconductor substrate close to the bottom dielectric layer and opposite to the N-type source, and is also formed by doping by ion implantation. During reading, a positive voltage is applied to the control gate to form a conducting channel between the N-type source and the N-type drain in the collection region, and a bias pulse voltage is applied between the N-type source and the N-type drain to accelerate electrons in the conducting channel to form source-drain current. Carriers that form the current in the channel between the source and the drain are affected by the voltage at the control gate, the source-drain voltage and the number of photoelectrons collected in the collection region, and are output, in form of current, as electrons affected by the optical input quantity and the electrical input quantity, wherein the voltage at the control gate and the source-drain voltage may be used as electrical input quantities for the device and the number of photoelectrons is used as the optical input quantity for the device.

In addition, there is a charge coupled layer as the coupled region. The charge coupled layer is configured to connect the collection region with the readout region, so that the surface potential of the substrate in the collection region is affected by the number of the collected photoelectrons after a depletion region in the substrate in the collection region begins the collection of photoelectrons. Through the connection by the charge coupled layer, the surface potential of the semiconductor substrate in the readout region is influenced by the surface potential of the semiconductor substrate in the collection region, and further the source-drain current in the readout region is affected. Thus, the number of photoelectrons collected by the collection region is read by determining the source-drain current in the readout region.

In addition, there is a control gate as the carrier control region. The control gate is configured to form, in the readout region of the P-type semiconductor substrate, a depletion region used for exciting photoelectrons by applying one pulse voltage to the control gate, and can also be used as an electrical input terminal to be input with one operation quantity.

In addition, there is a bottom dielectric layer between the P-type semiconductor substrate and the charge coupled layer, which is used for isolation. There is also a top dielectric layer between the charge coupled layer and the control gate, which is used for isolation.

Figure 4:
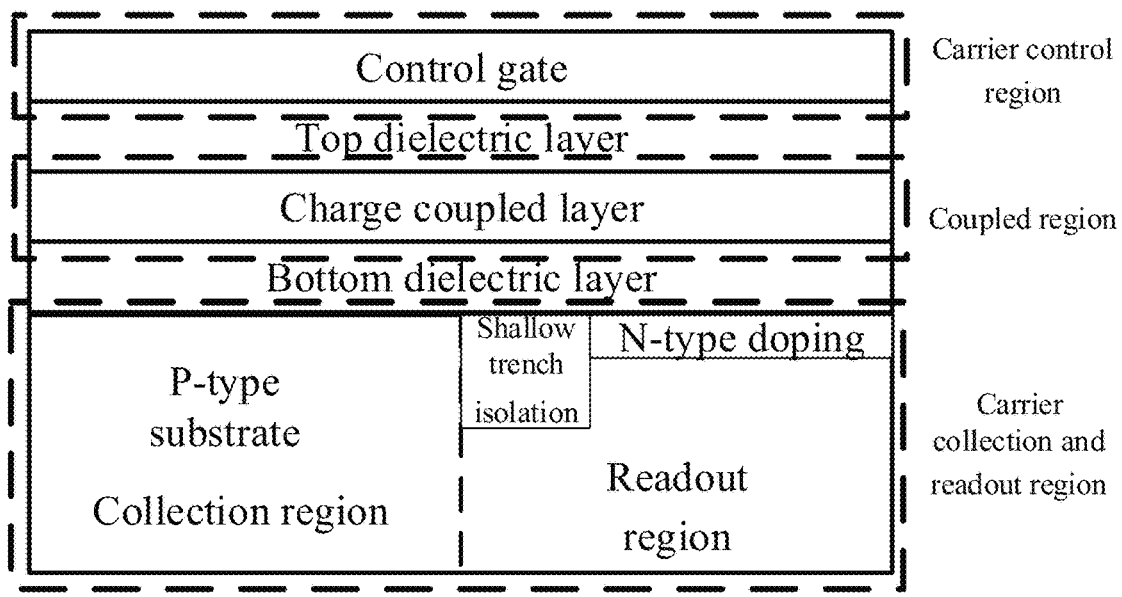
FIG. 4 shows a configuration diagram of a multifunctional area of the photoelectric computing unit according to the first embodiment of the present invention.

Further, with reference to the configuration diagram of the multifunctional area of the photoelectric computing unit shown in FIG. 4, the photoelectric computing unit includes a control gate as the carrier control region, a charge coupled layer as the coupled region, and a P-type substrate as the photo-generated carrier collection and readout region; a bottom dielectric layer used for isolation is arranged between the P-type semiconductor substrate and the charge coupled layer; and a top dielectric layer used for isolation is arranged between the charge coupled layer and the control gate.

It should be understood that, terms mentioned herein, such as "left", "right", "above" and "below", merely indicate the relative position observed from the angle of view shown in the drawings and change with the change in the angle of view, and are not intended to limit the specific structure.

Figures 5, 6:
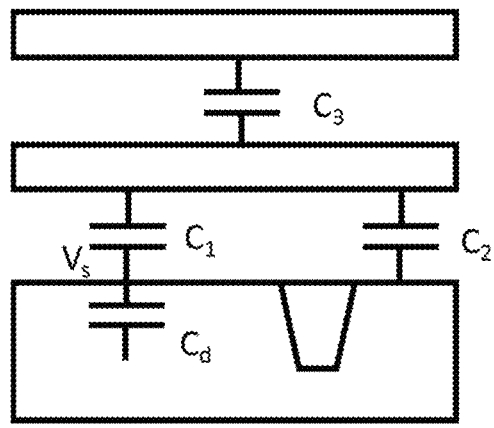
FIG. 5 shows an electrical model of the photoelectric computing unit according to the first embodiment of the present invention.
FIG. 6 shows a front view of a photoelectric computing unit according to a second embodiment of the present invention.

In addition, FIG. 5 is an electrical model of the photoelectric computing unit according to the first embodiment of the present invention. The principle of the photoelectric computing unit will be described in detail according to the electrical model shown in FIG. 5.

As shown in FIG. 5, the collection region on the left is equivalent to an MOS capacitor having a capacitance of $$C_{OX} = \frac{C_1 C_3}{C_1 + C_3},$$

and the readout region on the right is equivalent to a standard floating gate MOS transistor. Since the capacitance $C_2$ is far less than $C_1$ during design, the influence of the readout region on a light sensing region is negligible during the operation of the device.

The potential in an MOS-capacitor Si can be obtained by solving the following Poisson equation:

$$\frac{d^2 V}{dx^2} = \frac{\rho}{\varepsilon_{SI}} \tag{1-1}$$

where $\varepsilon_{SI}$ is the dielectric constant of silicon, and p is the bulk charge density of the P-type substrate.

When a negative pulse is applied to the P-type substrate as the carrier collection and readout region or a positive pulse is applied to the control gate as the carrier control region, the substrate is in a depleted state, begins the collection of photons as optical input signals and generates photoelectrons. For the depletion region, $\rho = qN_A$, where $N_A$ is the doping concentration.

The following equation can be obtained by solving the Poisson equation:

$$V = \frac{qN_A}{2\varepsilon_{SI}}(x - x_d)^2 \tag{1-2}$$

where the direction x is a downward direction perpendicular to the bottom dielectric layer, $x_d$ is the depth of the depletion region, q is the quantity of charges of the photoelectrons, and V is the potential at the depth of x. For the MOS, the surface potential $V_S$ of the P-type substrate is the value of the potential V when x=0.

Thus:

$$V_S = \frac{qN_A}{2\varepsilon_{SI}} x_d^2 \tag{1-3}$$

The following equation is derived:

$$E_S = -\frac{qN_A}{\varepsilon_{SI}} x_d \tag{1-4}$$

where $E_S$ is the intensity of the surface electric field. Let the voltage at the substrate be 0V, the potential of the control gate during light sensing is:

$$V_G = \frac{\varepsilon_{SI}}{\varepsilon_{OX}} E_s d + V_S = \frac{qN_A x_d}{\varepsilon_{OX}} \cdot d + \frac{qN_A}{2\varepsilon_{SI}} X_d^2 \quad (1\text{-}5)$$

where $V_G$ is the potential of the control gate. The depth $x_d$ of the depletion region can be obtained by solving this equation:

$$x_d = -\frac{\varepsilon_{SI}}{C_{OX}} + \sqrt{\left(\frac{\varepsilon_{SI}}{C_{OX}}\right)^2 + \frac{2\varepsilon_{SI} V_G}{qN_A}}. \quad (1\text{-}6)$$

When photons are incident into the device, photoelectrons are generated in the depletion region, and collected in the channel in the collection region by the electric field of the gate. The total quantity of charges at the control gate is $Q_{CG}=N_A+Q$, where Q is the quantity of signal charge (e–/cm²). Since the signal charge is collected in the collection region by the electric field between the control gate and the P-type substrate and the recombination of carriers in the semiconductor substrate will take a certain period of time, also due to the presence of the thermally excited carriers in the depletion region, the signal charge will be stored in the computing unit for a long period of time after light is cut off, so that the in-memory computing device function is realized.

At this time, $$x_d = -\frac{\varepsilon_{SI}}{C_{OX}} + \sqrt{\left(\frac{\varepsilon_{SI}}{C_{OX}}\right)^2 + \frac{2\varepsilon_{SI} V_Q}{qN_A}} \quad (1\text{-}7)$$

where $V_Q$ is the total potential generated by the signal charge.

$$V_Q = V_G - \frac{qQ}{C_{OX}} \quad (1\text{-}8)$$

It can be known from the above equation that, $x_d$ gradually decreases with the increase of the quantity of signal charge Q, and $x_d$ is 0 when the value of Q makes $V_Q$ equal to 0. At this time, the surface potential $V_s$ is equal to 0, the channel potential does not change, and the device reaches full well capacity.

For the floating gate MOSFET in the readout region on the right, the channel current $I_d$ can be expressed by:

$$I_d = \frac{C_2 \mu W}{L}\left(V^{FG} - V_T^{FG}\right)V_{DS} \quad (1\text{-}9)$$

where W and L are the gate width and gate length, respectively; $V_{DS}$ is the source-drain voltage; and $V^{FG}$ is the potential of the charge coupled layer, which is affected by the potential $V_G$ of the control gate and the surface potential $V_s$ of the P-type substrate and can be expressed by:

$$V^{FG} = \frac{V_G c_3 + V_S C_1}{c_3 + c_1} \quad (1\text{-}10)$$

When the doping concentration of the P-type substrate is low (e.g., 2E15 per cubic centimeter), the divided voltage of the depletion region is far greater than that of the capacitances $C_1$ and $C_3$, the equation (1-6) can be simplified as:

$$x_d = \sqrt{\frac{2\varepsilon_{SI} V_Q}{qN_A}} \quad (1\text{-}11)$$

The equation (1-11) is substituted into the equation (1-3). It can be known that the surface potential $V_S$ of the P-type substrate, the potential $V_G$ of the control gate and the total potential $V_Q$ generated by the signal charge are approximately equal, that is:

$$V_s \approx V_Q \quad (1\text{-}12)$$

The equations (1-12) and (1-8) are substituted into the equation (1-10) and then substituted into the equation (1-9) to obtain:

$$I_d = \frac{C_2 \mu W}{L}\left(V_G - \frac{qQ}{C_3} - V_T^{FG}\right)V_{DS} \quad (1\text{-}13)$$

The quantity of the signal charge Q is expressed by the number of the incident photons $X_{photon}$:

$$Q = X_{photon} t \eta \quad (1\text{-}14)$$

where t is the exposure time, $X_{photon}$ is the number of incident photons per unit time, and $\eta$ is the quantum efficiency of the device.

Thus, the expression in a case where the device can operate as a multiplier is:

$$I_d = \frac{C_2 \mu W}{L}\left(V_G - V_T^{FG} - \frac{X_{photon} t \eta q}{c_3}\right)V_{DS}. \quad (1\text{-}15)$$

It is easy to know from the equation (1-15) that the source-drain current $I_d$ of the readout region, as an output quantity, is affected by both the $X_{photon}$ as an optical input quantity and the $V_G$ and $V_{DS}$ as electrical input quantities, and inherently contains the operation relationships of multiplication and addition. Thus, by using such relationships, the present invention can realize computation apparatuses with various different functions.

The most basic structure of the photoelectric computing unit includes only one output terminal. However, if the MOSFET in the readout region on the right is divided into a plurality of small and parallel MOSFETs having independent sources and drains and the same device parameters, the number of output terminals can be increased. If a same $V_{DS}$ is applied to the plurality of small MOSFETs, a plurality of identical output quantities of the photoelectric computing unit can be obtained. A photoelectric computing unit based on the scheme described in the first embodiment will be described hereinafter.

Second Embodiment

A photoelectric computing unit according to the second embodiment of the present invention will be described with reference to FIGS. 6-8.

Figure 7:
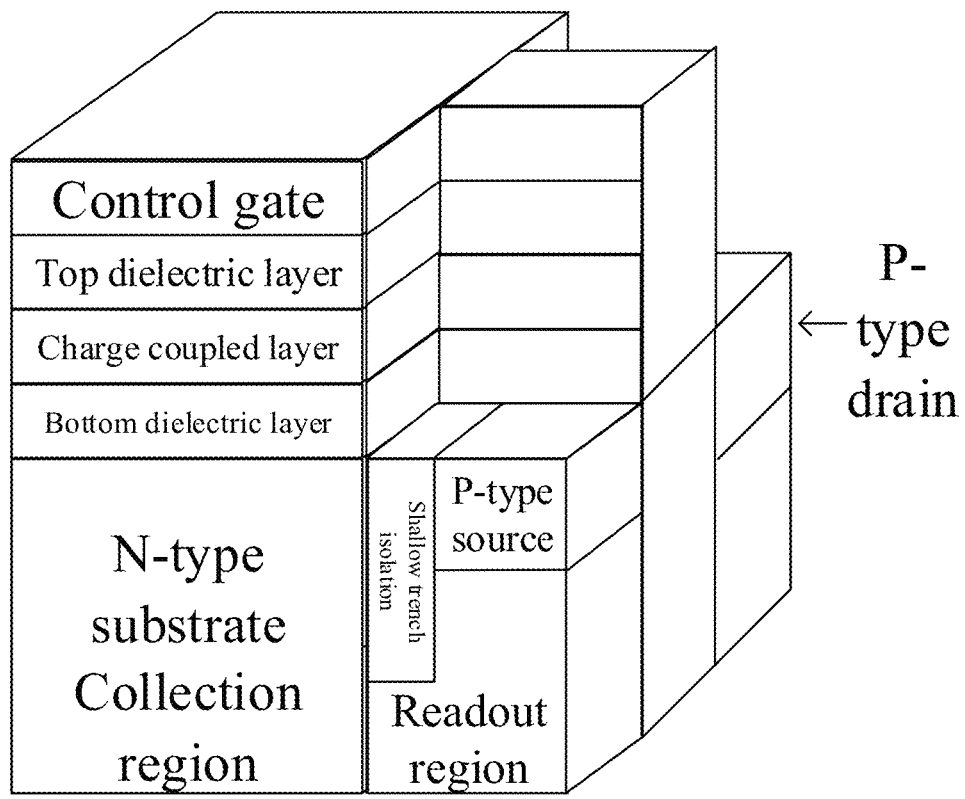
FIG. 7 shows a 3D schematic view of the photoelectric computing unit according to the second embodiment of the present invention.

As shown in the front view and the stereoscopic view of the photoelectric computing unit in FIGS. 6 and 7, there is an N-type semiconductor substrate as the photo-generated carrier collection and readout region, and the N-type semiconductor substrate is divided into a collection region on the left and a readout region on the right. The collection region on the left is configured to form, in the substrate in the collection region, a depletion layer used for collecting optical holes by applying a pulse that is at a positive voltage to the substrate or applying a pulse that is at a negative voltage to the control gate, and the quantity of charges of the collected optical holes is read by the readout region on the right. The readout region on the right comprises a shallow trench isolation, a P-type drain and a P-type source. The shallow trench isolation is located in the middle of the semiconductor substrate and between the collection region and the readout region, and the shallow trench isolation is formed by etching and filling silicon dioxide and is used for isolating electrical signals in the collection region from electrical signals in the readout region. The P-type source is located on a side of the readout region close to a bottom dielectric layer, and is formed by doping by ion implantation. The P-type drain is located on the other side of the semiconductor substrate close to the bottom dielectric layer and opposite to the P-type source, and is also formed by doping by ion implantation. During reading, a negative pulse voltage is applied to the control gate to form a conducting channel between the P-type source and the P-type drain, and a bias pulse voltage is applied between the P-type source and the P-type drain to accelerate holes in the conducting channel to form source-drain current. Carriers that form the current in the channel between the source and the drain are affected by the voltage at the control gate, the source-drain voltage and the number of optical holes collected in the collection region, and are output, in form of current, as carriers affected by the optical input quantity and the electrical input quantity, wherein the voltage at the control gate and the source-drain voltage may be used as electrical input quantities for the device and the number of optical holes is used as the optical input quantity for the device.

In addition, there is a charge coupled layer as the coupled region. The charge coupled layer is configured to connect the collection region with the readout region, so that the surface potential of the substrate in the collection region is affected by the number of optical holes in the collection region after a depletion region in the substrate in the collection region begins the collection of optical holes. Through the connection by the charge coupled layer, the surface potential of the semiconductor substrate in the readout region is influenced by the surface potential of the semiconductor substrate in the readout region, and further the source-drain current in the readout region is influenced. Thus, the number of optical holes collected in the collection region is read by determining the source-drain current in the readout region.

In addition, there is a control gate as the carrier control region. The control gate is configured to form, in the readout region of the N-type semiconductor substrate, a depletion region used for exciting optical holes by applying one negative pulse voltage to the control gate, and can also be used as an electrical input terminal to be input with one operation quantity.

In addition, there is a bottom dielectric layer used for isolation between the N-type semiconductor substrate and the charge coupled layer. There is also a top dielectric layer between the charge coupled layer and the control gate, which is used for isolation.

Figure 8:
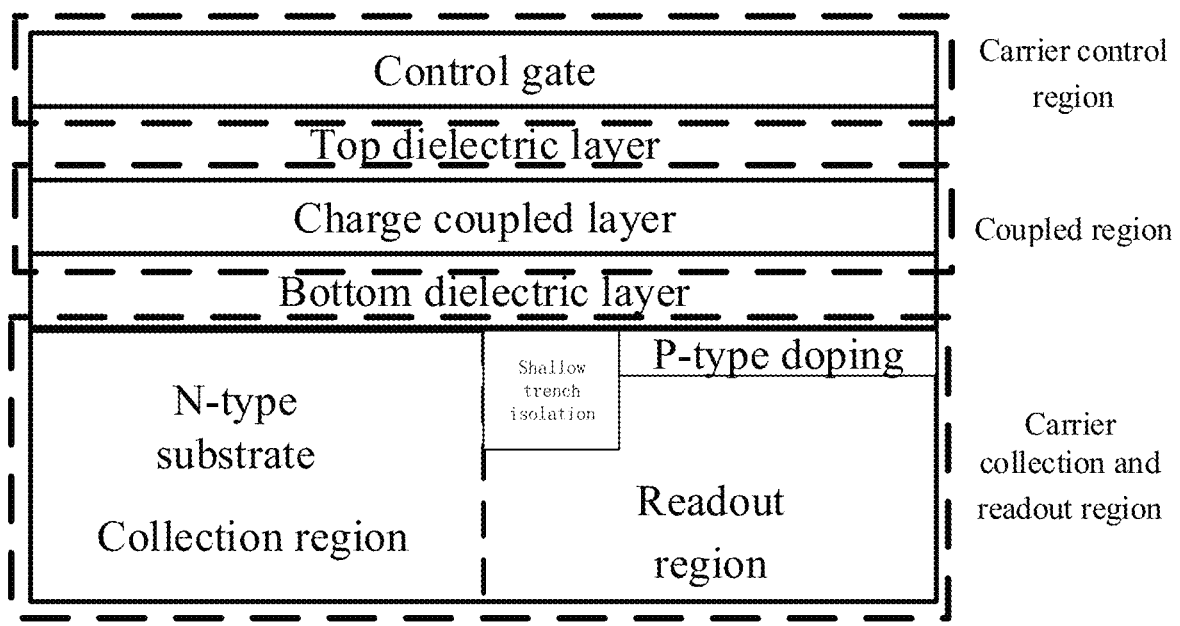
FIG. 8 shows a configuration diagram of a multifunctional area of the photoelectric computing unit according to the second embodiment of the present invention.

Further, with reference to the configuration diagram of the multifunctional area of the photoelectric computing unit shown in FIG. 8, the photoelectric computing unit includes a control gate as the carrier control region, a charge coupled layer as the coupled region, and an N-type substrate as the photo-generated carrier collection and readout region; a bottom dielectric layer used for isolation is arranged between the N-type semiconductor substrate and the charge coupled layer; and a top dielectric layer used for isolation is arranged between the charge coupled layer and the control gate.

The second embodiment differs from the first embodiment of the present invention in that: the P-type substrate used in the device unit is replaced with an N-type substrate, and the N-type source and the N-type drain of the MOSFET in the readout region are replaced with a P-type source and a P-type drain. Other structures remain unchanged. Therefore, the principle-based derivation process is similar to the process described in the first embodiment, and the similar part will not be repeated.

In accordance with the previous derivation, the equation (1-7) indicates that, when the voltage difference between the control gate and the substrate remains unchanged and before the incidence of photons, the higher the doping concentration of the substrate is, and the lower the depth of the depletion region is; however, a too shallow depletion region will result in a too small maximum number of photons that can be received by the computation device when receiving the optical input, so that the input range for the optical input terminal becomes smaller and the performance of the computing unit is influenced. Moreover, according to the related theories, a too high doping concentration of the substrate will result in too large thermal excitation of carriers, thereby influencing the storage time of the optical input data in the in-memory computing device.

In the semiconductor process, since the wafer is naturally lightly P-doped, this doping can be directly used as a condition for the substrate in the process of manufacturing a P-type substrate device. If it is necessary to manufacture an N-type substrate device, an N-well is firstly manufactured by ion implantation, and an N-type substrate device is manufactured in the N-well. Therefore, compared with the N-type substrate device, it is easier for the P-type substrate device to have a lower substrate doping concentration. Therefore, in the two embodiments, the scheme described in the first embodiment is often more advantageous than the scheme described in the second embodiment.

Like the scheme described in the first embodiment, the most basic structure of the photoelectric computing unit in the second embodiment includes only one output terminal. However, if the MOSFET in the readout region on the right is divided into a plurality of small and parallel MOSFETs having independent sources and drains and the same device parameters, the number of output terminals can be increased. If a same $V_{DS}$ is applied to the plurality of small MOSFETs, a plurality of identical output quantities of the photoelectric computing unit can be obtained. A photoelectric computing unit based on the scheme described in the second embodiment will be described hereinafter.

Third Embodiment

A photoelectric computing unit according to the third embodiment of the present invention will be described with reference to FIGS. 9-12.

Figure 9:
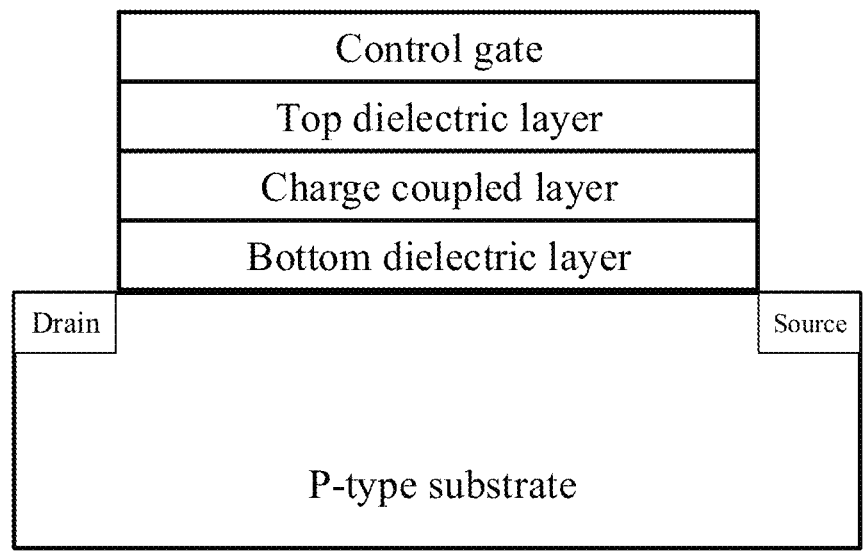
FIG. 9 shows a front view of a photoelectric computing unit according to a third embodiment of the present invention.
Figure 10:
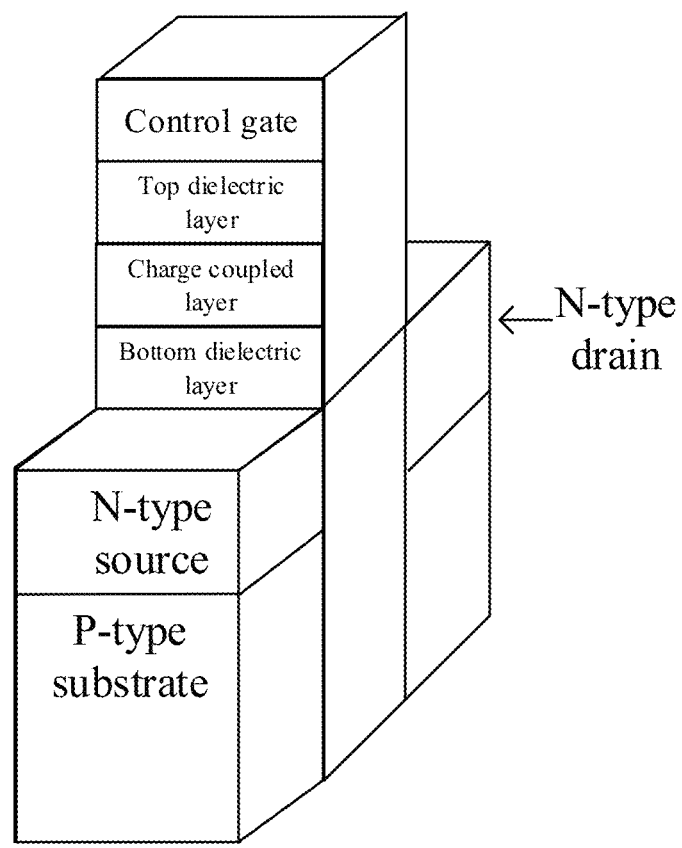
FIG. 10 shows a 3D schematic view of the photoelectric computing unit according to the third embodiment of the present invention.

As shown in the front view and the stereoscopic view of the photoelectric computing unit in FIGS. 9 and 10, there is a P-type semiconductor substrate as the photo-generated carrier collection and readout region. The P-type semiconductor substrate can be used for both light sensing and reading-out, and comprises one N-type drain and one N-type source. The N-type source is located on a side of the readout region close to a bottom dielectric layer, and is formed by doping by ion implantation. The N-type drain is located on the other side of the semiconductor substrate close to the bottom dielectric layer and opposite to the N-type source, and is also formed by doping by ion implantation. During the light sensing process, a pulse that is at a negative voltage is applied to the P-type semiconductor substrate, and a pulse that is at a positive voltage is applied to the control gate as the carrier control region, so that a depletion layer used for collecting photoelectrons is generated in the P-type substrate. The electrons generated in the depletion region are accelerated by an electric field between the control gate and two ends of the P-type substrate, travel through the potential barrier of the bottom dielectric layer between the P-type substrate and the charge coupled layer and into the charge coupled layer when obtaining high enough energy, and are stored in the charge coupled layer. The quantity of charges in the charge coupled layer will influence the threshold when the device is turned on, and thus influence the source-drain current during reading. During reading, a pulse voltage is applied to the control gate to form a conducting channel between the N-type source and the N-type drain, and a pulse voltage is applied between the N-type source and the N-type drain to accelerate the electrons in the conducting channel to from the source-drain current. The source-drain current is affected by the voltage at the control gate, the source-drain voltage and the number of electrons stored in the charge coupled layer, and is output, in form of current, as electrons affected by both the optical input quantity and the electrical input quantity, wherein the voltage at the control gate and the source-drain voltage may be used as electrical input quantities for the device and the number of electrons stored in the charge coupled layer is used as the optical input quantity for the device.

In addition, there is a charge coupled layer as the coupled region. The charge coupled layer is configured to store photoelectrons entering the charge coupled layer and change a threshold of the device during reading to influence the source-drain current in the readout region, so that the number of photoelectrons generated during light sensing and entering the charge coupled layer is read by determining the source-drain current in the readout region.

In addition, there is a control gate as the carrier control region. The control gate is configured to form, in the readout region of the P-type semiconductor substrate, a depletion region used for exciting photoelectrons by applying one pulse voltage to the control gate, and can also be used as an electrical input terminal to be input with one operation quantity.

In addition, there is a bottom dielectric layer between the P-type semiconductor substrate and the charge coupled layer, which is used for isolation. There is also a top dielectric layer between the charge coupled layer and the control gate, which is used for isolation.

Figure 11:
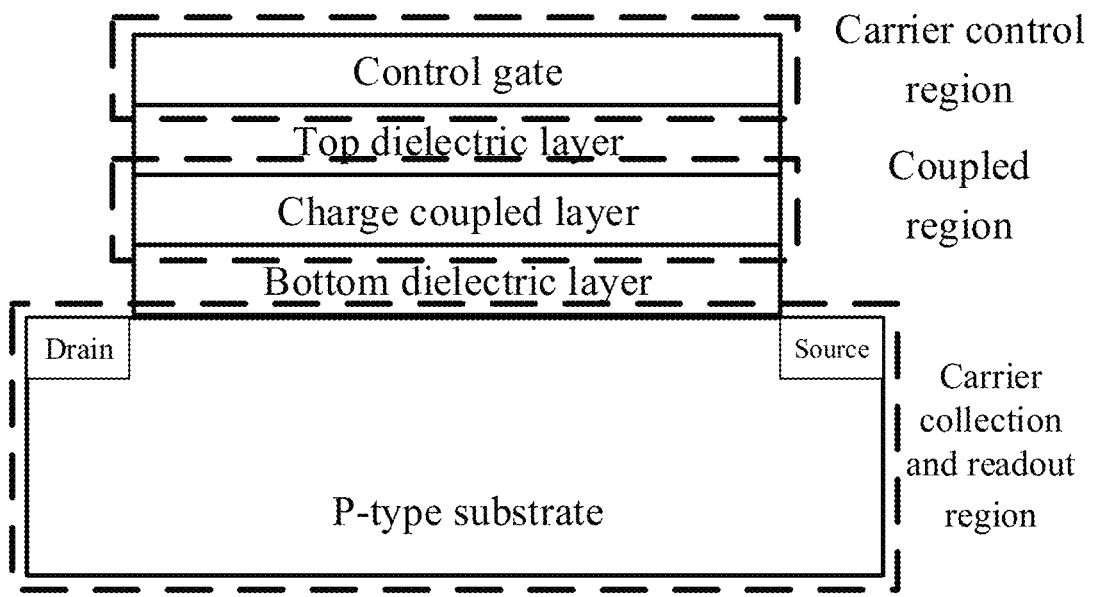
FIG. 11 shows a configuration diagram of a multifunctional area of the photoelectric computing unit according to the third embodiment of the present invention.

Further, with reference to the configuration diagram of the multifunctional area of the photoelectric computing unit shown in FIG. 11, the photoelectric computing unit includes a control gate as the carrier control region, a charge coupled layer as the coupled region, and a P-type substrate as the photo-generated carrier collection and readout region, wherein a bottom dielectric layer used for isolation is arranged between the P-type semiconductor substrate and the charge coupled layer; and a top dielectric layer used for isolation is arranged between the charge coupled layer and the control gate.

Figure 12:
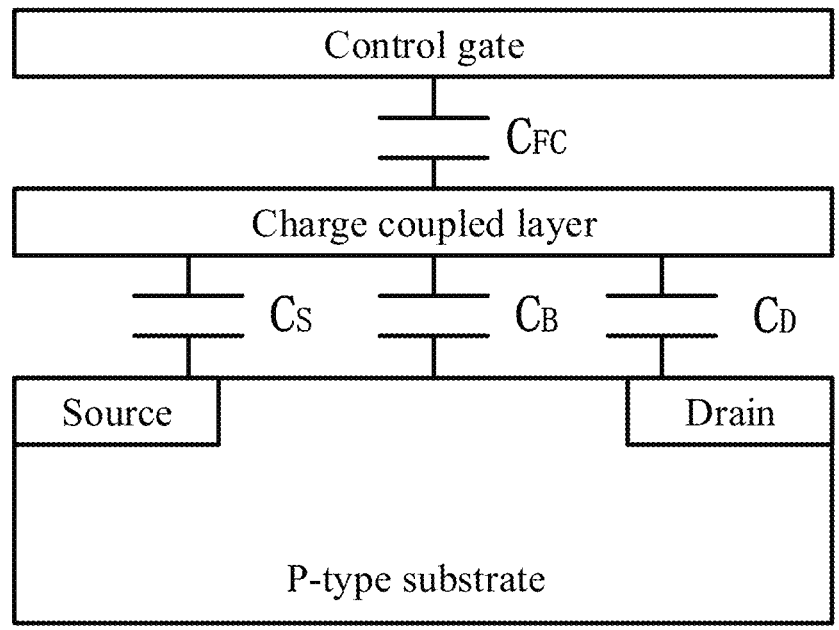
FIG. 12 shows an electrical model of the photoelectric computing unit according to the third embodiment of the present invention.

In addition, FIG. 12 is an electrical model of the photoelectric computing unit according to the third embodiment of the present invention. The principle of the photoelectric computing unit will be described in detail according to the electrical model shown in FIG. 5.

As shown in FIG. 12, the structure of the photoelectric computing unit is approximately equivalent to that of a floating gate device. The topmost gate is a control gate which is completely isolated from the charge coupled layer in the middle, and the charge coupled layer is equivalent to a floating gate in the floating gate device. $C_{FC}$, $C_S$, $C_B$ and $C_D$ are the capacitance between the floating gate and the control gate, the capacitance between the floating gate and the source, the capacitance between the floating gate and the substrate and the capacitance between the floating gate and the drain, respectively.

When there is no charge in the floating gate, that is, $\overline{Q}=0$, then:

$$\overline{Q}=0=C_{FC}(V_{FG}-V_{CG})+C_S(V_{FG}-V_S)+C_D(V_{FG}-V_D)+C_B(V_{FG}-V_B) \quad (2\text{-}1)$$

where $V_{FG}$ is the potential of the floating gate, $V_{CG}$ is the potential of the control gate, $V_S$, $V_D$ and $V_B$ are the potential of the source, the potential of the drain and the potential of the substrate, respectively.

If the total capacitance $C_T$ of the floating gate is defined as $C_T=C_{FC}+C_S+C_D+C_B$ and the coupling coefficient $\partial_J$ of the electrode J is defined as $\partial_J=C_J/C_T$, where the electrode J may be any one of the control gate G, the drain D, the source S and the substrate B, the potential $V_{FG}$ of the floating gate may be expressed as below by using the coupling coefficient:

$$V_{FG}=\alpha_G V_{GS}+\alpha_D V_{DS}+\alpha_S V_S+\alpha_V V_B \quad (2\text{-}2)$$

where $V_{GS}$ and $V_{DS}$ are the gate-source voltage and the source-drain voltage, respectively, and $\alpha_G$, $\alpha_S$, $\alpha_D$ and $\alpha_B$ are the coupling coefficients of the gate, the source, the drain and the substrate, respectively. It can be known that the potential of the floating gate is related to not only the control gate, but also the potential of the source, the potential of the drain and the potential of the substrate. If both the source and the substrate are grounded, then:

$$V_{FG} = \alpha_G\left(V_{GS} + \frac{\alpha_D}{\alpha_G} \cdot V_{DS}\right) = \alpha_G(V_{GS} + f \cdot V_{DS}) \quad (2\text{-}3)$$

$$\text{where } f = \frac{\alpha_D}{\alpha_G} = \frac{C_D}{C_{FC}}. \quad (2\text{-}4)$$

For the floating gate device, the threshold voltage $V_T$ and the conductivity coefficient $\beta$ can be derived from the formula for common MOS devices:

$$V_T^{FG} = \alpha_G V_T^{CG} \quad (2\text{-}5)$$

$$\beta^{FG} = \frac{1}{\alpha_G}\beta^{CG} \quad (2\text{-}6)$$

where $V_T^{FG}$ is the potential of the floating gate when the device reaches the threshold, $V_T^{CG}$ is the potential of the control gate when the device reaches the threshold, $\beta^{CG}$ is the bulk conductivity coefficient for the control gate, and $\beta^{FG}$ is the bulk conductivity coefficient for the floating gate.

Thus, for a linear region ($|V_{DS}|<\partial_G|V_{GS}+fV_{DS}-V_T|$), the drain current $I_{DS}$ is:

$$I_{DS} = \beta\left[(V_{GS} - V_T)V_{DS} - \left(f - \frac{1}{2\alpha_G}\right)V_{DS}^2\right] \quad (2\text{-}7)$$

When there are charges in the floating gate, that is, $\overline{Q} \neq 0$, the equations (2-3), (2-5) and (2-7) are expressed by:

$$V_{FG} = \alpha_G V_{GS} + \alpha_D V_{DS} + \frac{\overline{Q}}{C_T} \quad (2-8)$$

$$V_T^{CG} = \frac{1}{\alpha_G} V_T^{FG} - \frac{\overline{Q}}{C_T \alpha_G} = \frac{1}{\alpha_G} V_T^{FG} - \frac{\overline{Q}}{C_{FC}} \quad (2-9)$$

$$I_{DS} = \beta \left[ \left( V_{GS} - V_T - \left(1 - \frac{1}{\alpha_G}\right) \frac{\overline{Q}}{C_T} \right) V_{DS} + \left(f - \frac{1}{2\alpha_G}\right) V_{DS}^2 \right] \quad (2-10)$$

It can be known from the equation (2-9) that $V_T$ is directly related to $\overline{Q}$. Meanwhile, by this equation, the change $\Delta V_T$ of $V_T$ can be expressed by:

$$\Delta V_T = V_T - V_{T0} = -\overline{Q}/C_{FC} \quad (2-11)$$

where $V_{T0}$ is the threshold when there is no charge in the floating gate. After a gate voltage pulse is applied to the control gate in the photoelectric computing unit shown in FIGS. 9 and 10 and a negative pulse voltage is applied to the substrate, a depletion layer is formed in the semiconductor substrate. During optical inputting, the photons representing the optical input quantity are incident into the depletion region in the semiconductor substrate, and the Si semiconductor substrate absorbs one photon and excites one electron-hole pair. The photoelectrons are accelerated, when driven by the gate voltage, to move to the channel, and obtain high enough energy. If the energy is high enough, the photoelectrons can enter the charge coupled layer due to the gate oxide electric field. In this way, the storage of charges is realized. After the photoelectrons are stored in the charge coupled layer, during reading, the drain current and the threshold voltage of the floating gate MOSFET will change. It can be known from the equation (2-11) that the change in the threshold voltage of the device, which is caused after the photoelectrons enter the charge coupled layer, may be expressed by:

$$\Delta V_T = \frac{N_{elec} * Q_e}{C_{CG}} \quad (2-12)$$

where $\Delta V_T$ is the change in the threshold voltage, $Q_e$ is the quantity of charges of a single electron, $C_{CG}$ is the capacitance from the control gate to the floating gate, and $N_{elec}$ is the number of photoelectrons in the storage layer. This equation indicates that the change in the threshold voltage is linearly related to the quantity of charges of light.

By measuring the change in the threshold voltage before and after exposure, the number of photoelectrons in the photoelectron storage layer can be inferred by the following equation:

$$N_{elec} = \frac{\Delta V_T * C_{CG}}{Q_e} \quad (2-13)$$

The expression of the capacitance $C_{CG}$ from the control gate to the floating gate is substituted into the above equation to obtain:

$$N_{elec} = \frac{\Delta V_T * \varepsilon_0 \varepsilon_{ox} (W + 2H) L}{Q_e * t_{IPD}} \quad (2-14)$$

where W and L are the gate width and gate length of the floating gate device, respectively, H is the thickness of the floating gate, $t_{IPD}$ is the thickness between the floating gate and the gate in the device unit, $\varepsilon_0$ is the vacuum dielectric constant, and $\varepsilon_{ox}$ is the relative dielectric constant.

It can be known from the equation (2-10) that the change $\Delta I_{DS}$ in the drain current in the linear region corresponding to the change in the threshold voltage can be expressed by:

$$\Delta I_{DS} = \frac{\mu_n C_{ox} W}{L} \cdot \frac{N_{FG} q}{C_T} \cdot V_{DS}. \quad (2-15)$$

Thus, the number of the stored photoelectrons can also be obtained by measuring the change in the drain current in the linear region.

In conclusion, the drain-source current $I_d$ of the readout region is:

$$I_d = \frac{C_{ox} \mu W}{L} \left( V_G - V_T^{FG} - \frac{N_{elec} Q}{C_{CG}} \right) V_{DS} \quad (2-15)$$

It is easy to know from the equation (2-15) that the drain-source current $I_d$ of the readout region, as a readout quantity, is affected by both the N as an optical input quantity and the $V_G$ and $V_{DS}$ as electrical input quantities, and inherently contains the operation relationships of multiplication and addition. Thus, computation apparatuses with various different functions can be designed by using such relationships.

The third embodiment differs most from the first and second embodiments in that: in this scheme, since the photoelectrons, as storage carriers, for the optical input quantity in the device unit are stored in the isolated charge coupled layer, the photoelectrons can be retained for a very long period of time, up to 10 years at most, while in the schemes described in the first and second embodiments, the optical input signal can be retained for only a few seconds. Thus, as an in-memory computing device, the device of the third embodiment is more advantageous.

Like the first and second embodiments, the most basic structure of the photoelectric computing unit includes only one output terminal. However, if the substrate in the charge coupled layer is divided into a plurality of small and parallel MOSFETs having independent sources and drains and the same device parameters, the number of output terminals can be increased. If a same $V_{DS}$ is applied to the plurality of small MOSFETs, a plurality of identical output quantities of the photoelectric computing unit can be obtained. A photoelectric computing unit based on the scheme described in the second embodiment will be described hereinafter.

Fourth Embodiment

A photoelectric computing unit according to the fourth embodiment of the present invention will be described with reference to FIGS. 13 and 14.

Figure 13:
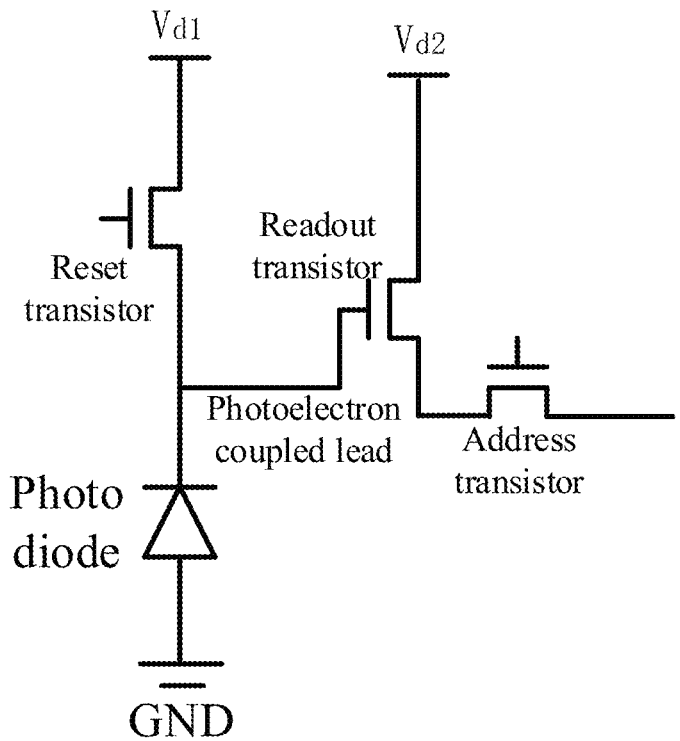
FIG. 13 shows a structure diagram of a photoelectric computing unit according to a fourth embodiment of the present invention.

As shown in FIG. 13, there is a photodiode and a readout transistor as the photo-generated carrier collection and readout region, wherein the photodiode is formed by ion doping and configured to sense light. An N region of the photodiode is connected to a control gate of the readout transistor and a source of a reset transistor through the photoelectron coupled lead that is used as the coupled region, and one positive voltage pulse is, as a driving voltage for the read current, applied to the drain of the readout transistor. Before exposure, the reset transistor is turned on, and the drain voltage of the reset transistor is applied to the photodiode, so that the photodiode as the collection region is in a reverse biased state to form a depletion layer. During exposure, the reset transistor is turned off, the photodiode is electrically isolated, photons are incident into the depletion region of the photodiode to generate photoelectrons, the photoelectrons are accumulated in the diode, and the potential of the N region of the diode and the potential of the control gate of the readout transistor electrically connected to the N region through the photoelectron coupled lead that is used as the coupled region begin to decrease, so that the concentration of electrons in the channel of the readout transistor is affected. The readout transistor is used for reading. One positive pulse voltage is applied to a drain of the readout transistor, and a source of the readout transistor is connected to a drain of an address transistor. During reading, the address transistor is turned on, and the current is generated in the readout transistor. The magnitude of the current is affected by the drain voltage of the reset transistor, the drain voltage of the readout transistor and the number of the incident photons. The electrons in the channel of the readout transistor are output, in form of current, as electrons affected by both the optical input quantity and the electrical input quantity, wherein the drain voltage of the reset transistor and the drain voltage of the readout transistor can be used as electrical input quantities for the device, and the number of electrical incident photons is used as the optical input quantity for the device.

In addition, there is a photoelectron coupled lead as the coupled region. The photoelectron coupled lead is configured to connect the photodiode as the collection region in the photo-generated carrier collection and readout region with the readout transistor as the readout region, and apply the potential of the N region of the photodiode onto the control gate of the readout transistor.

In addition, there is a reset transistor as the carrier control region. The reset transistor inputs one positive voltage to the photodiode through its drain; the positive voltage affects the photodiode once the reset transistor is turned on, so that the photodiode forms a depletion region and senses light; and, the reset transistor can also be used as an electrical input terminal to be input with one operation quantity.

In addition, the address transistor is configured to control the output of the output current, which is used as the output quantity, of the whole computation device.

Figure 14:
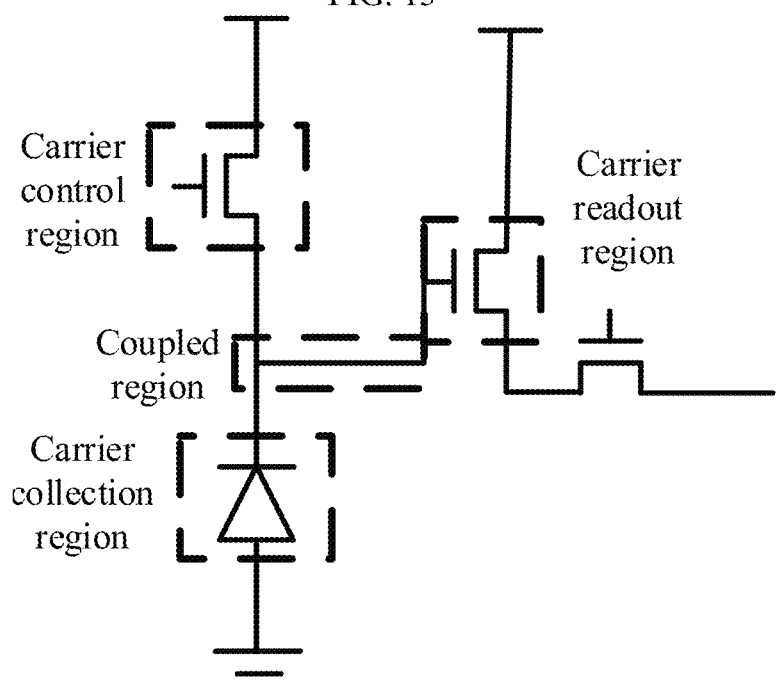
FIG. 14 shows a structure diagram of a multifunctional area of the photoelectric computing unit according to the fourth embodiment of the present invention.

Further, with reference to the configuration diagram of the multifunctional area of the photoelectric computing unit shown in FIG. 14, the photoelectric computing unit includes a reset transistor as the carrier control region, a photoelectron coupled lead as the coupled region, and a photodiode and a readout transistor as the photo-generated carrier collection and readout region. In addition, the photoelectric computing unit further includes an address transistor that is used for row and column addressing when the photoelectric computing units are arranged in an array.

In addition, as shown in FIG. 13, the drain of the reset transistor is connected to a power supply with a power supply voltage of $V_{d1}$. Before exposure, one high voltage is applied to the gate of the reset transistor so that the reset transistor is turned on, the power supply voltage $V_{d1}$ is applied to the cathode of the photodiode, and the anode of the photodiode is grounded. At this time, the voltage $V_{PD}$ between two ends of the photodiode is:

$$V_{PD}=V_{d1} \quad (3\text{-}1)$$

At this time, a depletion region is formed in the photodiode, where the width W of the depletion region is:

$$W=K(V_{d1}+V_{bi})^{m_j} \quad (3\text{-}2)$$

where K is a constant related to the parameter for the diode, $V_{bi}$ is a built-in electric field, and the value of m depends on whether the diode is an abrupt junction or a graded junction.

At this time, the reset transistor is turned off, the photodiode is electrically isolated, and the photons representing the optical input quantity are incident into the depletion region of the photodiode and form photoelectrons in the depletion region. The number of photoelectrons $I_{ph}$ generated per unit time is:

$$I_{ph}=R_{ph}L_0A \quad (3\text{-}3)$$

where $R_{ph}$ is the sensitivity of the photodiode, $L_0$ is the cross-sectional area of the photodiode, and A is the light intensity. Since the photodiode is isolated, the photoelectrons will be accumulated in the depletion region, as expressed by the following ordinary differential equation:

$$C_{pd}\frac{dV}{dt} + I_{ph} + I_d = 0 \quad (3\text{-}3)$$

where $I_d$ is the reverse-biased current. The differential equation is solved to obtain:

$$V(t) = (V_{d1} + V_{bi})\left[1 - \frac{(I_{ph}+I_d)(1-m_j)}{C_0(V_{d1}+V_{bi})}t\right]^{\frac{1}{1-m_j}} - V_{bi} \quad (3\text{-}4)$$

where $m_j$ is a constant. It can be known that the voltage between two ends of the photodiode gradually decreases with the increase of the number of incident photons. By substituting the conventional parameters of the photodiode into this equation, it is found that the curve of the voltage drop at two ends over time has good linearity. Thus, the equation is simplified as:

$$V(t)=(V_{d1})-K^*X_{photo} \quad (3\text{-}5)$$

where $X_{photo}$ is the number of incident photons representing the optical input quantity, and K is the slope of the fitted line. Since the readout transistor as the carrier readout region and the photodiode as the carrier collection region are connected through the photoelectron coupled lead that is used as the coupled region, the voltage between two ends of the photodiode is the voltage at the control gate of the readout transistor. During reading, the equation of the current in the channel in the linear region of the MOSFET is substituted to obtain:

$$I_d = \frac{C_{ox}\mu W}{L}(V_{d1} - KX_{photo} - V_T')V_{d2} \quad (3\text{-}6)$$

where $V_T'$ is the threshold of the readout transistor itself, $V_{d2}$ is the drain-source voltage of the readout transistor, μ is the mobility of the channel, and W and L are the gate width and the gate length, respectively.

It is easy to know from the equation (3-6) that the source-drain current $I_d$ of the readout region, as a readout quantity, is affected by both the $X_{photo}$ as an optical input quantity and the $V_{d1}$ and $V_{d2}$ as electrical input quantities, and inherently contains the operation relationships of multiplication and addition. Thus, by using such relationships, computation apparatuses with various different functions can be designed.

The photoelectric computing unit described in the fourth embodiment differs most from those in the above three schemes in that: this unit is larger in area and low in level of integration and can only be realized by one photodiode and three MOSs.

Like the above three schemes, the most basic structure of the photoelectric computing unit includes only one output terminal. However, if one readout transistor is expanded into a plurality of readout transistors having the gates connected together and the same device parameters and a same number of address transistors are provided, the number of output terminals can be increased. If a same $V_{DS}$ is applied to the plurality of readout transistors, a plurality of identical output quantities for the photoelectric computing unit can be obtained. A photoelectric computing unit based on the scheme described in the second embodiment will be described hereinafter.

In addition, it is to be emphasized that the photons incident into the photoelectric computing unit may come from a light emitting unit optically corresponding to the photoelectric computing unit, or may come from other light sources, for example, a natural light source or an object. Several light input schemes will be described below in detail.

Light Input Scheme

In accordance with one aspect of the present invention, a scheme of integrating an array of light emitting units with an array of photoelectric computing units is provided, wherein one or more light emitting units and one or more photoelectric computing units are included, and the photoelectric computing units are in one-to-one optical correspondence to the light emitting units. To realize accurate light input to a single photoelectric computing unit in the array, for example, the array of light emitting units may be implemented by an array of high-density and low-pixel LEDs. Specifically, the optical correspondence between the light emitting unit and the computing unit means that light emitted by the light emitting unit is accurately irradiated onto the computing unit corresponding to this light emitting unit. If only one light emitting unit and one computing unit are used, it is needed to ensure that light emitted by this light emitting unit is irradiated onto the computing unit. For example, if the light emitting array consists of 10*10 light emitting units and the computing array consists of a same number of computing units, it is needed to ensure that light emitted by each light emitting unit in the light emitting array is accurately irradiated onto one or more computing units corresponding to this light emitting unit according to the specific computation requirements. If the computation function realized by this array is matrix vector multiplication, it is needed to ensure that light emitted by each light emitting unit is accurately irradiated onto each computing unit. This accurate light input can be realized by the following four preferred embodiments.

Direct Projection

Figure 15:
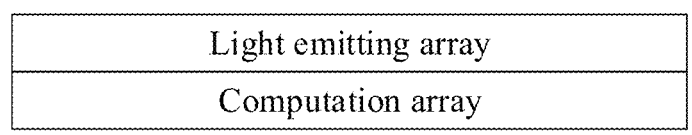
FIG. 15 shows a schematic view of a direct projection scheme according to the present invention.

If it is required to realize the one-to-one correspondence between light emitting units and devices, one method is to directly attach the array of light emitting units onto the surface of the array of devices, and the light emitting array uses a low-pixel LED screen, as shown in FIG. 15.

An ideal light emitting unit emits a spherical wave. When the distance is small enough, it can be considered that light emitted by the light emitting unit is just transmitted to the surface of the device directly below the light emitting unit. In this way, the one-to-one correspondence between the light source and the device is realized.

Integration of Light Emitting Units and Imaging Units

Figure 16:
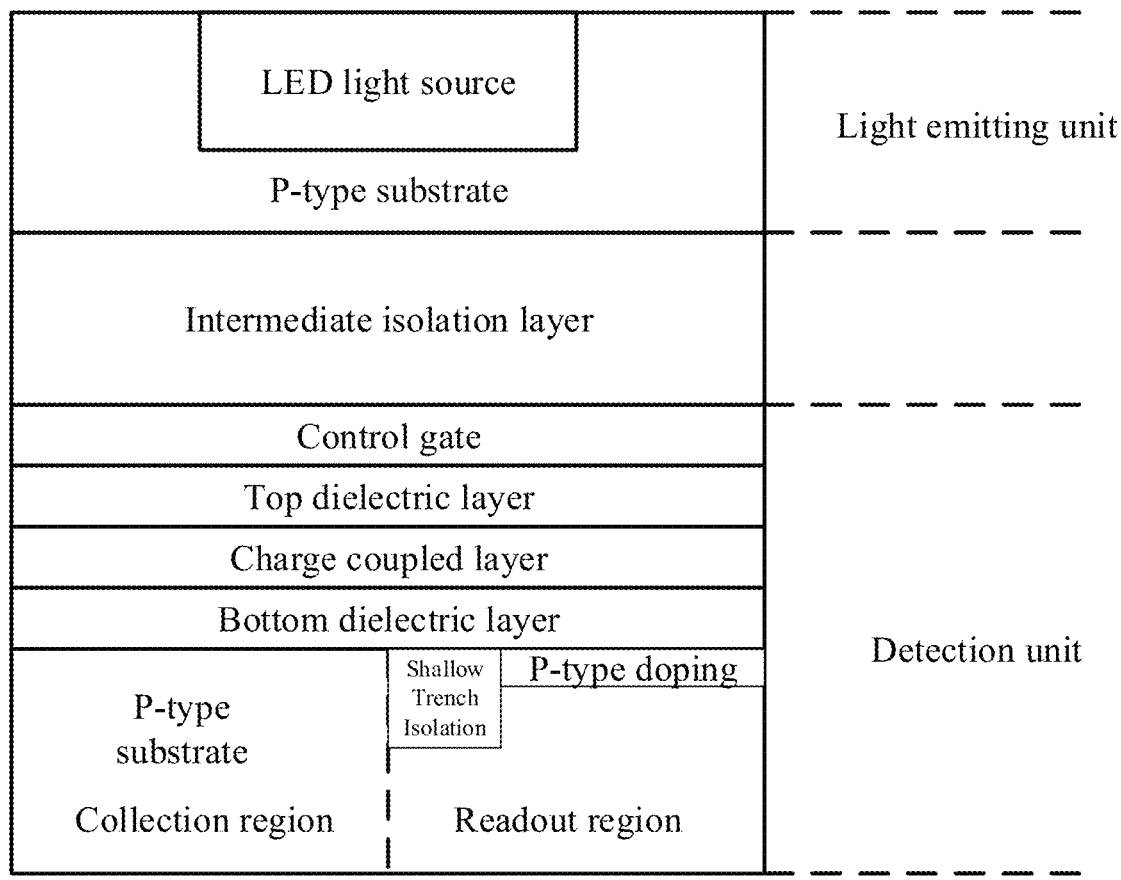
FIG. 16 shows a schematic view of integration of a light emitting unit and a photoelectric computing unit according to the present invention.

This scheme is similar to the SOI technology. If the three-dimensional integration of light emitting units and photoelectric computing units can be realized and the light emitting units and the photoelectric computing units are isolated by the growth of oxides (grown on one silicon wafer), both the integration of the arrays and the distance between LEDs and computation devices will be greatly optimized, as shown in FIG. 16, wherein the photoelectric computing unit may be the photoelectric computing unit described in the first embodiment of the present invention.

Light Input by Using a Lens

Figure 17:
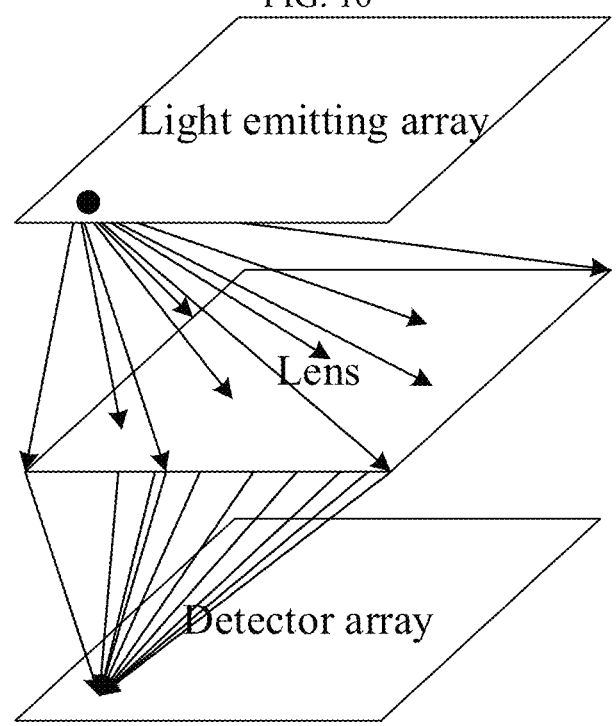
FIG. 17 shows a schematic view of a light input scheme by using a lens according to the present invention.

An optical structure used for realizing a focusing function between the light emitting array and the computing array may be a lens. To realize the one-to-one correspondence between light emitting objects and imaging chips in position, a lens is commonly used. The one-to-one optical correspondence between light emitting units and photoelectric computing units may also be realized in this way, as shown in FIG. 17.

Light Input by Using an Optical Fiber

An optical structure used for realizing a focusing function between the light emitting array and the computing array may also be an optical fiber taper. As a microstructure capable of realizing the one-to-one correspondence between light emitting units and photoelectric computing units, the optical fiber taper is similar to the optical fiber in function.

Figure 18:
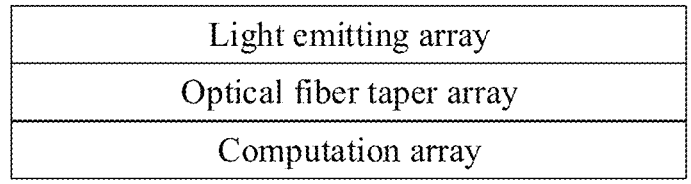
FIG. 18 shows a schematic view of a light input scheme by using optical fiber tapers according to the present invention.

The optical fiber may be regarded as an array of optical fibers formed by a plurality of dense optical fibers. If the light emitting units and the photoelectric computing units are linked by an array of optical fiber tapers, the one-to-one correspondence between the light emitting units and the photoelectric computing units can be well realized. The general structure is shown in FIG. 18.

Compared with the direct projection and the scheme using a lens, the scheme using optical fiber tapers has obvious advantages:

1. The transfer function is high, and optical crosstalk can be effectively suppressed by the one-to-one correspondence realized by the optical fiber tapers.
2. The level of integration is high, the yield is high, and the space for optimization is large.

Figure 19:
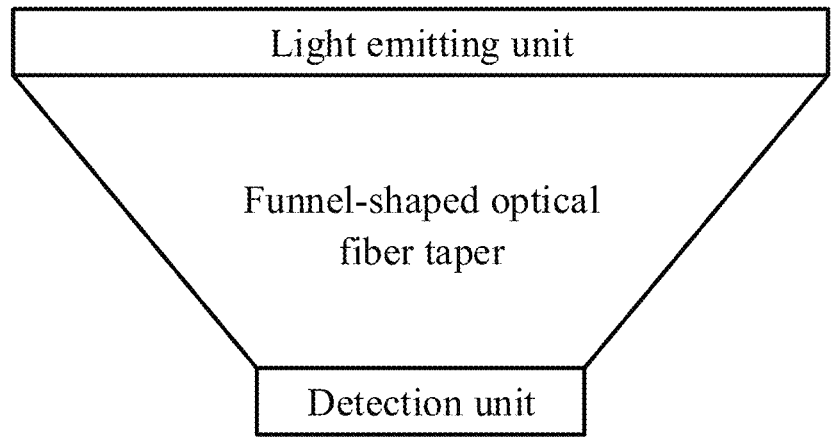
FIG. 19 shows a schematic view of a light input scheme by using a funnel-shaped optical fiber taper scheme according to the present invention.

As mentioned in the scheme using direct projection, to improve the level of integration of photoelectric computing units, a single photoelectric computing unit will be made as small as possible while giving consideration to other indicators. However, at present, the LED pixel must be about 8 μm in size. To realize the one-to-one correspondence between a light emitting unit and a photoelectric computing unit which are not matched in size, for example, the two units may be connected by funnel-shaped optical fiber tapers. The general structure is shown in FIG. 19.

Therefore, by using optical fiber tapers, the problem of the photoelectric computing array in the aspect of light input is well solved.

Scheme for Driving the Light Emitting Unit

The driving of the light emitting unit is controlled by a light input control portion in a digital control system.

The light emitting unit is driven by the constant current generated by a driver, and different optical input quantities are input by adjusting the light emitting time while keeping the light intensity unchanged. If there are only one computing unit and one light emitting unit, the light input control portion converts the data, which is to be input into the computing unit optically, into the pulse width of the light emitting time of the light emitting unit. According to the different type of the used computing unit, for example, if the computing unit described in the first embodiment is used, the larger the optical input quantity is, the less the light emitting time of the driven light emitting unit is.

Computing Array and Light Emitting Array

As described in the embodiments of the photoelectric computing unit, a single photoelectric computing unit can realize addition or multiplication operations. If a plurality of photoelectric computing units are arranged in an array and the light emitting units corresponding to the photoelectric computing units are also arranged in an array, one or more groups of addition or multiplication operations can be completed. Meanwhile, if the output terminals of two photoelectric computing units are connected through a lead to converge the output current together, it is equivalent to one addition operation. By this method, a computing array for a particular operation can be manufactured from photoelectric computing units according to the specific algorithm requirements by changing the connection of the lead and the arrangement of the photoelectric computing units.

Moreover, by correspondingly arranging photoelectric computing units and light emitting units in arrays, an array for matrix vector multiplication, an array for average pooling, an array for convolution or the like can be realized.

First Adder

As described above, the present invention provides various specific implementations of photoelectric computation devices and photoelectric computing methods. By using light emitting units and the photoelectric computing units descried above (including the first to fourth preferred embodiments), an operation of adding two addends can be realized.

The adder according to the present invention has the following advantages: an operation of adding two addends can be realized by a single photoelectric computing unit and a single light emitting unit, and the level of integration is high.

The number of output terminals of this adder depends on the number of output terminals of the used photoelectric computing unit. For example, if the photoelectric computing unit having two output terminals described above is used, the adder has two output terminals too. In the following four schemes to be described below, it is defaulted to use a photoelectric computing unit having one output terminal as an example.

Scheme 1: Based on the Photoelectric Computing Unit in the First Embodiment

In the scheme 1, the source-drain output current satisfies the following formula:

$$I_d = \frac{C_2 \mu W}{L} \left( V_G - V_T^{FG} - \frac{X_{photon} t \eta q}{C_3} \right) V_{DS} \tag{3-1-1}$$

where $X_{photo}$ is the number of effective photons incident into the photoelectric computing unit, $V_G$ is the voltage at the control gate representing the carrier control region, t is the exposure time, $\eta$ is the quantum efficiency, and q is the quantity of charges of electrons. Since there is inherently an addition/subtraction relationship between $X_{photo}$ and $V_G$ in the formula, by using this relationship, an addition operation can be realized by modulating $X_{photo}$ and $V_G$, wherein:

$X_{photo}$ represents the input quantity from the optical input terminal and is used as the first addend, and $V_G$ represents the input quantity from the electrical input terminal and is used as the second addend. Meanwhile, the drain-source voltage $V_{DS}$ of the readout region in the carrier collection and readout region is added with a constant value, so the output current $I_d$ of the readout region in the carrier collection and readout region is a result of the addition operation, that is, the computation shown in the equation (3-1-2):

$$R = k(aX + bY + c) \tag{3-1-2}$$

where a, b, k and c are all constants.

Scheme 2: Based on the Photoelectric Computing Unit in the Second Embodiment

The scheme 2 based on the photoelectric computing unit in the second embodiment differs most from the scheme 1 in that: the P-type substrate device is replaced with an N-type substrate device, so the voltage applied to the control gate as the carrier control region is changed from the positive voltage into the negative voltage, and the voltage applied to the N-type substrate as the carrier collection and readout region during exposure is changed from the negative voltage into the positive voltage. Since there is still an addition/subtraction relationship between the voltage at the control gate and the number of incident photons, an addition operation substantially similar to that in the scheme based on the first embodiment can still be realized by making few changes during the modulation of optical input signals and electrical input signals.

Scheme 3: Based on the Photoelectric Computing Unit in the Third Embodiment

In the scheme 3 based on the photoelectric computing unit in the third embodiment, the drain-source output current satisfies the following equation:

$$I_d = \frac{C_{ox} \mu W}{L} \left( V_G - V_T^{FG} - \frac{N_{elec} Q}{C_{CG}} \right) V_{DS} \tag{3-3-1}$$

where $N_{elec}$ is the number of electrons entering the charge coupled layer as the coupled region, $V_G$ is the voltage at the control gate as the carrier control region, and $V_T^{FG}$ is the threshold of the device. Since there is inherently an addition/subtraction relationship between $N_{elec}$ and $V_G$ in the equation, by using this relationship, an addition operation can be realized by modulating $N_{elec}$ and $V_G$.

$N_{elec}$ represents the input quantity from the optical input terminal and is used as the first addend, $V_G$ represents the input quantity from the electrical input terminal and is used as the second addend, and the drain-source voltage $V_{DS}$ of the readout region in the carrier collection and readout region is added with a constant value. The output current $I_D$ of the readout region in the carrier collection and readout region is a result of the addition operation, that is, it is equivalent to perform the computation shown in the equation (3-3-2):

$$R = k(aX + bY + c) \tag{3-3-2}$$

where a, b, k and c are all constants.

Scheme 4: Based on the Photoelectric Computing Unit in the Fourth Embodiment

In the scheme 4 based on the photoelectric computing unit in the fourth embodiment, the drain-source output current satisfies the following equation:

$$I_d = \frac{C_{ox} \mu W}{L} (V_{d1} - K X_{photo} - V_T') V_{d2} \tag{3-4-1}$$

where $X_{photo}$ is the number of effective photons incident into the photoelectric computing unit, $V_{d1}$ is the drain voltage of the reset transistor as the carrier control region, K is the slope of the fitted line, and $V_{d2}$ is the source-drain voltage of the readout transistor. Since there is inherently an addition/subtraction relationship between $X_{photo}$ and $V_{d1}$ in the equation, by using this relationship, an addition operation can be realized by modulating $X_{photo}$ and $V_{d1}$.

$X_{photo}$ represents the input quantity from the optical input terminal and is used as the first addend, $V_{d1}$ represents the input quantity from the electrical input terminal and is used as the second addend, and the drain voltage $V_{DS}$ of the readout transistor representing the readout region in the carrier collection and readout region is added with a constant value. The output current $I_d$ of the readout region in the carrier collection and readout region is a result of the addition operation, that is, it is equivalent to perform the computation shown in the equation (3-4-2):

$$R = k(aX + bY + c) \quad (3\text{-}4\text{-}2)$$

where a, b, k and c are all constants.

Compared with the traditional adders, the use of this scheme for an addition operation has the following advantages:
1. The level of integration is high, and the operation can be realized by a single photoelectric computing unit.
2. The optical input data can be stored and can be saved in the device for a long period of time after light is cut off, so it is unnecessary to perform the optical input operation again for a next operation.

Second Adder

As described above, the present invention provides various specific implementations of photoelectric computation devices and photoelectric computing methods. The operation of adding at least two addends is realized by using one light emitting unit and a photoelectric computing unit having multiple control regions. The greatest advantage of this adder is that the addition operation can be realized by a single photoelectric computing unit and the number of the input addends is not limited to two. However, this adder needs to be supported technologically. Particularly, when the schemes based on the photoelectric computing units in the first, second and third embodiments are used, the multi-control-gate parameters must be high in uniformity.

The number of output terminals of this adder specifically depends on the number of output terminals of the used photoelectric computing unit. For example, if the photoelectric computing unit having two output terminals is used, the adder has two output terminals too. In the following four schemes to be described in detail, it is defaulted to use a photoelectric computing unit having one output terminal as an example.

Scheme 1: Based on the Photoelectric Computing Unit in the First Embodiment

Figure 20:
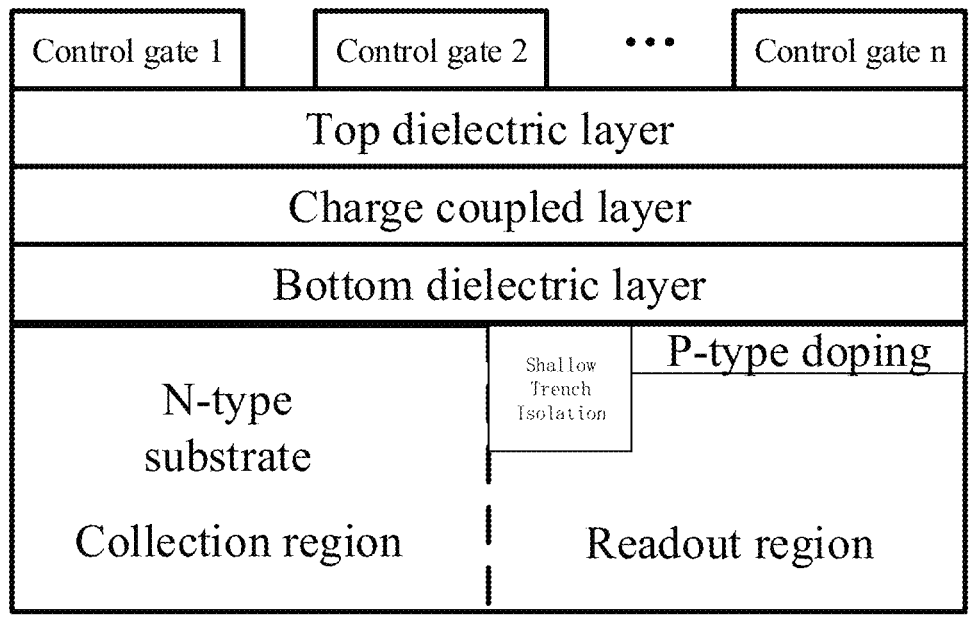
FIG. 20 shows a structure diagram of an example of a multi-control-gate structure using the photoelectric computing unit according to the present invention.

In the scheme 1, the source-drain output current satisfies the following equation:

$$I_d = \frac{C_2 \mu W}{L}\left(V_G - V_T^{FG} - \frac{X_{photon} t \eta q}{C_3}\right)V_{DS} \quad (4\text{-}1\text{-}1)$$

where $X_{photo}$ is the number of effective photons incident into the photoelectric computing unit, $V_G$ is the voltage at the control gate representing the carrier control region, t is the exposure time, η is the quantum efficiency, and q is the quantity of charges of electrons. If the control gate is changed to a multi-gate structure, as shown in FIG. 20, the equation is changed to:

$$I_d = \frac{C_{ox}\mu W}{L}\left(-\frac{X_{photo} t \eta q}{C_3} + k_1 V_{G1} + k_2 V_{G2} \ldots k_n V_{Gn} - V_T^{FG}\right)V_{DS} \quad (4\text{-}1\text{-}2)$$

where $V_{G1}$ to $V_{Gn}$ represent the input voltages at n control gates, respectively, and are used as electrical input quantities from a plurality of electrical input terminals; and $k_1$ to $k_n$ are a plurality of gates input weights related to the area of the n control gates, respectively. It is easy to know from (4-1-2) that, there is inherently an addition/subtraction relationship between the voltage at each control gate and the optical input quantity $X_{photo}$, so the addition operation can be realized by using this relationship by modulating $X_{photo}$ and $V_{G1}$ to $V_{Gn}$.

$X_{photo}$ represents the input quantity from the optical input terminal and is used as the first addend, $V_{G1}$ to $V_{Gn}$ represent a plurality of input quantities from the electrical input terminals and are used as the second to $n^{th}$ addends, and the drain-source voltage $V_{DS}$ of the readout region in the carrier collection and readout region is added with a constant value. The output current $I_d$ of the readout region in the carrier collection and readout region is a result of the addition operation, that is, it is equivalent to perform the computation shown in the equation (3-1-2):

$$R = k(aX + k_1 Y_1 + k_2 Y_2 \ldots k_n Y_n + c) \quad (4\text{-}1\text{-}3)$$

where a, b, k and c are all constants.

Scheme 2: Based on the Photoelectric Computing Unit in the Second Embodiment

The scheme 2 differs most from the scheme 1 in that: the P-type substrate device is replaced with an N-type substrate device, so the voltage applied to the multi-gate control gate as the carrier control region is changed from the positive voltage into the negative voltage, and the voltage applied to the N-type substrate as the carrier collection and readout region during exposure is changed from the negative voltage into the positive voltage. Since there is still an addition/subtraction relationship between the voltages at the plurality of gates and the number of incident photons, an operation of adding a plurality of addends, that is substantially similar to that in the scheme 1, can still be realized by making few changes during the modulation of optical input signals and electrical input signals.

Scheme 3: Based on the Photoelectric Computing Unit in the Third Embodiment

Figure 21:
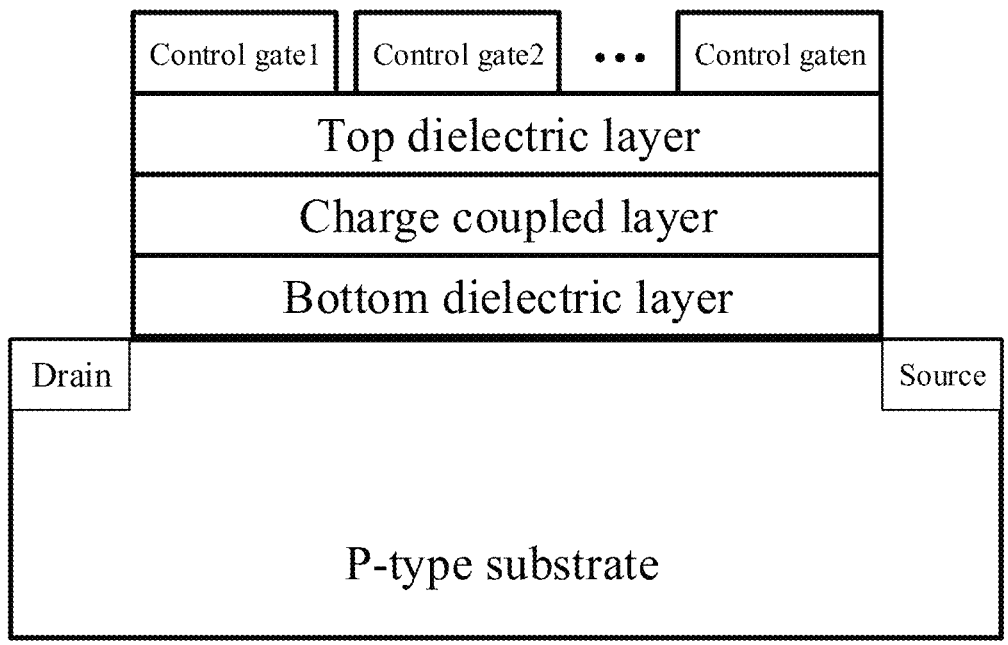
FIG. 21 shows a structure diagram of an example of the multi-control-gate structure using the photoelectric computing unit according to the present invention.

In the scheme 3, if the control gate representing the carrier control region is of a multi-gate structure, as shown in FIG. 21, the source-drain output current satisfies the following equation:

$$I_d = \frac{C_{ox}\mu W}{L}\left(k_1 V_{G1} + k_2 V_{G2} \ldots k_n V_{Gn} - V_T^{FG} - \frac{N_{elec} Q}{C_{CG}}\right)V_{DS} \quad (4\text{-}2\text{-}1)$$

where $V_{G1}$ to $V_{Gn}$ represent the input voltages at n control gates, respectively, and are used as electrical input quantities from a plurality of electrical input terminals; and $k_1$ to $k_n$ are a plurality of gate input weights related to the area of the n control gates, respectively. It is easy to know from (4-2-1) that, there is inherently an addition/subtraction relationship between the voltage at each control gate and the quantity of charges N of the photoelectrons entering the charge coupled layer representing the coupled region, so the addition operation can be realized by using this relationship by modulating N and $V_{G1}$ to $V_{Gn}$.

N represents the input quantity from the optical input terminal and is used as the first addend, $V_{G1}$ to $V_{Gn}$ represent a plurality of input quantities from the electrical input terminals and are used as the second to $n^{th}$ addends, and the drain-source voltage $V_{DS}$ of the readout region in the carrier collection and readout region is added with a constant value. The output current $I_D$ of the readout region in the carrier collection and readout region is a result of the addition operation, that is, it is equivalent to perform the computation shown in the equation (4-3-2):

$$R=k(aX+k_1Y_1+k_2Y_2 \ldots k_nY_n+c) \quad (4\text{-}3\text{-}2)$$

where a, b, k and c are all constants.

Scheme 4: Based on the Photoelectric Computing Unit in the Fourth Embodiment

Figure 22:
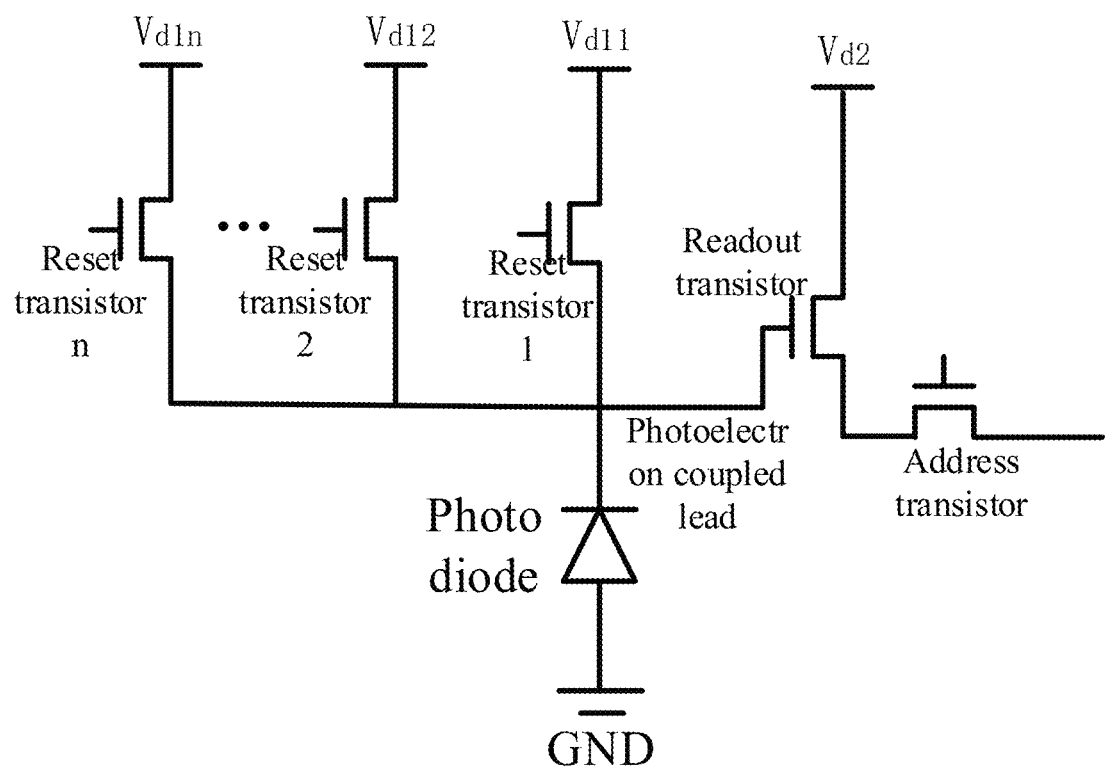
FIG. 22 shows a structure diagram of an example of the multi-control-gate structure using the photoelectric computing unit according to the present invention.

In the scheme 4, if the reset transistor representing the carrier control region is a plurality of reset transistors connected in parallel, as shown in FIG. 22, the source-drain output current satisfies the following equation:

$$I_d = \frac{C_{ox}\mu W}{L}(k_1 V_{d11} + k_2 V_{d12} \ldots k_n V_{d1n} - KX_{photo} - V_T')V_{d2} \quad (4\text{-}4\text{-}1)$$

where $V_{d1}$ to $V_{dn}$ represent the voltages at the drains of n reset transistors, respectively, and are used as electrical input quantities from a plurality of electrical input terminals; and $k_1$ to $k_n$ are a plurality of gate input weights related to the channel resistance of the n reset transistors, respectively. It is easy to know from (4-4-1) that, there is inherently an addition/subtraction relationship between the voltage at the drain of each reset transistor and the optical input quantity $X_{photo}$, so the addition operation can be realized by using this relationship by modulating $X_{photo}$ and $V_{d1}$ to $V_{dn}$.

$X_{photo}$ represents the input quantity from the optical input terminal and is used as the first addend, $V_{d1}$ to $V_{dn}$ represent a plurality of input quantities from the electrical input terminals and are used as the second to $n^{th}$ addends, and the drain-source voltage $V_{DS}$ of the readout region in the carrier collection and readout region is added with a constant value. The output current $I_D$ of the readout region in the carrier collection and readout region is a result of the addition operation, that is, it is equivalent to perform the computation shown in the equation (4-4-2):

$$R=k(aX+k_1Y_1+k_2Y_2 \ldots k_nY_n+c) \quad (4\text{-}4\text{-}2)$$

where a, b, k and c are all constants.

Compared with the traditional adders, the use of this scheme for an addition operation has the following advantages:

The level of integration is high, and the operation of adding a plurality of addends can be realized by a single photoelectric computing unit.

The optical input data can be stored and can be saved in the device for a long period of time after light is cut off, so it is unnecessary to perform the optical input operation again for a next operation.

Third Adder

As described above, the present invention provides various specific implementations of photoelectric computation devices and photoelectric computing methods. The operation of adding at least two addends is realized by using at least two light emitting units and at least two photoelectric computing units described above. The greatest advantage of the schemes of the adder is to use the characteristic of high light input accuracy. One photoelectric computing unit is responsible for the input of only one path of optical signals, and the electrical signal is merely a constant value, so that it is advantageous to improve the computation uniformity. In addition, if there are fixed computation errors similar to the fixed image noise or device uniformity, the fixed computation errors may be corrected by changing the constant value at the electrical input terminal.

The number of output terminals of this adder specifically depends on the number of output terminals of the used photoelectric computing unit. For example, if the photoelectric computing unit having two output terminals described above is used, the adder has two output terminals too. In the following detailed description, it is defaulted to use a photoelectric computing unit having one output terminal as an example.

Scheme 1: Based on the Photoelectric Computing Unit in the First Embodiment

Figure 23:
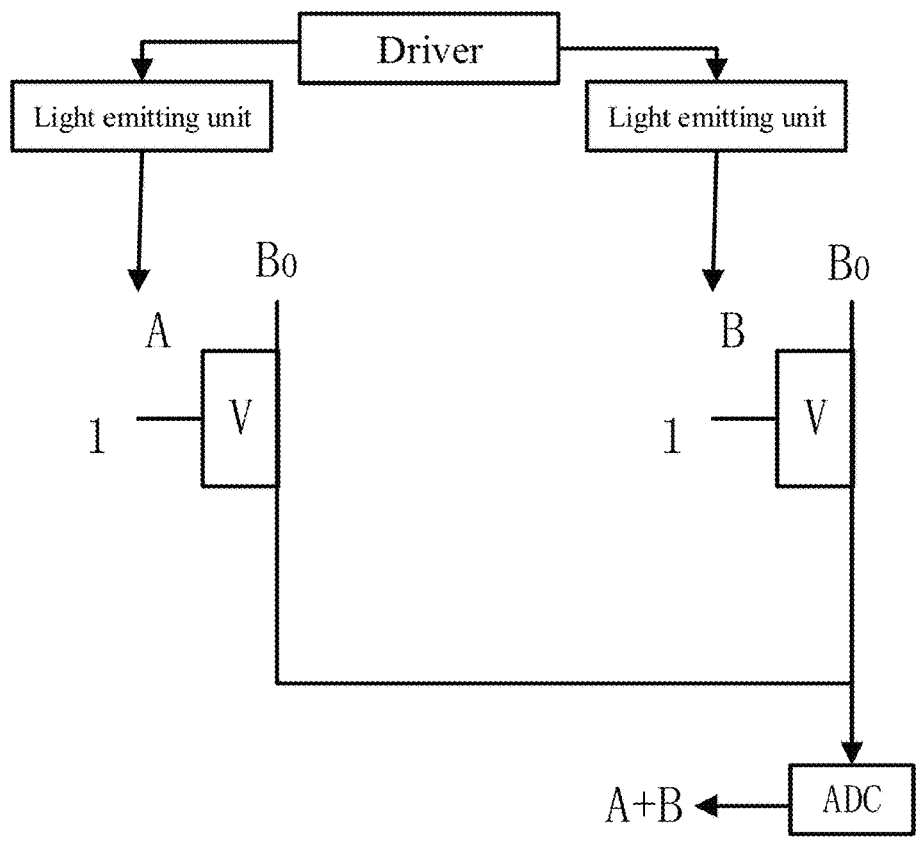
FIG. 23 shows a diagram of an example of an adder according to the present invention.

In the scheme 1, by taking an operation of adding two addends as an example, two photoelectric computing units and two light emitting units are used, as shown in FIG. 23, wherein one block marked with V represents one photoelectric computing unit using the scheme 1.

In the scheme 1, the source-drain output current satisfies the following equation:

$$I_d = \frac{C_2\mu W}{L}\left(V_G - V_T^{FG} - \frac{X_{photon}t\eta q}{C_3}\right)V_{DS} \quad (5\text{-}1\text{-}1)$$

where $X_{photon}$ is the number of effective photons incident into the photoelectric computing units. If two output terminals having the same parameters are connected in parallel, the output current is converged. If different optical input quantities $X_{photo}$ are supplied to the two photoelectric computing units but the same inputs $V_G$ and $V_{DS}$ are supplied to the electrical input terminals, the equation is changed to:

$$I_{dtotal} = \frac{C_2\mu W}{L}\left(-\frac{X_{photo1}t\eta q}{C_3} - \frac{X_{photo2}t\eta q}{C_3} + 2V_G - 2V_T^{FG}\right)V_{DS} \quad (5\text{-}1\text{-}2)$$

where $X_{photo1}$ and $X_{photo2}$ are input quantities from the optical input terminals of the two units having output terminals connected in parallel. It is easy to know from (5-1-2) that, there is inherently an addition/subtraction relationship between the optical input terminal data of the two units, so the addition operation can be realized by using this relationship by modulating $X_{photo1}$ and $X_{photo2}$.

$X_{photo1}$ and $X_{photo2}$ represent the first and second addends from the optical input terminals, respectively; and the voltage $V_G$ at the control gates of the two units as the carrier control regions and the drain-source voltage $V_{DS}$ of the readout regions in the carrier collection and readout regions are added with a constant value. The converged total output current $I_{Dtotal}$ is subjected to AD conversion and input into a control system to obtain a result of the addition. It is equivalent to perform the computation shown in the equation (5-1-3):

$$R=k(aX_1+aX_2+c) \quad (5\text{-}1\text{-}3)$$

where a, c and k are all constants. If it is required to perform an operation of adding more than two addends, it is only required to increase the number of the photoelectric computing units connected in parallel and the light emitting units corresponding to the photoelectric computing units. The control system may be a digital circuit, or may be various logic control units such as a computer, a single-chip microcomputer or an FPGA.

Scheme 2: Based on the Photoelectric Computing Unit in the Second Embodiment

The scheme 2 differs most from the scheme 1 in that: the P-type substrate device is replaced with an N-type substrate device, so the voltage applied to the control gate as the carrier control region is changed from the positive voltage into the negative voltage, and the voltage applied to the N-type substrate as the carrier collection and readout region during exposure is changed from the negative voltage into the positive voltage. Since there is still an addition/subtraction relationship between the optical input terminal data of the plurality of units connected in parallel, the operation of adding a plurality of addends, which is substantially similar to that in the scheme 1, can still be realized by making few changes during the modulation of optical input signals and electrical input constant values.

Scheme 3: Based on the Photoelectric Computing Unit in the Third Embodiment

By taking an operation of adding two addends as an example, two photoelectric computing units and two light emitting units are used, as shown in FIG. 23, wherein one block marked with V represents one photoelectric computing unit using the scheme 3.

In the scheme 3, the source-drain output current satisfies the following equation:

$$I_d = \frac{C_{ox}\mu W}{L}\left(V_G - V_T^{FG} - \frac{N_{elec}Q}{C_{CG}}\right)V_{DS} \qquad (5\text{-}3\text{-}1)$$

where N is the number of photons entering the charge coupled layer as the coupled region. If two output terminals having the same parameters are connected in parallel, the output current is converged. If different optical input quantities N are supplied to the two photoelectric computing units but the same inputs $V_G$ and $V_{DS}$ are supplied to the electrical input terminals, the equation is changed to:

$$I_{dtotal} = \frac{C_{ox}\mu W}{L}\left(V_G - V_T^{FG} - \frac{N_{elec}Q_1}{C_{CG}} - \frac{N_{elec}Q_2}{C_{CG}}\right)V_{DS} \qquad (5\text{-}3\text{-}2)$$

where $N_1$ and $N_2$ are input quantities from the optical input terminals of the two units having output terminals connected in parallel. It is easy to know from (5-3-2) that, there is inherently an addition/subtraction relationship between the optical input terminal data of the two units, so the addition operation can be realized by using this relationship by modulating $N_1$ and $N_2$.

$N_1$ and $N_2$ represent the first and second addends from the optical input terminals, respectively; and the voltage $V_G$ at the control gates of the two units as the carrier control regions and the drain-source voltage $V_{DS}$ of the readout regions in the carrier collection and readout regions are added with a constant value. The converged total output current $I_{Dtotal}$ is subjected to AD conversion and input into a control system to obtain a result of the addition. It is equivalent to perform the computation shown in the equation (5-3-3):

$$R=k(aX_1+aX_2+c) \qquad (5\text{-}3\text{-}3)$$

where a, c and k are all constants. If it is required to perform an operation of adding more than two addends, it is only required to increase the number of the photoelectric computing units connected in parallel and the light emitting units corresponding to the photoelectric computing units. The control system may be a digital circuit, or may be various logic control units such as a computer, a single-chip microcomputer or an FPGA.

Scheme 4: Based on the Photoelectric Computing Unit in the Fourth Embodiment

By taking an operation of adding two addends as an example, two photoelectric computing units and two light emitting units are used, as shown in FIG. 23, wherein one block marked with V represents one photoelectric computing unit using the scheme 4.

In the scheme 4, the source-drain output current satisfies the following equation:

$$I_d = \frac{C_{ox}\mu W}{L}(V_{d1} - KX_{photo} - V_T')V_{DS} \qquad (5\text{-}4\text{-}1)$$

where $X_{photo}$ is the number of photoelectrons collected in the photodiode as the readout region in the carrier collection and readout region. If two output terminals having the same parameters are connected in parallel, the output current is converged. If different optical input quantities $X_{photo}$ are supplied to the two photoelectric computing units but the same inputs $V_{d1}$ and $V_{d2}$ are supplied to the electrical input terminals, the equation is changed to:

$$I_{dtotal} = \frac{C_{ox}\mu W}{L}(V_{d1} - KX_{photo1} - KX_{photo2} - V_T')V_{DS} \qquad (5\text{-}4\text{-}2)$$

$X_{photo1}$ and $X_{photo2}$ represent the first and second addends from the optical input terminals, respectively; and the drain voltage $V_{d1}$ of the reset transistors of the two units as the carrier control regions and the drain voltage $V_{d2}$ of the readout transistors as the readout regions in the carrier collection and readout regions are added with a constant value. The converged total output current $I_{Dtotal}$ is subjected to AD conversion and input into a control system to obtain a result of the addition. It is equivalent to perform the computation shown in the equation (5-4-3):

$$R=k(aX_1+aX_2+c) \qquad (5\text{-}4\text{-}3)$$

where a, c and k are all constants. If it is required to perform an operation of adding more than two addends, it is only required to increase the number of the photoelectric computing units connected in parallel and the light emitting units corresponding to the photoelectric computing units. The control system may be a digital circuit, or may be various logic control units such as a computer, a single-chip microcomputer or an FPGA.

Compared with the traditional adders, the use of this scheme 4 for an addition operation has the following advantages:

The level of integration is high, and the operation of adding two addends can be realized by two photoelectric computing units.

The number of addends can be selected arbitrarily.

The optical input data can be stored and can be saved in the device for a long period of time after light is cut off, so it is unnecessary to perform the optical input operation again for a next operation.

First Multiplier

The present invention provides various specific implementations of photoelectric computation devices and photoelectric computing methods. The operation of multiplying two multiplier factors is realized by using one light emitting unit and one photoelectric computing unit described in the above embodiments. The greatest advantage of this multiplier is that the level of integration is high and the multiplication operation can be realized by a single device. However, this multiplier only supports the multiplication of two inputs, and is limited in computation accuracy for dual analog inputs.

The number of output terminals of this multiplier specifically depends on the number of output terminals of the used photoelectric computing unit. For example, if the photoelectric computing unit having two output terminals in the above embodiments is used, the multiplier has two output terminals too. In the following detailed description, it is defaulted to use a photoelectric computing unit having one output terminal.

1) Scheme Using the First Embodiment of the Photoelectric Computing Unit:

In the first scheme, the source-drain output current satisfies the following equation:

$$I_d = \frac{C_2 \mu W}{L}\left(V_G - V_T^{FG} - \frac{X_{photon} \eta q}{C_3}\right) V_{DS} \quad (6\text{-}1\text{-}1)$$

where $X_{photo}$ is the number of effective photons incident into the photoelectric computing unit, and $V_{DS}$ is the drain voltage of the P-type substrate representing the carrier collection and readout region. Since there is inherently a multiplication relationship in the equation, the multiplication operation can be realized by using this relationship by modulating $X_{photo}$ and $V_{DS}$.

$X_{photo}$ represents the input quantity from the optical input terminal and is used as the first multiplier factor, $V_{DS}$ represents the input quantity from the electrical input terminal and is used as the second multiplier factor, and the voltage $V_G$ at the control gate as the carrier control region is added with a constant value. The output current $I_D$ of the readout region in the carrier collection and readout region is a result of the multiplication operation, that is, it is equivalent to perform the computation shown in the equation (6-1-2):

$$R = k(aX+b)Y \quad (6\text{-}1\text{-}2)$$

where a, b and k are all constants.

2) Scheme Using the Second Embodiment of the Photoelectric Computing Unit:

The second scheme differs most from the first scheme in that: the P-type substrate device is replaced with an N-type substrate device, so the voltage applied to the control gate as the carrier control region is changed from the positive voltage into the negative voltage, and the voltage applied to the N-type substrate as the carrier collection and readout region during exposure is changed from the negative voltage into the positive voltage. Since there is still a multiplication relationship between the drain voltage of the carrier readout region and the number of incident photons, the multiplication operation substantially similar to that in the first scheme can still be realized by changing the voltage at the control gate and the voltage at the N-type substrate.

3) Scheme Using the Third Embodiment of the Photoelectric Computing Unit:

In the third scheme, the source-drain output current satisfies the following equation:

$$I_d = \frac{C_{ox} \mu W}{L}\left(V_G - V_T^{FG} - \frac{N_{elec} Q}{C_{CG}}\right) V_{DS} \quad (6\text{-}3\text{-}1)$$

where $N_{elec}$ is the number of photoelectrons collected in the charge coupled layer as the coupled region, and $V_{DS}$ is the drain voltage of the P-type substrate representing the carrier collection and readout region. Since there is inherently a multiplication relationship in the equation, the multiplication operation can be realized by using this relationship by modulating $N_{elec}$ and $V_{DS}$.

$N_{elec}$ represents the input quantity from the optical input terminal and is used as the first multiplier factor, $V_{DS}$ represents the input quantity from the electrical input terminal and is used as the second multiplier factor, and the voltage $V_G$ at the control gate as the carrier control region is added with a constant value. The output current $I_D$ of the readout region in the carrier collection and readout region is a result of the multiplication operation, that is, it is equivalent to perform the computation shown in the equation (6-3-2):

$$R = k(aX+b)Y \quad (6\text{-}3\text{-}2)$$

where a, b and k are all constants.

4) Scheme Using the Fourth Embodiment of the Photoelectric Computing Unit

In the fourth scheme, the source-drain output current satisfies the following equation:

$$I_d = \frac{C_{ox} \mu W}{L}(V_{d1} - KX_{photo} - V_T') V_{DS} \quad (6\text{-}4\text{-}1)$$

where $X_{photo}$ is the number of effective photons incident into the photoelectric computing unit, and $V_{d2}$ is the drain voltage of the readout transistor representing the carrier collection and readout region. Since there is inherently a multiplication relationship in the equation, the multiplication operation can be realized by using this relationship by modulating $X_{photo}$ and $V_{d2}$.

$X_{photo}$ represents the input quantity from the optical input terminal and is used as the first multiplier factor, $V_{d2}$ represents the input quantity from the electrical input terminal and is used as the second multiplier factor, and the drain voltage $V_{d1}$ of the reset transistor as the carrier control region is added with a constant value. The output current $I_D$ of the readout region in the carrier collection and readout region is a result of the multiplication operation, that is, it is equivalent to perform the computation shown in the equation (6-4-3):

$$R = k(aX+b)Y \quad (6\text{-}4\text{-}3)$$

where a, b and k are all constants.

Compared with the traditional multipliers, the use of this scheme for a multiplication operation has the following advantages:

1. The level of integration is high, and the multiplication operation can be realized by a single photoelectric computing unit, which is much advantageous over the conventional multipliers using tens of thousands of transistors.

2. The optical input data can be stored and can be saved in the device for a long period of time after light is cut off, so it is unnecessary to perform the optical input operation again for a next operation.

Schemes for the Second Multiplier

The present invention provides various specific implementations of photoelectric computation devices and photoelectric computing methods. The operation of multiplying two multiplier factors is realized by using one light emitting unit and one photoelectric computing unit described in the above embodiments. The greatest advantage of the schemes for the multiplier is that the electrical input terminal is changed to a serial input terminal for digital quantities and the computation accuracy is high. However, the disadvantage of the schemes is that the serial input/output of data will influence the computation speed and a control system is required to participate in the auxiliary operation.

The number of output terminals of this multiplier specifically depends on the number of output terminals of the used photoelectric computing unit. For example, if the photoelectric computing unit having two output terminals in the above embodiments is used, the multiplier has two output terminals too. In the following detailed description, it is defaulted to use a photoelectric computing unit having one output terminal.

Figure 24:
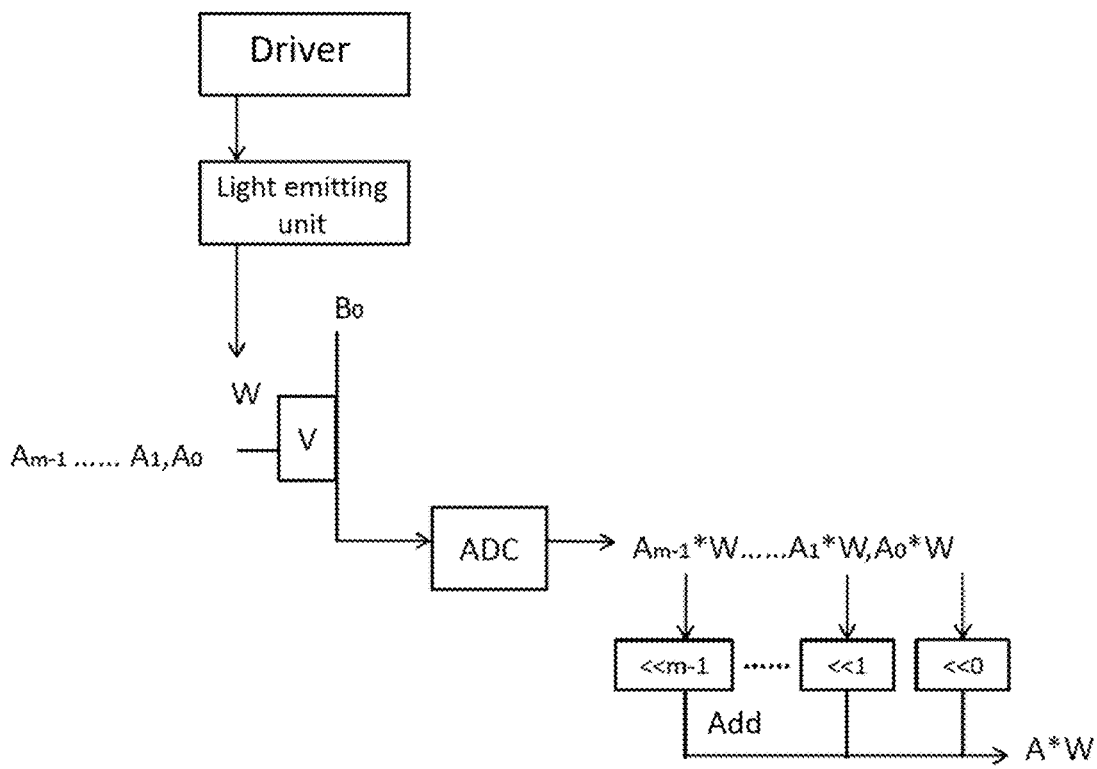
FIG. 24 shows a diagram of an example of a multiplier according to the present invention.

Scheme Using the First Embodiment of the Photoelectric Computing Unit:

By taking a multiplication operation A*W as an example, the computation is shown in FIG. 24, where the block marked with V represents the photoelectric computing unit using the first scheme, A is input from an electrical input terminal, and W is input from an optical input terminal.

Firstly, A is subjected to binary conversion in a control system:

$$A = A_0 A_1 A_2 \ldots A_{m-1} \quad (7\text{-}1\text{-}1)$$

where m depends on the bit width of the electrical input terminal data.

Then, by the control system, the binarized data of A are input serially and bitwise, in form of modulated voltage, into the control gate as the carrier control region.

In the first scheme, the source-drain output current satisfies the following equation:

$$I_d = \frac{C_2 \mu W}{L}\left(V_G - V_T^{FG} - \frac{X_{photon} t \eta q}{C_3}\right) V_{DS} \quad (7\text{-}1\text{-}2)$$

where $X_{photo}$ is the number of effective photons incident into the photoelectric computing unit, and $V_G$ is the voltage at the control gate. When the binarized data input by the control gate is 0, it is equivalent to input a voltage value that is enough to make the output current $I_D$ equal to 0 regardless of the optical input terminal data $X_{photo}$. When the binarized data input by the control gate is 1, it is equivalent to input a constant control gate voltage. Since there is no conducting channel in the MOSFET in the readout region when $V_G$ is 0, the current is 0, and the output result is 0, which conforms to the result of multiplication of the electrical input terminal data 0 and the optical input terminal data $X_{photo}$. When $V_G$ is equal to a voltage that is enough to generate a channel in the MOSFET in the readout region, and if $V_{DS}$ is also a constant value, the output result depends on only the optical input terminal data $X_{photo}$. The output result still conforms to the result of multiplication of the constant value 1 and the optical input terminal data $X_{photo}$.

$X_{photo}$ represents the input quantity from the optical input terminal and is used as the first multiplier factor, the serially input $V_G$ represents the input quantity from the electrical input terminal and is used as the binarized data of the second multiplier factor, and the source-drain voltage $V_{DS}$ of the P-type substrate as the carrier collection and readout region is a constant value. With the serial input of $V_G$, the output current $I_D$, which is serially output, of the readout region in the carrier collection and readout region is subjected to AD conversion, then input into the control system, and shifted and accumulated in the control system according to the bits input by the electrical input terminal to obtain a result of multiplication A*W. That is, it is equivalent to perform the computation shown in the equation (7-1-3):

$$R = kW(A_0*2^0 + A_1*2^1 + A_2*2^2 + \ldots A_m*2^{m-1} + a) \quad (7\text{-}1\text{-}3)$$

where a and k are constants. The control system may be a digital circuit, or may be various logic control units such as a computer, a single-chip microcomputer or an FPGA.

Scheme Using the Second Embodiment of the Photoelectric Computing Unit:

The second scheme differs most from the first scheme in that: the P-type substrate device is replaced with an N-type substrate device, so the voltage applied to the control gate as the carrier control region is changed from the positive voltage into the negative voltage, and the voltage applied to the N-type substrate as the carrier collection and readout region during exposure is changed from the negative voltage into the positive voltage. Since there is still a multiplication relationship between the binarized voltage output by the control gate as the carrier readout region and the number of incident photons, the multiplication operation substantially similar to that in the first scheme can still be realized by making few changes to the voltage at the control gate and the voltage at the N-type substrate.

Scheme Using the Third Embodiment of the Photoelectric Computing Unit:

By taking a multiplication operation A*W as an example, the computation is shown in FIG. 24, where the block marked with V represents the photoelectric computing unit using the third scheme, A is input from an electrical input terminal, and W is input from an optical input terminal.

Firstly, A is subjected to binary conversion in a control system:

$$A = A_0 A_1 A_2 \ldots A_{m-1} \quad (7\text{-}3\text{-}1)$$

where m depends on the bit width of the electrical input terminal data.

Then, by the control system, the binarized data of A and the n pieces of binarized data are input serially and bitwise, in form of modulated voltage, into the control gate as the carrier control region.

In the third scheme, the source-drain output current satisfies the following equation:

$$I_d = \frac{C_{ox} \mu W}{L}\left(V_G - V_T^{FG} - \frac{N_{elec} Q}{C_{CG}}\right) V_{DS} \quad (7\text{-}3\text{-}2)$$

where $N_{elec}$ is the number of photoelectrons entering the charge coupled layer, and $V_G$ is the voltage at the control gate. When the binarized data input by the control gate is 0, it is equivalent to input a voltage value that is enough to make the output current $I_D$ equal to 0 regardless of the optical input terminal data $N_{elec}$. When the binarized data input by the control gate is 1, it is equivalent to input a constant control gate voltage. Since there is no conducting channel in the floating gate MOSFET when $V_G$ is 0, the current is 0, and the output result is 0, which conforms to the result of multiplication of the electrical input terminal data 0 and the optical input terminal data $N_{elec}$. When $V_G$ is equal to a voltage that is enough to generate a channel in the floating gate MOSFET, and if $V_{DS}$ is also a constant value, the output result depends on only the optical input terminal data $N_{elec}$. The output result still conforms to the result of multiplication of the constant value 1 and the optical input terminal data $N_{elec}$.

$N_{elec}$ represents the input quantity from the optical input terminal and is used as the first multiplier factor, the serially input $V_G$ represents the input quantity from the electrical input terminal and is used as the binarized data of the second multiplier factor, and the source-drain voltage $V_{DS}$ of the P-type substrate as the carrier collection and readout region is a constant value. With the serial input of $V_G$, the serially output current $I_D$ of the readout region in the carrier collection and readout region is subjected to AD conversion, then input into the control system, and shifted and accumulated in the control system according to the bits input by the electrical input terminal to obtain the result of multiplication A*W. That is, it is equivalent to perform the computation shown in the equation (7-3-3):

$$R = kW(A_0 * 2^0 + A_1 * 2^1 + A_2 * 2^2 + \ldots + A_m * 2^{m-1} a) \tag{7-3-3}$$

where a and k are constants. The control system may be a digital circuit, or may be various logic control units such as a computer, a single-chip microcomputer or an FPGA.

Scheme Using the Fourth Embodiment of the Photoelectric Computing Unit

By taking a multiplication operation A*W as an example, the computation is shown in FIG. 24, where the block marked with V represents the photoelectric computing unit using the fourth scheme, A is input from an electrical input terminal, and W is input from an optical input terminal.

Firstly, A is subjected to binary conversion in a control system:

$$A = A_0 A_1 A_2 \ldots A_{m-1} \tag{7-4-1}$$

where m depends on the bit width of the electrical input terminal data.

Then, by the control system, the binarized data of A and the n pieces of binarized data are input serially and bitwise, in form of modulated voltage, into the drain of the reset transistor as the carrier control region.

In the fourth scheme, the source-drain output current satisfies the following equation:

$$I_d = \frac{C_{ox} \mu W}{L}(V_{d1} - K X_{photo} - V_T') V_{d2} \tag{7-4-2}$$

where $X_{photo}$ is the number of photoelectrons collected in the photodiode as the readout region in the photoelectron collection region and readout region, and $V_{d1}$ is the voltage at the control gate. When the binarized data input by the control gate is 0, it is equivalent to input a voltage value that is enough to make the output current $I_D$ equal to 0 regardless of the optical input terminal data $X_{photo}$. When the binarized data input by the control gate is 1, it is equivalent to input a constant control gate voltage. Since there is no conducting channel in the readout transistor when $V_{d1}$ is 0, the current is 0, and the output result is 0, which conforms to the result of multiplication of the electrical input terminal data 0 and the optical input terminal data $X_{photo}$. When $V_{d1}$ is equal to a voltage that is enough to generate a channel in the readout transistor, and if $V_{d2}$ is also a constant value, the output result depends on only the optical input terminal data $X_{photo}$. The output result still conforms to the result of multiplication of the constant value 1 and the optical input terminal data $X_{photo}$.

$X_{photo}$ represents the input quantity from the optical input terminal and is used as the first multiplier factor, the serially input $V_{d1}$ represents the input quantity from the electrical input terminal and is used as the binarized data of the second multiplier factor, and the drain voltage $V_{d2}$ of the readout transistor representing the readout region in the carrier collection and readout region is a constant value. With the serial input of $V_{d1}$, the output current $I_D$, which is serially output, of the readout region in the carrier collection and readout region is subjected to AD conversion, then input into the control system, and shifted and accumulated in the control system according to the bits input by the electrical input terminal to obtain a result of multiplication A*W. That is, it is equivalent to perform the computation shown in the equation (7-4-3):

$$R = kW(A_0 * 2^0 + A_1 * 2^1 + A_2 * 2^2 + \ldots + A_m * 2^{m-1} + a) \tag{7-4-3}$$

where a and k are constants. The control system may be a digital circuit, or may be various logic control units such as a computer, a single-chip microcomputer or an FPGA.

Compared with the traditional multipliers, the use of this scheme for a multiplication operation has the following advantages:

The level of integration is high, and the multiplication operation can be realized by a single photoelectric computing unit, which is much advantageous over the conventional multipliers using tens of thousands of transistors.

The optical input data can be stored and can be saved in the device for a long period of time after light is cut off, so it is unnecessary to perform the optical input operation again for a next operation.

Schemes for the Third Multiplier

The present invention provides various specific implementations of photoelectric computation devices and photoelectric computing methods. The operation of multiplying two multiplier factors is realized by using at least two light emitting units and at least two photoelectric computing units described in the above embodiments. The greatest advantage of the schemes for the multiplier is that the electrical input terminal is changed to a parallel input terminal for digital quantities, the computation accuracy is high and the operation speed is higher than that of the second multiplier. The disadvantage of the schemes is that the parallel input of data requires more photoelectric computing units and a control system is required to participate in the auxiliary operation.

The number of output terminals of this multiplier specifically depends on the number of output terminals of the used photoelectric computing unit. For example, if the photoelectric computing unit having two output terminals in the above embodiments is used, the multiplier has two output terminals too. In the following detailed description, it is defaulted to use a photoelectric computing unit having one output terminal.

Figure 25:
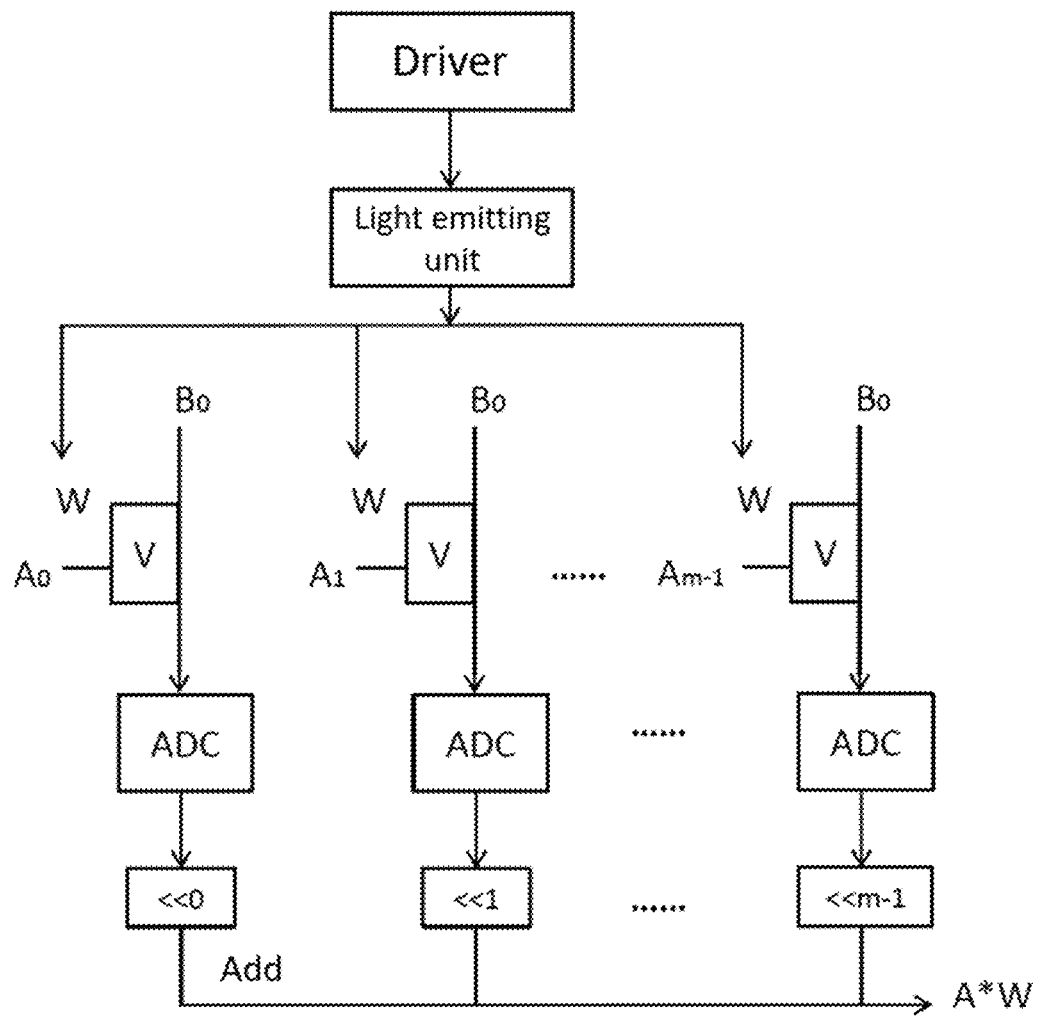
FIG. 25 shows a diagram of an example of a multiplier according to the present invention.

1) Scheme Using the First Embodiment of the Photoelectric Computing Unit:

By taking a multiplication operation A*W as an example, the computation is shown in FIG. 25, where one block marked with V represents one photoelectric computing unit using the first scheme, A is input from an electrical input terminal, and W is input from an optical input terminal.

Firstly, A is subjected to binary conversion in a control system:

$$A = A_0 A_1 A_2 \ldots A_{m-1} \qquad (8\text{-}1\text{-}1)$$

where m is equivalent to the number of the used units and depends on the bit width of the electrical input terminal data.

Then, by the control system, the binarized data of A and the m pieces of binarized data are input in parallel and bitwise, in form of modulated voltage, into the control gates of m units which are used as the carrier control regions.

In the first scheme, the source-drain output current satisfies the following equation:

$$I_d = \frac{C_2 \mu W}{L}\left(V_G - V_T^{FG} - \frac{X_{photon} \eta q}{C_3}\right) V_{DS} \qquad (8\text{-}1\text{-}2)$$

where $X_{photo}$ is the number of effective photons incident into the photoelectric computing unit, and $V_G$ is the voltage at the control gate. When the binarized data input by the control gate is 0, it is equivalent to input a voltage value that is enough to make the output current $I_D$ equal to 0 regardless of the optical input terminal data $X_{photo}$. When the binarized data input by the control gate is 1, it is equivalent to input a constant control gate voltage. Since there is no conducting channel in the MOSFET in the readout region when $V_G$ is 0, the current is 0, and the output result is 0, which conforms to the result of multiplication of the electrical input terminal data 0 and the optical input terminal data $X_{photo}$. When $V_G$ is equal to a voltage that is enough to generate a channel in the MOSFET in the readout region, and if $V_{DS}$ is also a constant value, the output result depends on only the optical input terminal data $X_{photo}$. The output result still conforms to the result of multiplication of the constant value 1 and the optical input terminal data $X_{photo}$.

$X_{photo}$ represents the input quantity from the optical input terminal and is used as the first multiplier factor, $V_G$, which is input in parallel, represents the input quantity from the electrical input terminal and is used as the binarized data of the second multiplier factor, and the source-drain voltage $V_{DS}$ of the P-type substrate as the carrier collection and readout region is a constant value. With the parallel input of $V_G$, the output current $I_D$, which is output in parallel, of the readout region in the carrier collection and readout region is subjected to AD conversion, then input into the control system, and shifted and accumulated in the control system according to the bits input by the electrical input terminal to obtain a result of multiplication A*W. That is, it is equivalent to perform the computation shown in the equation (8-1-3):

$$R = kW(A_0 * 2^0 + A_1 * 2^1 A_2 * 2^2 + \ldots + A_m * 2^{m-1} + a) \qquad (8\text{-}1\text{-}3)$$

where a and k are constants. The control system may be a digital circuit, or may be various logic control units such as a computer, a single-chip microcomputer or an FPGA.

2) Scheme Using the Second Embodiment of the Photoelectric Computing Unit:

The second scheme differs most from the first scheme in that: the P-type substrate device is replaced with an N-type substrate device, so the voltage applied to the control gate as the carrier control region is changed from the positive voltage into the negative voltage, and the voltage applied to the N-type substrate as the carrier collection and readout region during exposure is changed from the negative voltage into the positive voltage. Since there is still a multiplication relationship between the binarized voltage output by the control gate as the carrier readout region and the number of incident photons, the multiplication operation substantially similar to that in the first scheme can still be realized by making few changes to the voltage at the control gate and the voltage at the N-type substrate.

3) Scheme Using the Third Embodiment of the Photoelectric Computing Unit:

By taking a multiplication operation A*W as an example, the computation is shown in FIG. 25, where one block marked with V represents one photoelectric computing unit using the third scheme, A is input from an electrical input terminal, and W is input from an optical input terminal.

Firstly, A is subjected to binary conversion in a control system:

$$A = A_0 A_1 A_2 \ldots A_{m-1} \qquad (8\text{-}34)$$

where m is equivalent to the number of the used units and depends on the bit width of the electrical input terminal data.

Then, by the control system, the binarized data of A and the m pieces of binarized data are input in parallel and bitwise, in form of modulated voltage, into the control gates as the carrier control regions of m units.

In the third scheme, the source-drain output current satisfies the following equation:

$$I_d = \frac{C_{ox} \mu W}{L}\left(V_G - V_T^{FG} - \frac{N_{elec} Q}{C_{CG}}\right) V_{DS} \qquad (8\text{-}3\text{-}2)$$

where $N_{elec}$ is the number of photoelectrons entering the charge coupled layer, and $V_G$ is the voltage at the control gate. When the binarized data input by the control gate is 0, it is equivalent to input a voltage value that is enough to make the output current $I_D$ equal to 0 regardless of the optical input terminal data $N_{elec}$. When the binarized data input by the control gate is 1, it is equivalent to input a constant control gate voltage. Since there is no conducting channel in the floating gate MOSFET when $V_G$ is 0, the current is 0, and the output result is 0, which conforms to the result of multiplication of the electrical input terminal data 0 and the optical input terminal data $N_{elec}$. When $V_G$ is equal to a voltage that is enough to generate a channel in the floating gate MOSFET, and if $V_{DS}$ is also a constant value, the output result depends on only the optical input terminal data $N_{elec}$. The output result still conforms to the result of multiplication of the constant value 1 and the optical input terminal data $N_{elec}$.

$N_{elec}$ represents the input quantity from the optical input terminal and is used as the first multiplier factor, $V_G$, which is input in parallel, represents the input quantity from the electrical input terminal and is used as the binarized data of the second multiplier factor, and the source-drain voltage $V_{DS}$ of the P-type substrate as the carrier collection and readout region is a constant value. With the parallel input of $V_G$, the output current $I_D$, which is output in parallel, of the readout region in the carrier collection and readout region is subjected to AD conversion, then input into the control system, and shifted and accumulated in the control system according to the bits input by the electrical input terminal to obtain a result of multiplication A*W. That is, it is equivalent to perform the computation shown in the equation (8-3-3):

$$R = kW(A_0 * 2^0 + A_1 * 2^1 * A_2 * 2^2 + \ldots + A_m * 2^{m-1} + a) \qquad (8\text{-}3\text{-}3)$$

where a and k are constants. The control system may be a digital circuit, or may be various logic control units such as a computer, a single-chip microcomputer or an FPGA.

4) Scheme Using the Fourth Embodiment of the Photoelectric Computing Unit

By taking a multiplication operation A*W as an example, the computation is shown in FIG. 25, where one block marked with V represents one photoelectric computing unit using the fourth scheme, A is input from an electrical input terminal, and W is input from an optical input terminal.

Firstly, A is subjected to binary conversion in a control system:

$$A = A_0 A_1 A_2 \ldots A_{m-1} \tag{8-4-1}$$

where m is equivalent to the number of the used units and depends on the bit width of the electrical input terminal data.

Then, by the control system, the binarized data of A and the m pieces of binarized data are input in parallel and bitwise, in form of modulated voltage, into the drains of the reset transistors as the carrier control regions of m units.

In the fourth scheme, the source-drain output current satisfies the following equation:

$$I_d = \frac{C_{ox}\mu W}{L}(V_{d1} - KX_{photo} - V_T')V_{d2} \tag{8-4-2}$$

where $X_{photo}$ is the number of photoelectrons collected in the photodiode as the readout region in the photoelectron collection region and readout region, and $V_{d1}$ is the voltage at the control gate. When the binarized data input by the control gate is 0, it is equivalent to input a voltage value that is enough to make the output current $I_D$ equal to 0 regardless of the optical input terminal data $X_{photo}$. When the binarized data input by the control gate is 1, it is equivalent to input a constant control gate voltage. Since there is no conducting channel in the readout transistor when $V_{d1}$ is 0, the current is 0, and the output result is 0, which conforms to the result of multiplication of the electrical input terminal data 0 and the optical input terminal data $X_{photo}$. When $V_{d1}$ is equal to a voltage that is enough to generate a channel in the readout transistor, and if $V_{d2}$ is also a constant value, the output result depends on only the optical input terminal data $X_{photo}$. The output result still conforms to the result of multiplication of the constant value 1 and the optical input terminal data $X_{photo}$.

$X_{photo}$ represents the input quantity from the optical input terminal and is used as the first multiplier factor, $V_{d1}$, which is input in parallel, represents the input quantity from the electrical input terminal and is used as the binarized data of the second multiplier factor, and the drain voltage $V_{d2}$ of the readout region in the carrier collection and readout region is a constant value. With the parallel input of $V_{d1}$, the output current $I_D$, which is output in parallel, of the readout region in the carrier collection and readout region is subjected to AD conversion, then input into the control system, and shifted and accumulated in the control system according to the bits input by the electrical input terminal to obtain a result of multiplication A*W. That is, it is equivalent to perform the computation shown in the equation (8-4-3):

$$R = kW(A_0*2^0 + A_1*2^1 + A_2*2^2 + \ldots + A_m*2^{m-1} + a) \tag{8-4-3}$$

where a and k are constants. The control system may be a digital circuit, or may be various logic control units such as a computer, a single-chip microcomputer or an FPGA.

Compared with the traditional multipliers, the use of this scheme for a multiplication operation has the following advantages:

1. The level of integration is high, and the multiplication operation can be realized by a few photoelectric computing units, which is much advantageous over the conventional multipliers using tens of thousands of transistors.
2. The optical input data can be stored and can be saved in the device for a long period of time after light is cut off, so it is unnecessary to perform the optical input operation again for a next operation.

Schemes for the Fourth Multiplier

The present invention provides various specific implementations of photoelectric computation devices and photoelectric computing methods. The operation of multiplying two multiplier factors is realized by using at least two light emitting units and at least two photoelectric computing units described in the above embodiments. The greatest advantage of the schemes for the multiplier is that the participation of bit weights in the operation is realized and no control system is required for the auxiliary computation compared with the schemes for the second and third multipliers. However, the disadvantage of the schemes is that it is essentially the multiplication of dual analog inputs and the accuracy is lower than that of the schemes for the second and third multipliers.

The number of output terminals of this multiplier specifically depends on the number of output terminals of the used photoelectric computing unit. For example, if the photoelectric computing unit having two output terminals in the above embodiments is used, the multiplier has two output terminals too. In the following detailed description, it is defaulted to use a photoelectric computing unit having one output terminal.

Figure 26:
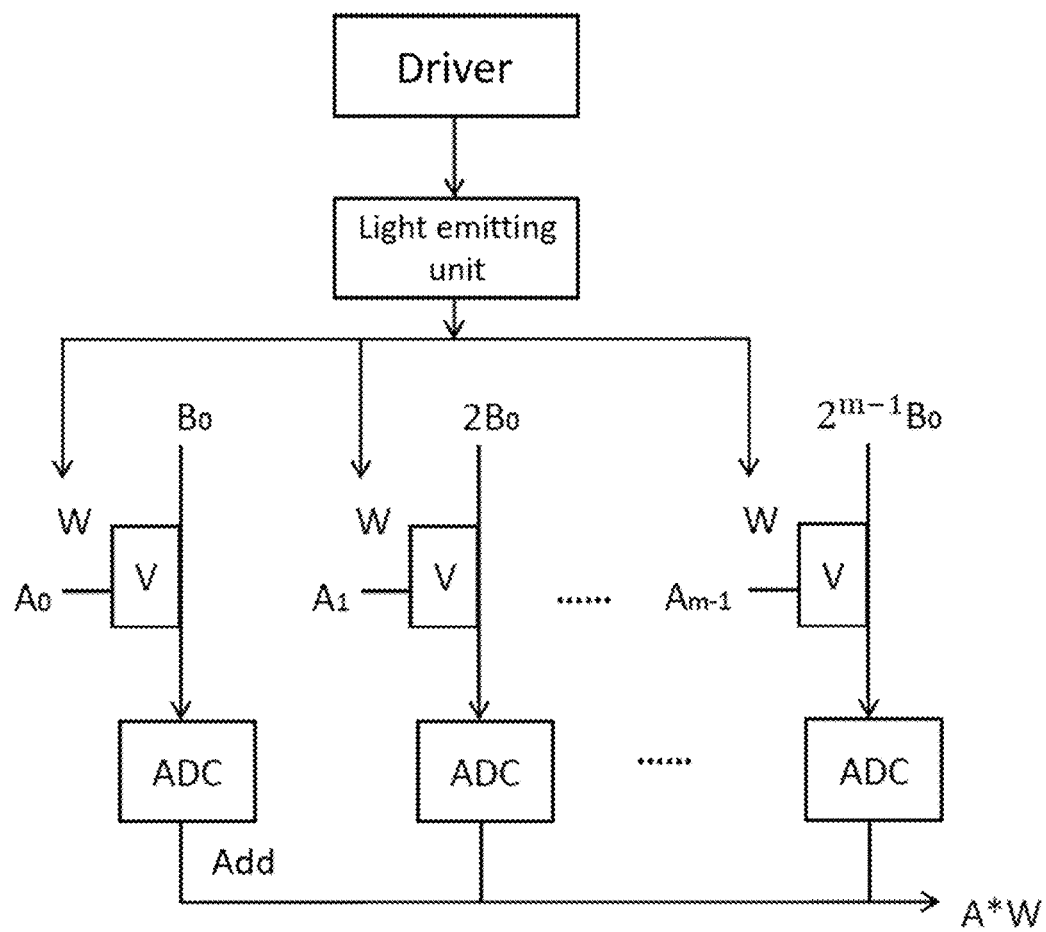
FIG. 26 shows a diagram of an example of a multiplier according to the present invention.

Scheme Using the First Embodiment of the Photoelectric Computing Unit:

By taking a multiplication operation A*W as an example, the computation is shown in FIG. 26, where one block marked with V represents one photoelectric computing unit using the first scheme, A is input from an electrical input terminal, and W is input from an optical input terminal.

Firstly, A is subjected to binary conversion in a control system:

$$A = A_0 A_1 A_2 \ldots A_{m-1} \tag{9-1-1}$$

where m is equivalent to the number of the used units and depends on the bit width of the electrical input terminal data.

Then, by the control system, the binarized data of A and the m pieces of binarized data are input in parallel and bitwise, in form of modulated voltage, into the control gates as the carrier control regions of m units.

In the first scheme, the source-drain output current satisfies the following equation:

$$I_d = \frac{C_2 \mu W}{L}\left(V_G - V_T^{FG} - \frac{X_{photon} t \eta q}{C_3}\right)V_{DS} \tag{9-1-2}$$

where $X_{photo}$ is the number of effective photons incident into the photoelectric computing unit, $V_G$ is the voltage at the control gate, and $V_{DS}$ is the source-drain voltage of the P-type substrate as the carrier control and readout region. When the binarized data input by the control gate is 0, it is equivalent to input a voltage value that is enough to make the output current $I_D$ equal to 0 regardless of the optical input terminal data $X_{photo}$. When the binarized data input by the control gate is 1, it is equivalent to input a constant control gate voltage. Since there is no conducting channel in the MOSFET in the readout region when $V_G$ is 0, the current is 0, and the output result is 0, which conforms to the result of multiplication of the electrical input terminal data 0 and the optical input terminal data $X_{photo}$. When $V_G$ is equal to a voltage that is enough to generate a channel in the MOSFET in the readout region, and if $V_{DS}$ is also a constant value, the output result depends on only the optical input terminal data $X_{photo}$. The output result still conforms to the result of multiplication of the constant value 1 and the optical input terminal data $X_{photo}$.

Meanwhile, since there is inherently a multiplication relationship among $V_{DS}$, $V_G$ and $X_{photo}$ in the equation (9-1-2), inputting, between the source and drain of the P-type substrate, bit weights $2^0, 2^1, 2^2 \ldots 2^{m-1}$ corresponding to the corresponding bits of the binarized data input in parallel at the control gate is equivalent to perform shifting. Then, the add-up operation is completed directly by current convergence. Thus, one complete multiplication operation can be completed without any control system.

$X_{photo}$ represents the input quantity from the optical input terminal and is used as the first multiplier factor, $V_G$, which is input in parallel, represents the input quantity from the electrical input terminal and is used as the binarized data of the second multiplier factor, and the source-drain voltage $V_{DS}$ of the P-type substrate as the carrier collection and readout region is a modulated voltage equivalent to the bit weight of the corresponding bit of the binarized data. With the parallel input of $V_G$, the output current $I_D$, which is output in parallel, of the readout region in the carrier collection and readout region is converged, accumulated, subjected to AD conversion and input into the control system to obtain a result of multiplication A*W. That is, it is equivalent to perform the computation shown in the equation (9-1-3):

$$R=kW(A_0*2^0+A_1*2^1+A_2*2^2+\ldots+A_m*2^{m-1}a) \quad (9\text{-}1\text{-}3)$$

where a and k are constants. The control system may be a digital circuit, or may be various logic control units such as a computer, a single-chip microcomputer or an FPGA.

2) Scheme Using the Second Embodiment of the Photoelectric Computing Unit:

The second scheme differs most from the first scheme in that: the P-type substrate device is replaced with an N-type substrate device, so the voltage applied to the control gate as the carrier control region is changed from the positive voltage into the negative voltage, and the voltage applied to the N-type substrate as the carrier collection and readout region during exposure is changed from the negative voltage into the positive voltage. Since there is still a multiplication relationship between the binarized voltage output by the control gate as the carrier readout region and the number of incident photons, the multiplication operation substantially similar to that in the first scheme can still be realized by making few changes to the voltage at the control gate and the voltage at the N-type substrate.

3) Scheme Using the Third Embodiment of the Photoelectric Computing Unit:

By taking a multiplication operation A*W as an example, the computation is shown in FIG. 26, where one block marked with V represents one photoelectric computing unit using the third scheme, A is input from an electrical input terminal, and W is input from an optical input terminal.

Firstly, A is subjected to binary conversion in a control system:

$$A=A_0A_1A_2\ldots A_{m-1} \quad (9\text{-}3\text{-}1)$$

where m is equivalent to the number of the used units and depends on the bit width of the electrical input terminal data.

Then, by the control system, the binarized data of A and the m pieces of binarized data are input in parallel and bitwise, in form of modulated voltage, into the control gates as the carrier control regions of m units.

In the third scheme, the source-drain output current satisfies the following equation:

$$I_d = \frac{C_{ox}\mu W}{L}\left(V_G - V_T^{FG} - \frac{N_{elec}Q}{C_{CG}}\right)V_{DS} \quad (9\text{-}3\text{-}2)$$

where $N_{elec}$ is the number of photoelectrons entering the charge coupled layer, and $V_G$ is the voltage at the control gate. When the binarized data input by the control gate is 0, it is equivalent to input a voltage value that is enough to make the output current $I_D$ equal to 0 regardless of the optical input terminal data $N_{elec}$. When the binarized data input by the control gate is 1, it is equivalent to input a constant control gate voltage. Since there is no conducting channel in the floating gate MOSFET when $V_G$ is 0, the current is 0, and the output result is 0, which conforms to the result of multiplication of the electrical input terminal data 0 and the optical input terminal data $N_{elec}$. When $V_G$ is equal to a voltage that is enough to generate a channel in the floating gate MOSFET, and if $V_{DS}$ is also a constant value, the output result depends on only the optical input terminal data $N_{elec}$. The output result still conforms to the result of multiplication of the constant value 1 and the optical input terminal data $N_{elec}$.

Meanwhile, since there is inherently a multiplication relationship among $V_{DS}$, $V_G$ and $N_{elec}$ in the equation (9-3-2), inputting, between the source and drain of the P-type substrate, bit weights $2^0, 2^1, 2^2 \ldots 2^{m-1}$ corresponding to the corresponding bits of the binarized data input in parallel at the control gate is equivalent to perform shifting. Then, the add-up operation is completed directly by current convergence. Thus, one complete multiplication operation can be completed without any control system.

$N_{elec}$ represents the input quantity from the optical input terminal and is used as the first multiplier factor, $V_G$, which is input in parallel, represents the input quantity from the electrical input terminal and is used as the binarized data of the second multiplier factor, and the source-drain voltage $V_{DS}$ of the P-type substrate as the carrier collection and readout region is a modulated voltage equivalent to the bit weight of the corresponding bit of the binarized data. With the parallel input of $V_G$, the output current $I_D$, which is output in parallel, of the readout region in the carrier collection and readout region is converged, accumulated, subjected to AD conversion and input into the control system to obtain a result of multiplication A*W. That is, it is equivalent to perform the computation shown in the equation (9-3-3):

$$R=kW(A_0*2^0+A_1*2^1+A_2*2^2+\ldots+A_m*2^{m-1}+a) \quad (9\text{-}3\text{-}3)$$

where a and k are constants. The control system may be a digital circuit, or may be various logic control units such as a computer, a single-chip microcomputer or an FPGA.

4) Scheme Using the Fourth Embodiment of the Photoelectric Computing Unit:

By taking a multiplication operation A*W as an example, the computation is shown in FIG. 26, where one block marked with V represents one photoelectric computing unit used in the fourth scheme, A is input from an electrical input terminal, and W is input from an optical input terminal.

Firstly, A is subjected to binary conversion in a control system:

$$A=A_0A_1A_2\ldots A_{m-1} \quad (9\text{-}4\text{-}1)$$

where m is equivalent to the number of the used units and depends on the bit width of the electrical input terminal data.

Then, by the control system, the binarized data of A and the m pieces of binarized data are input in parallel and bitwise, in form of modulated voltage, into the drains of the reset transistors as the carrier control regions of m units.

In the fourth scheme, the source-drain output current satisfies the following equation:

$$I_d = \frac{C_{ox}\mu W}{L}(V_{d1} - KX_{photo} - V'_T)V_{d2} \qquad (9\text{-}4\text{-}2)$$

where $X_{photo}$ is the number of photoelectrons collected in the photodiode as the readout region in the photoelectron collection region and readout region, and $V_{d1}$ is the voltage at the control gate. When the binarized data input by the control gate is 0, it is equivalent to input a voltage value that is enough to make the output current $I_D$ equal to 0 regardless of the optical input terminal data $X_{photo}$. When the binarized data input by the control gate is 1, it is equivalent to input a constant control gate voltage. Since there is no conducting channel in the readout transistor when $V_d1$ is 0, the current is 0, and the output result is 0, which conforms to the result of multiplication of the electrical input terminal data 0 and the optical input terminal data $X_{photo}$. When $V_{d1}$ is equal to a voltage that is enough to generate a channel in the readout transistor, and if $V_{d2}$ is also a constant value, the output result depends on only the optical input terminal data $X_{photo}$. The output result still conforms to the result of multiplication of the constant value 1 and the optical input terminal data $X_{photo}$.

Meanwhile, since there is inherently a multiplication relationship among $V_{DS}$, $V_G$ and $X_{photo}$ in the equation (9-4-2), inputting, at the drain of the readout transistor, bit weights $2^0, 2^1, 2^2 \ldots 2^{m-1}$ corresponding to the corresponding bits of the binarized data input in parallel at the control gate is equivalent to perform shifting. Then, the add-up operation is completed directly by current convergence. Thus, one complete multiplication operation can be completed without any control system.

$X_{photo}$ represents the input quantity from the optical input terminal and is used as the first multiplier factor, $V_{d1}$, which is input in parallel, represents the input quantity from the electrical input terminal and is used as the binarized data of the second multiplier factor, and the drain voltage $V_{d2}$ of the readout transistor as the readout region in the carrier collection and readout region is a modulated voltage equivalent to the bit weight of the corresponding bit of the binarized data. With the parallel input of $V_{d1}$, the output current $I_D$, which is output in parallel, of the readout region in the carrier collection and readout region is converged, accumulated, subjected to AD conversion and input into the control system to obtain the result of multiplication A*W. That is, it is equivalent to perform the computation shown in the equation (9-4-3):

$$R=kW(A_0*2^0+A_1*2^1+A_2*2^2+\ldots+A_m*2^{m-1}+a) \qquad (9\text{-}4\text{-}3)$$

where a and k are constants. The control system may be a digital circuit, or may be various logic control units such as a computer, a single-chip microcomputer or an FPGA.

Compared with the traditional multipliers, the use of this scheme for a multiplication operation has the following advantages:

1. The level of integration is high, and the multiplication operation can be realized by a few photoelectric computing units, which is much advantageous over the conventional multipliers using tens of thousands of transistors.
2. The optical input data can be stored and can be saved in the device for a long period of time after light is cut off, so it is unnecessary to perform the optical input operation again for a next operation.

Schemes for a Vector Adder (Corresponding to Claims 23 and 24)

The present invention provides various specific implementations of photoelectric computation devices and photoelectric computing methods. The vector addition operation of adding at least two vectors each having at least two dimensions is realized by using a plurality of photoelectric computation adders selected from one of the first, second and third adders.

1) Scheme Using the First Adder

For the first adder, it is equivalent to perform the following operation:

$$R=d(aX+bY+c) \qquad (10\text{-}1\text{-}1)$$

where R is the result of the addition operation, $X_{photo}$ is the input quantity from the optical input terminal, Y is the input quantity from the electrical input terminal, and d, a, b and c are all constants related to the parameters of the unit.

Vector addition is to add, one by one, elements having corresponding serial numbers in two vectors to be added having the same dimensions to obtain a result vector having a same dimension as the vectors to be added. By taking an operation A+B of adding two vectors to be added having k dimensions as an example:

$$R=A+B=(A_0+B_0, A_1+B_1, \ldots A_{k-1}+B_{k-1}) \qquad (10\text{-}1\text{-}2)$$

Figure 27:
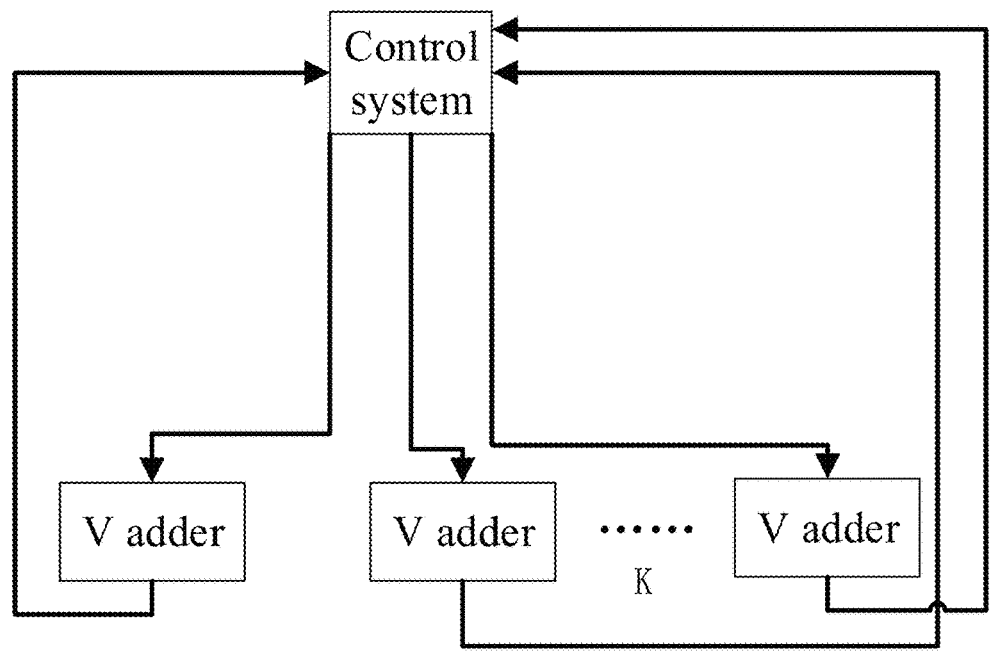
FIG. 27 shows a diagram of an example of a vector adder according to the present invention.

It can be known from the equation (10-1-2) that the vector addition operation can be split into k separate operations of adding two addends. Thus, the vector adder can be formed by k first adders, as shown in FIG. 27, where each block marked with "V adder" represents one separate first adder.

The vectors to be added are input into a control system and then split into independent elements in the control system, and the elements having a same serial number are input into a same adder as two addends of the same adder. After the addition operation is completed, the result of operation is returned to the control system and combined according to the serial numbers of the elements to obtain a result vector. Thus, the complete vector addition operation is completed. Since the first adder supports the input of only two addends, the vector adder in this scheme supports the input of only two vectors to be added. The control system may be a digital circuit, or may be various logic control units such as a computer, a single-chip microcomputer or an FPGA.

2) Scheme Using the Second Adder

For the second adder, it is equivalent to perform the following operation:

$$R=b(aX+k_1Y_1+k_2Y_2 \ldots k_nY_n+c) \qquad (10\text{-}2\text{-}1)$$

where R is the result of the addition operation, $X_{photo}$ is the input quantity from the optical input terminal, $Y_1$ to $Y_n$ are input quantities from the electrical input terminals of a plurality of carrier control regions, and b, a, c and $k_1$ to $k_n$ are all constants related to the parameters of the adder unit.

Vector addition is to add, one by one, elements having corresponding serial numbers in two vectors to be added having the same dimensions to obtain a result vector having a same dimension as the vectors to be added. By taking an addition operation $A_1+A_2 \ldots +A_n$ of n vectors to be added, each of which has m dimensions, as an example:

$$R=A_1+A_2 \ldots A_n=(A_{10}A_{20} \ldots +A_{n0}, \ldots ,A_{1m}+ A_{2m}, \ldots +A_{nm}) \quad (10\text{-}2\text{-}2)$$

It can be known from the equation (10-2-2) that the operation of adding n vectors can be split into m separate operations of adding n addends. Thus, the vector adder can be formed by n second adders, as shown in FIG. 27, where each block marked with "V adder" represents one separate second adder.

The vectors to be added are input into a control system and then split into independent elements in the control system, and the elements having a same serial number are input into a same adder as two addends of the same adder. After the addition operation is completed, the result of operation is returned to the control system and combined according to the serial numbers of the elements to obtain a result vector. Thus, the complete vector addition operation is completed. The control system may be a digital circuit, or may be various logic control units such as a computer, a single-chip microcomputer or an FPGA.

3) Scheme Using the Third Adder

For the third adder, it is equivalent to perform the following operation:

$$R=k(aX_1+aX_2 \ldots +aX_n+c) \quad (10\text{-}3\text{-}1)$$

where R is the result of the addition operation, $X_1$ to $X_n$ are input quantities from the optical input terminals of a plurality of separate photoelectric computing units, n is equivalent to the number of the used photoelectric computing units connected in parallel, and a, c and k are all constants related to the parameters of the adder unit.

Like the second adder, the third adder can perform an operation of adding more than two addends. Therefore, the scheme for the vector adder formed by the third adders is similar to the scheme for the vector adder formed by the second adders, and will not be repeated here.

Compared with the traditional vector adders, the use of this scheme for a vector addition operation has the following advantages:

1. The level of integration is high, and the vector addition operation can be realized by a few photoelectric computing units.
2. The input data can be stored and can be saved in the device for a long period of time after light is cut off, so it is unnecessary to perform the optical input operation again for a next operation.

Schemes for a Vector Dot Multiplier

The present invention provides various specific implementations of photoelectric computation devices and photoelectric computing methods. A vector dot multiplication operation of multiplying two vectors each having at least two dimensions is realized by using photoelectric computation multipliers selected from one of the multipliers described above.

1) Scheme Using the First Multiplier

For the first multiplier, it is equivalent to perform the following operation:

$$R=c(aX+b)Y \quad (11\text{-}1\text{-}1)$$

where R is the result of the multiplication operation, X is the input quantity from the optical input terminal, Y is the input quantity from the electrical input terminal, and c, a and b are all constants related to the parameters of the unit.

Vector dot multiplication is to multiply, one by one, elements having corresponding serial numbers in two vectors to be multiplied having the same dimensions to obtain a result vector having a same dimension as the vectors to be multiplied. By taking an operation A·B of multiplying two vectors to be multiplied having k dimensions as an example:

$$R=A\cdot B=(A_0*B_0,A_1*B_1 \ldots A_{k-1}*B_{k-1}) \quad (11\text{-}1\text{-}2)$$

It can be known from the equation (11-1-2) that the vector dot multiplication operation can be split into k separate multiplication operations of multiplying two multiplier factors. Thus, the vector dot multiplier can be formed by k first multipliers. The vector dot multiplication operation can be realized simply by replacing each block marked with "V adder" in the vector adder shown in FIG. 27 with a block marked with "V multiplier", each block representing one separate first multiplier.

The vectors to be multiplied are input into a control system and then split into independent elements in the control system, and the elements having a same serial number are input into a same multiplier as two multiplier factors of the same multiplier. After the multiplication operation is completed, the result of operation is returned to the control system and combined according to the serial numbers of the elements to obtain a result vector. Thus, the complete vector dot multiplication operation is completed. Since the first multiplier supports only the input of two multiplier factors, the vector dot multiplier in this scheme supports only the input of two vectors to be dot multiplied. If it is necessary to perform a dot multiplication operation of multiplying a plurality of input vectors to be multiplied, it is only required to perform multiple dot multiplication operations of multiplying the vectors to be multiplied in pairs. The control system may be a digital circuit, or may be various logic control units such as a computer, a single-chip microcomputer or an FPGA.

Schemes using the Second, Third and Fourth Multipliers:

Like the first multiplier, the second, third and fourth multipliers support a multiplication operation of two input multiplier factors. Therefore, the schemes for the vector dot multipliers formed by the three kinds of multipliers are similar to the scheme using the vector dot multiplier formed by the first multiplier, and will not be repeated here.

Compared with the traditional vector dot multipliers, the use of this scheme for a vector dot multiplication operation has the following advantages:

1. The level of integration is high, and the vector dot multiplication operation can be realized by a few photoelectric computing units.
2. The optical input data can be stored and can be saved in the device for a long period of time after light is cut off, so it is unnecessary to perform the optical input operation again for a next operation.

Schemes for a High-Bit-Width Multiplier

The present invention provides various specific implementations of photoelectric computation devices and photoelectric computing methods. The operation of multiplying two high-bit-width multiplier factors is realized by using photoelectric computation multipliers selected from one of the multipliers described above.

Scheme Using the First Multiplier:

For the first multiplier, it is equivalent to perform the following operation:

$$R=c(aX+b)Y \quad (12\text{-}1\text{-}1)$$

where R is the result of the multiplication operation, X is the input quantity from the optical input terminal, Y is the input quantity from the electrical input terminal, and c, a and b are all constants related to the parameters of the unit.

High-bit-width multiplication is to split two high-bit-width multiplier factors bitwise, and then successively multiply in pairs in an order from high to low bits to complete a complete high-bit-width multiplication operation. By taking two high-bit-width multiplier factors A*B as an example, the high-bit-width multiplier factors are split into a plurality of low-bit-width multiplier factors each having a bit width of k, and high and low bits are multiplied:

$$R = A*B = (A_{n-1}A_{n-2} \ldots A_1A_0)*(B_{m-1}B_{m-2} \ldots B_1B_0) = \qquad (12\text{-}1\text{-}2)$$
$$\sum_{i=0}^{n-1} \sum_{j=0}^{m-1} \left(A_i * B_j * 2^{(i+j)*k}\right)$$

It can be known from the equation (12-1-2) that the high-bit-width multiplication includes the following steps:
splitting high-bit-width multiplier factors;
cross-multiplying high and low bits;
shifting the result of cross multiplication; and
accumulating the shifted result.

Figure 28:
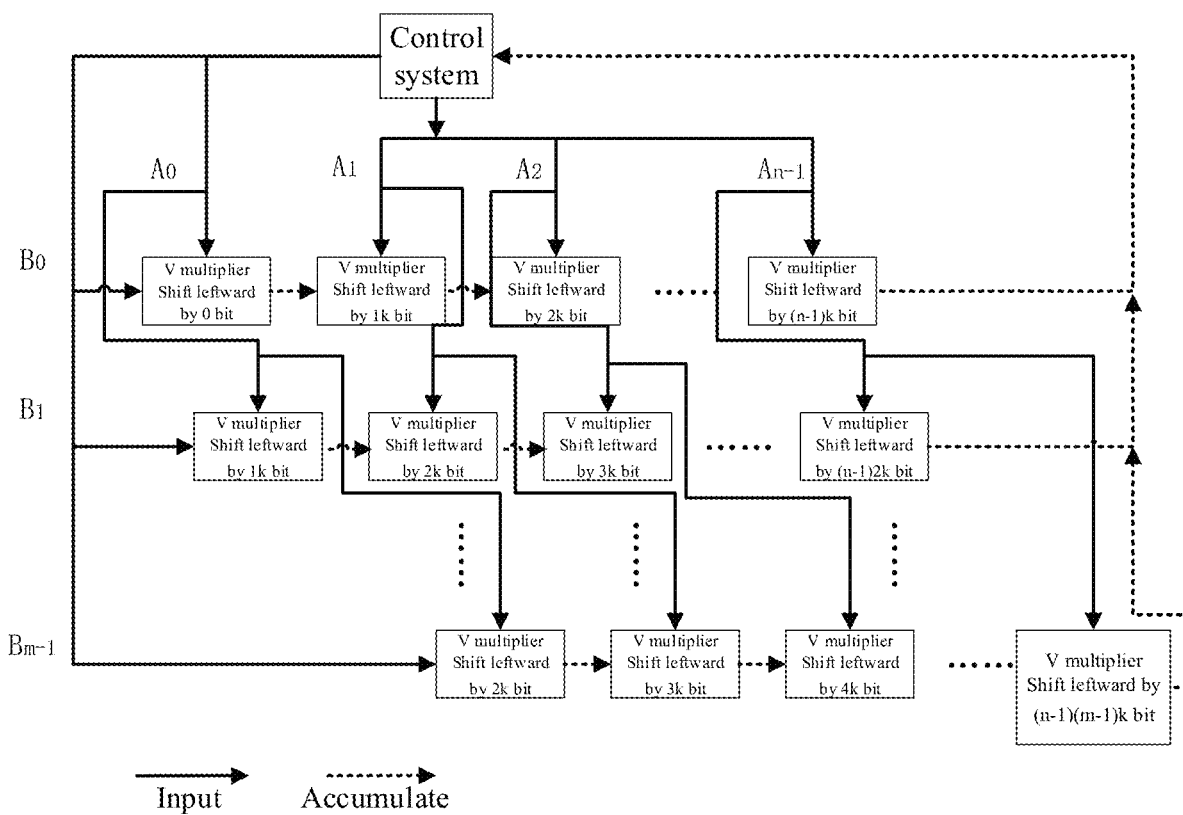
FIG. 28 shows a diagram of an example of a high-bit-width multiplier according to the present invention.

The splitting, shifting and add-up operations are performed by a control system, and the cross multiplication of high and low bits is performed by (n−1)*(m−1) first multipliers, so that the complete high-bit-width multiplication can be realized. As shown in FIG. 28, each block marked with "V multiplier" represents one first multiplier and the number of bits to be shifted for the output of this multiplier in the control system, the solid line represents the input of data, and the dashed line represents the add-up of data.

The high-bit-width multiplier factors to be multiplied are input into the control system and then split into two groups of low-bit-width multiplier factors bitwise in the control system; and the two groups of low-bit-width multiplier factors are combined in pairs and input into different multipliers. After the multiplication operation is completed, the result of operation is returned to the control system and then shifted correspondingly according to the bits of the two input low-bit-width multiplier factors, and the shifted result is accumulated, so that a complete vector dot multiplication operation is completed. The control system may be a digital circuit, or may be various logic control units such as a computer, a single-chip microcomputer or an FPGA.

Schemes Using the Second, Third and Fourth Multipliers:

Like the first multiplier, the second, third and fourth multipliers support a multiplication operation of two input multiplier factors. Therefore, the schemes for the high-bit-width multipliers formed by the three kinds of multipliers are similar to the scheme for the high-bit-width multiplier formed by the first multiplier, and will not be repeated here.

Compared with the traditional high-bit-width multipliers, the use of this scheme for a high-bit-width multiplication operation has the following advantages:

The level of integration is high, and the high-bit-width multiplication operation can be realized by a few photoelectric computing units.

The optical input data can be stored and can be saved in the device for a long period of time after light is cut off, so it is unnecessary to perform the optical input operation again for a next operation.

Scheme for a Serial Matrix Vector Multiplier

The present invention provides various specific implementations of photoelectric computation devices and photoelectric computing methods. The operation of multiplying one matrix and one vector, whose dimensions conform to the matrix vector multiplication rule, is realized by using a plurality of light emitting units and a plurality of the photoelectric computing units described in the above embodiments.

The number of output terminals of this matrix vector multiplier specifically depends on the number of output terminals of the used photoelectric computing unit. For example, if the photoelectric computing unit having two output terminals described in the above embodiments is used, the matrix vector multiplier has two output terminals too. In the following detailed description, it is defaulted to use a photoelectric computing unit having one output terminal.

The number of photoelectric computing units to be used in the present invention is defaulted to be the same as the number of elements in a matrix to be multiplied. When the matrix contains a vector, that is, if the matrix has three rows and one column, the number of the photoelectric computing units to be used is 3. However, if the number of photoelectric computing units is greater than the number of elements in the matrix, for example, six photoelectric computing units are arranged in three rows and two columns, the operation will not be influenced.

Figure 29:
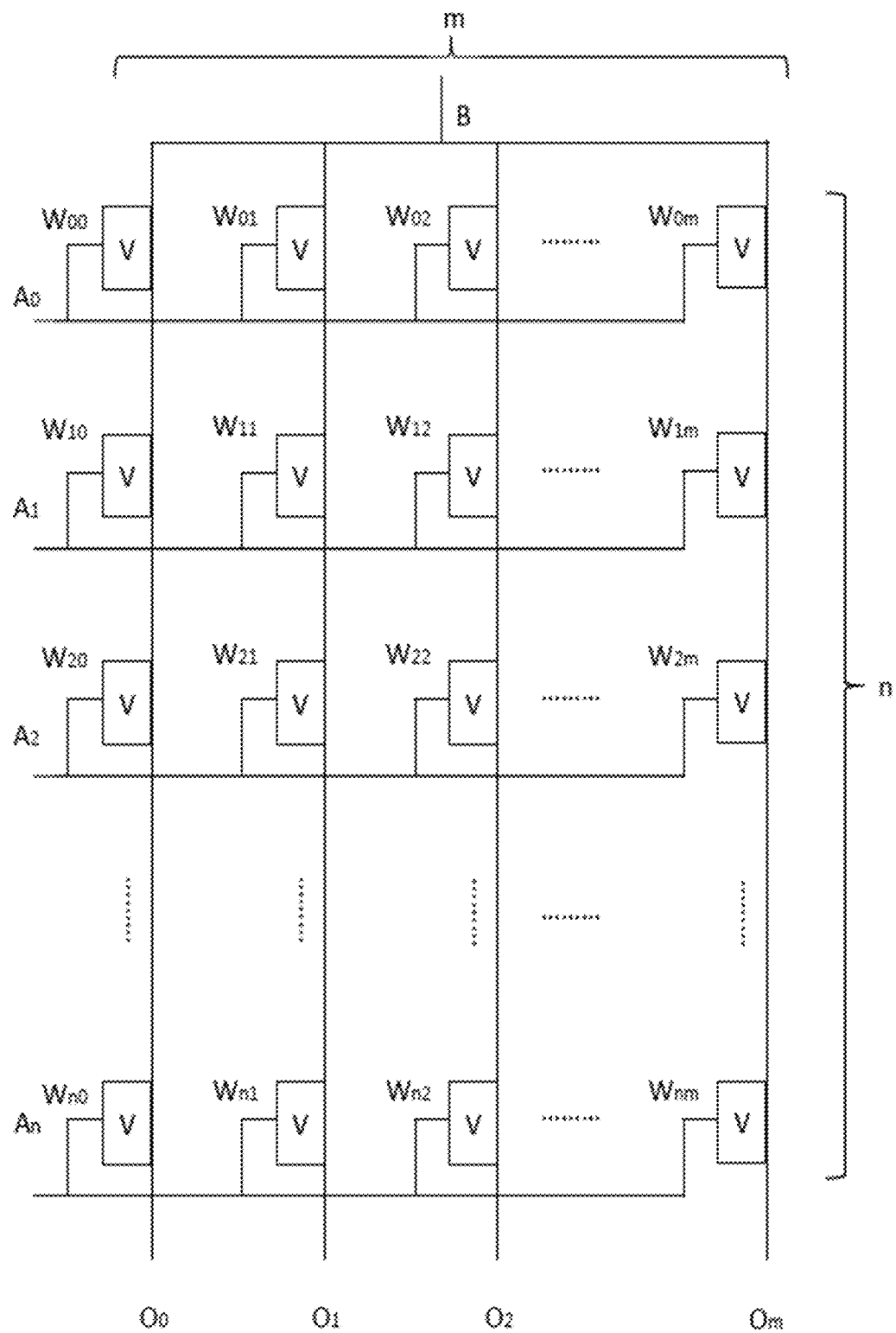
FIG. 29 shows a schematic view of a serial matrix vector multiplier according to the present invention.

Scheme Using the First Embodiment of the Photoelectric Computing Unit:

By taking an operation A*W of multiplying a vector A and a matrix W as an example (where A is a n*1 vector and W is a m*n matrix, as shown in the equation (13-1-1)), the computation is shown in FIG. 29, where the block marked with V represents the photoelectric computing unit using the first scheme, the elements in the vector A are input from an electrical input terminal, and the elements in the matrix W are input from an optical input terminal.

$$A*W = [A_0 A_1 \ldots A_n] \begin{bmatrix} W_{00} & W_{01} & \ldots & W_{0m} \\ W_{10} & W_{11} & \ldots & W_{1m} \\ W_{20} & W_{21} & \ldots & W_{2m} \\ \ldots & \ldots & & \ldots \\ W_{n0} & W_{n1} & \ldots & W_{nm} \end{bmatrix} \qquad (13\text{-}1\text{-}1)$$

Firstly, similar to the electrical input mode for the serial input multiplier described with respect to the second multiplier, each element in the A is subjected to binary conversion in a control system:

$$A = \begin{bmatrix} A_0 \\ A_1 \\ A_2 \\ \ldots \\ A_n \end{bmatrix} = \begin{bmatrix} (A_{00}A_{01} \ldots A_{0k}) \\ (A_{10}A_{11} \ldots A_{1k}) \\ (A_{20}A_{21} \ldots A_{2k}) \\ \ldots \\ (A_{n0}A_{n1} \ldots A_{nk}) \end{bmatrix} \qquad (13\text{-}1\text{-}2)$$

where k depends on the bit width of a single element in the vector.

The photoelectric computing units according to the first embodiment are arranged in an array as shown in FIG. 29, where the array has n rows and m columns; and, the control gates, as the carrier control regions, of all photoelectric computing units in a same row of the array are connected, to which same electrical input data is input. The output terminals of the P-type substrates, as the carrier collection and readout regions, of all photoelectric computing units in a same column of the array are connected so that the output current is converged.

During inputting, m*n pieces of data in the matrix are successively input to m*n photoelectric computing units from the optical input terminals. The elements in the vector are serially input from the connected control gates of the units in a same row, and the binarized data of different bits of a same element are successively input at different time. When the data of the lowest bit is input from the control gate, the binarized data of the lowest bits of the elements in the matrix and the elements in the vector are multiplied bitwise, that is, it is equivalent to perform the following operation $$A * W = [A_{00} A_{10} \ldots A_{n0}] \begin{bmatrix} W_{00} & W_{01} & \ldots & W_{0m} \\ W_{10} & W_{11} & \ldots & W_{1m} \\ W_{20} & W_{21} & \ldots & W_{2m} \\ \ldots & \ldots & & \ldots \\ W_{n0} & W_{n1} & \ldots & W_{nm} \end{bmatrix} \quad (13\text{-}1\text{-}3)$$

Before current convergence, in the array of n*m photoelectric computing units, the result of computation from each unit is:

$$\begin{bmatrix} A_{00}W_{00}, & A_{00}W_{01}, & \ldots & A_{00}W_{0m} \\ A_{10}W_{10}, & A_{10}W_{11}, & \ldots & A_{10}W_{1m} \\ A_{20}W_{20}, & A_{20}W_{21}, & \ldots & A_{20}W_{2m} \\ \ldots & \ldots & & \ldots \\ A_{n0}W_{n0}, & A_{n0}W_{n1}, & \ldots & A_{n0}W_{nm} \end{bmatrix} \quad (13\text{-}1\text{-}4)$$

The addition operation by column is performed by the output current circuit having connected output terminals in each column, and the result (13-1-4) is converged and accumulated. The output from the bottommost matrix vector multiplication output terminal is:

$$\begin{bmatrix} (A_{00}W_{00} + A_{10}W_{10} \ldots + A_{n0}W_{n0}), (A_{00}W_{01} + A_{10}W_{11} \ldots + A_{n0}W_{n1}), \ldots , \\ (A_{00}W_{0m} + A_{10}W_{1m} \ldots + A_{n0}W_{nm}) \end{bmatrix} \quad (13\text{-}1\text{-}5)$$

This result is the result of operation of the equation (13-1-3). Thus, a matrix vector multiplication operation of multiplying the lowest bit of the vector and the matrix is completed.

The result of computation (13-1-5) is subjected to AD conversion and then input into the control system. Since the result of computation is the lowest bit, this result is shifted leftward by 0 bit. Then, the second lowest bit of the vector is input into the control gate as the electrical input terminal data to obtain a result of matrix vector multiplication of the second lowest bit of the vector and the matrix. The result of matrix vector multiplication is input into the control system, shifted leftward by 1 bit, and added with the result of multiplication of the lowest bit of the vector and the matrix. By that analogy, binarized data of all bits of the vector are serially input, and successively shifted and accumulated in the control system to obtain a final result of matrix vector operation. It is equivalent to perform the following operation:

$$A * W = [A_0 A_1 \ldots A_n] \begin{bmatrix} W_{00} & W_{01} & \ldots & W_{0m} \\ W_{10} & W_{11} & \ldots & W_{1m} \\ W_{20} & W_{21} & \ldots & W_{2m} \\ \ldots & \ldots & & \ldots \\ W_{n0} & W_{n1} & \ldots & W_{nm} \end{bmatrix} = \quad (13\text{-}1\text{-}6)$$

-continued $$\sum_{i=0}^{k} \left\{ 2^i \begin{bmatrix} A_{00}W_{00}, & A_{00}W_{01}, & \ldots & A_{00}W_{0m} \\ A_{10}W_{10}, & A_{10}W_{11}, & \ldots & A_{10}W_{1m} \\ A_{20}W_{20}, & A_{20}W_{21}, & \ldots & A_{20}W_{2m} \\ \ldots & \ldots & & \ldots \\ A_{n0}W_{n0}, & A_{n0}W_{n1}, & \ldots & A_{n0}W_{nm} \end{bmatrix} \right\}$$

The control system may be a digital circuit, or may be various logic control units such as a computer, a single-chip microcomputer or an FPGA.

Schemes Using the Photoelectric Computing Units According to the Second, Third and Fourth Embodiments:

Like the first scheme, in the second, third and fourth schemes, an operation of multiplying two multiplier factors can be completed in a serial input manner, as described with respect to the second multiplier. Therefore, the operation can also be completed by replacing the matrix vector multiplier formed by the photoelectric computing units in the first scheme with a matrix vector multiplier formed by the photoelectric computing units in the second, third and fourth schemes, except for the following differences:

If the second photoelectric computation scheme is used, since the P-type substrate device is replaced with an N-type substrate device, the polarities of the voltages at the control gate and the substrate are reversed, and the magnitudes of the voltages are to be modulated.

If the third photoelectric computing unit scheme is used, since collection is performed in the charge coupled layer rather than in the P-type substrate due to the change of the optical input mode, the optical input quantity is to be modulated.

If the fourth photoelectric computing unit scheme is used, instead of the control gate, the drain of the reset transistor is used as the carrier control region connected in parallel.

Compared with the traditional matric vector multipliers, the use of this scheme for a matrix vector multiplication operation has the following advantages:

The level of integration is high, and the matrix vector multiplication operation can be realized by a few photoelectric computing units.

The optical input data can be stored and can be saved in the device for a long period of time after light is cut off, so it is unnecessary to perform the optical input operation again for a next operation.

Schemes for a Parallel Matrix Vector Multiplier

The present invention provides various specific implementations of photoelectric computation devices and photoelectric computing methods. The operation of multiplying one matrix and one vector, whose dimensions conform to the matrix vector multiplication rule, is realized by using a plurality of light emitting units and a plurality of the photoelectric computing units described in the above embodiments. The implementations provided in the present invention differ from the serial matrix vector multiplier in that: an array is formed by more photoelectric computing units and more light emitting units, binarized data of elements in the vector are input in a parallel input manner, and the operation speed is higher. However, more units are required.

The number of output terminals of this matrix vector multiplier specifically depends on the number of output terminals of the used photoelectric computing unit. For example, if the photoelectric computing unit having two output terminals described in the above embodiments is used, the matrix vector multiplier has two output terminals too. In the following detailed description, it is defaulted to use a photoelectric computing unit having one output terminal.

The number of photoelectric computing units to be used in the present invention is defaulted to be the same as the product of multiplying the number of elements in a matrix to be multiplied by the bit width of a single element. The matrix contains a vector. However, if the number of photoelectric computing units is greater than the number of elements in the matrix, the operation will not be influenced.

1) Scheme Using the First Embodiment of the Photoelectric Computing Unit:

By taking an operation A*W of multiplying a vector A and a matrix W as an example (where A is a n*1 vector and W is a m*n matrix, as shown in the equation (13-1-1)), the elements in the vector A are input from an electrical input terminal, and the elements in the matrix W are input from an optical input terminal.

$$A*W = [A_0 A_1 \ldots A_n] \begin{bmatrix} W_{00} & W_{01} & \ldots & W_{0m} \\ W_{10} & W_{11} & \ldots & W_{1m} \\ W_{20} & W_{21} & \ldots & W_{2m} \\ \ldots & \ldots & & \ldots \\ W_{n0} & W_{n1} & \ldots & W_{nm} \end{bmatrix} \quad (14-1-1)$$

Firstly, similar to the electrical input mode for the parallel input multiplier described with respect to the third multiplier, each element in the A is subjected to binary conversion in a control system:

$$A = \begin{bmatrix} A_0 \\ A_1 \\ A_2 \\ \ldots \\ A_n \end{bmatrix} = \begin{bmatrix} (A_{00} A_{01} \ldots A_{0k}) \\ (A_{10} A_{11} \ldots A_{1k}) \\ (A_{20} A_{21} \ldots A_{2k}) \\ \ldots \\ (A_{n0} A_{n1} \ldots A_{nk}) \end{bmatrix} \quad (14-1-2)$$

where k depends on the bit width of a single element in the vector.

Figure 30:
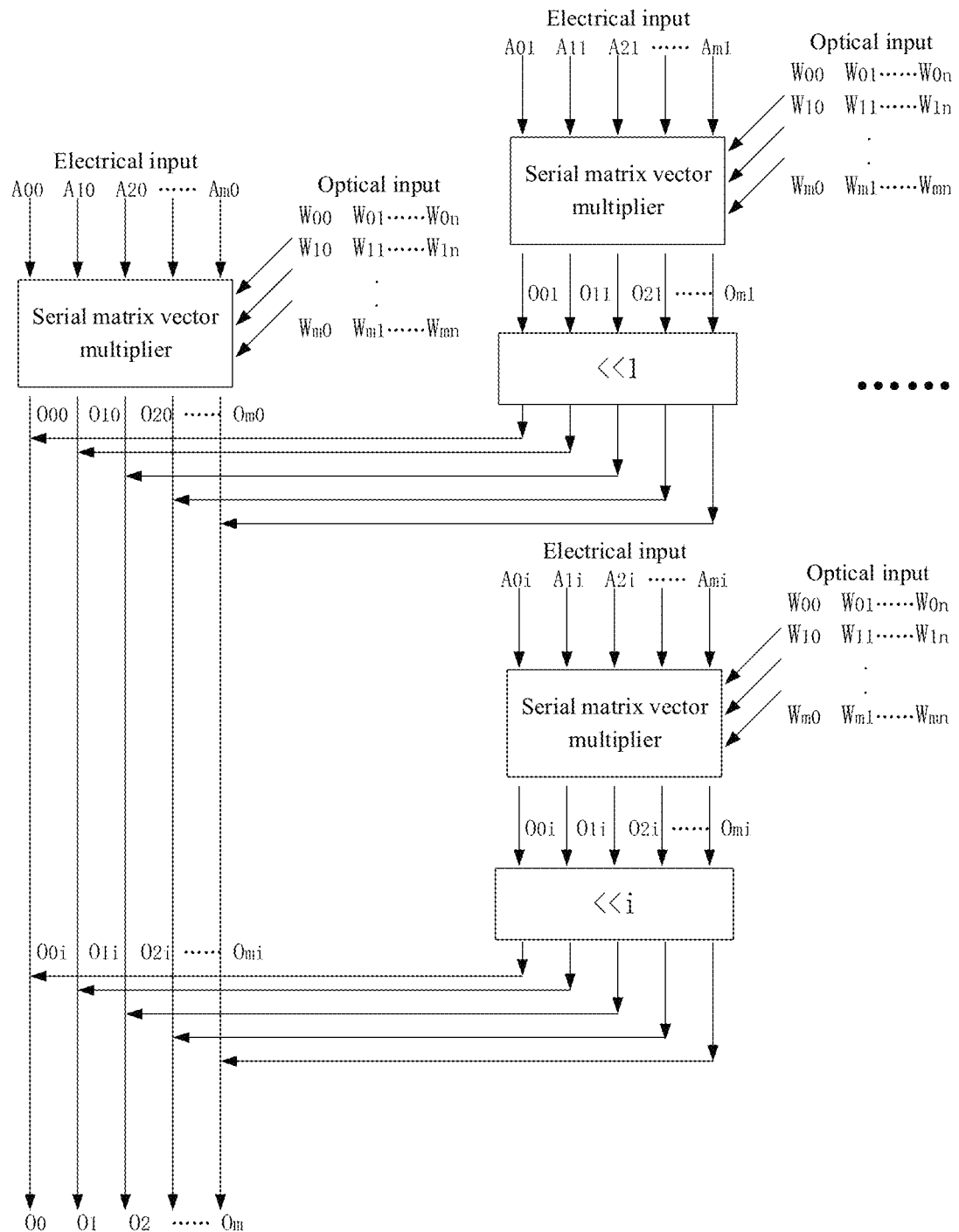
FIG. 30 shows a schematic view of a parallel matrix vector multiplier according to the present invention.

If the photoelectric computing units according to the first embodiment are used, a total of k*m*n units are required. The units are divided into k groups each having m*n units, and the units in each group are arranged in an array the same as the serial matrix vector multiplier array. That is, the units are arranged in arrays as shown in FIG. 30. There are total k arrays each having n rows and m columns. The control gates, as the carrier control regions, of all photoelectric computing units in a same row of all arrays of all groups are connected, to which same electrical input data is input. The output terminals of the P-type substrates, as the carrier collection and readout regions, of all photoelectric computing units in a same column of all arrays of all groups are connected so that the output current is converged.

During inputting, m*n pieces of data in the matrix are successively input into m*n photoelectric computing units in each group from the optical input terminals, and the same optical input terminal data is input into the arrays of all groups. The elements in the vector are input in parallel from the connected control gates of the units in a same row. For the $0^{th}$ bit of each element in the vector (i.e., $A_{00}$, $A10, \ldots, An0$), each element in the binarized matrix is input into the control gates in rows of the array of the $0^{th}$ group. Similarly, the $i^{th}$ bit is input into the control gates in the array of the $i^{th}$ group, and the binarized vector data is input, in parallel and one by one, into all control gates in the array of the $k^{th}$ group. For the array of the $0^{th}$ group, the pieces of binarized data at the $0^{th}$ bits of the elements in the matrix and the elements in the vector are multiplied correspondingly, that is, it is equivalent to perform the following operation (14-1-3):

$$A*W = [A_{00} A_{10} \ldots A_{n0}] \begin{bmatrix} W_{00} & W_{01} & \ldots & W_{0m} \\ W_{10} & W_{11} & \ldots & W_{1m} \\ W_{20} & W_{21} & \ldots & W_{2m} \\ \ldots & \ldots & & \ldots \\ W_{n0} & W_{n1} & \ldots & W_{nm} \end{bmatrix} \quad (14-1-3)$$

Before current convergence, in the array of n*m photoelectric computing units in the $0^{th}$ group, the result of computation from each unit is:

$$\begin{bmatrix} A_{00}W_{00}, & A_{00}W_{01}, & \ldots & A_{00}W_{0m} \\ A_{10}W_{10}, & A_{10}W_{11}, & \ldots & A_{10}W_{1m} \\ A_{20}W_{20}, & A_{20}W_{21}, & \ldots & A_{20}W_{2m} \\ \ldots & \ldots & & \ldots \\ A_{n0}W_{n0}, & A_{n0}W_{n1}, & \ldots & A_{n0}W_{nm} \end{bmatrix} \quad (14-1-4)$$

The addition operation by column is performed by the output current circuit having connected output terminals in each column, and the result (14-1-4) is converged and accumulated. The output from the output terminal of the array of the bottommost $0^{th}$ group is:

$$\begin{bmatrix} (A_{00}W_{00} + A_{10}W_{10} \ldots + A_{n0}W_{n0}), (A_{00}W_{01} + A_{00}W_{11} \ldots + A_{n0}W_{n1}), \ldots, \\ (A_{00}W_{0m} + A_{10}W_{1m} \ldots + A_{n0}W_{nm}) \end{bmatrix} \quad (13-1-5)$$

This result is the result of operation of the equation (14-1-3). Thus, a matrix vector multiplication operation of multiplying the 0th bit of the vector and the matrix is completed.

Similar to the computation process of the array of the $0^{th}$ group, for the arrays of the $1^{st}$ to $(k-1)^{th}$ groups, the binarized data of the $1^{st}$ to $(k-1)^{th}$ bits is input from the control gates in each row, the corresponding results of matrix vector multiplication are output from the output terminals, and the results of computation of k groups are subjected to AD conversion and input into a control system. All elements in the result vector of the array of the $i^{th}$ group are shifted leftward by i bits, and the shifted output results of all groups are accumulated according to the vector addition rule in the control system to obtain a final result of matrix vector operation. It is equivalent to perform the following operation:

$$A*W = [A_0 A_1 \ldots A_n] \begin{bmatrix} W_{00} & W_{01} & \ldots & W_{0m} \\ W_{10} & W_{11} & \ldots & W_{1m} \\ W_{20} & W_{21} & \ldots & W_{2m} \\ \ldots & \ldots & & \ldots \\ W_{n0} & W_{n1} & \ldots & W_{nm} \end{bmatrix} = \quad (13\text{-}1\text{-}6)$$

$$\sum_{i=0}^{k} \left\{ 2^i \begin{bmatrix} A_{00}W_{00}, & A_{00}W_{01}, & \ldots & A_{00}W_{0m} \\ A_{10}W_{10}, & A_{10}W_{11}, & \ldots & A_{10}W_{1m} \\ A_{20}W_{20}, & A_{20}W_{21}, & \ldots & A_{20}W_{2m} \\ \ldots & \ldots & & \ldots \\ A_{n0}W_{n0}, & A_{n0}W_{n1}, & \ldots & A_{n0}W_{nm} \end{bmatrix} \right\}$$

Figure 31:
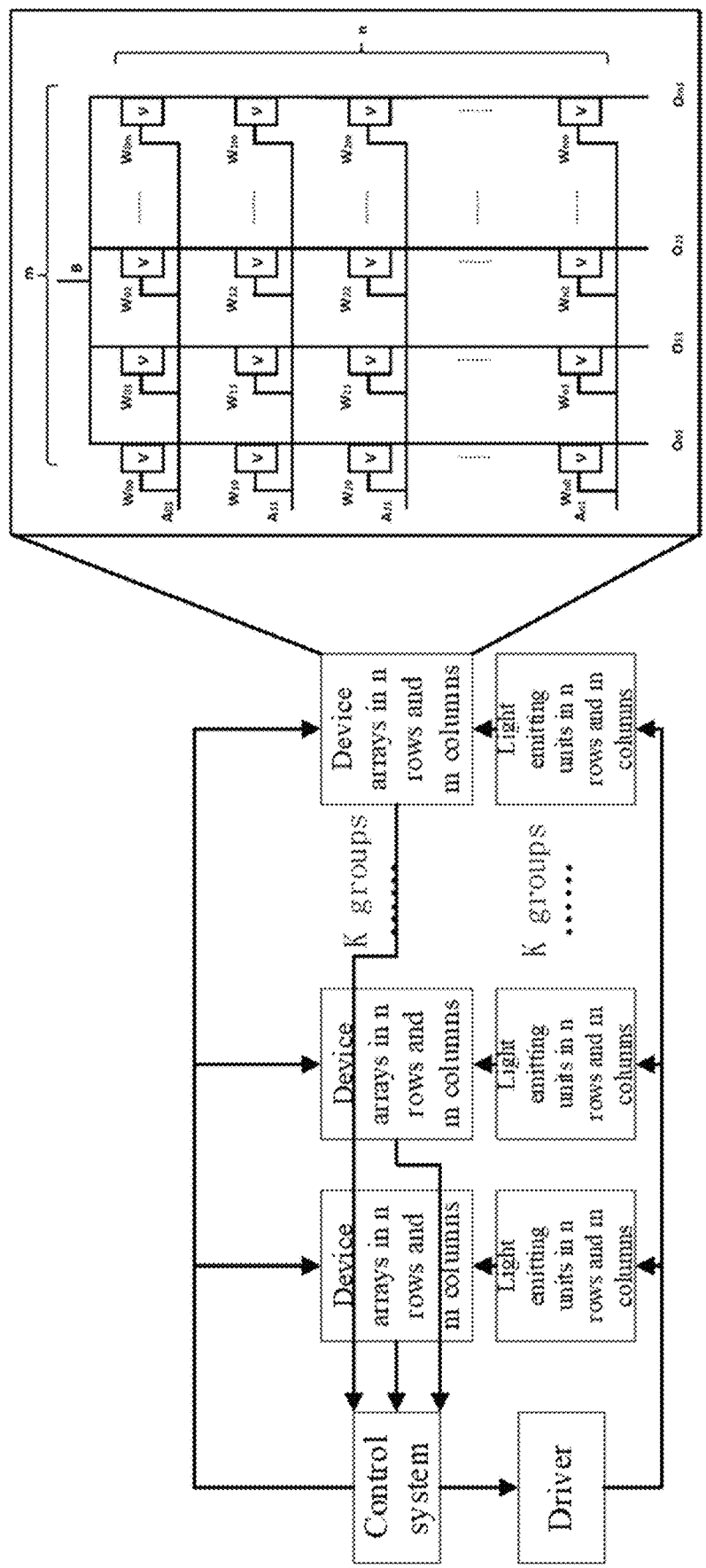
FIG. 31 is a schematic view showing a parallel matrix vector multiplier according to the present invention.

During the operation process, as shown in FIG. 31, each block marked with "serial matrix vector multiplier" represents one array of n*m units. The schematic view of the device is roughly shown in FIG. 31.

The control system may be a digital circuit, or may be various logic control units such as a computer, a single-chip microcomputer or an FPGA.

2) Schemes Using the Photoelectric Computing Units According to the Second, Third and Fourth Embodiments:

Like the first scheme, in the second, third and fourth schemes, an operation of multiplying two multiplier factors can be completed in a parallel input manner, as described with respect to the third multiplier. Therefore, the operation can also be completed by replacing the matrix vector multiplier formed by the photoelectric computing units in the first scheme with a matrix vector multiplier formed by the photoelectric computing units in the second, third and fourth schemes, except for the following differences:

1) If the second photoelectric computation scheme is used, since the P-type substrate device is replaced with an N-type substrate device, the polarities of the voltages at the control gate and the substrate are reversed, and the magnitudes of the voltages are also to be modulated.
2) If the third photoelectric computing unit scheme is used, since collection is performed in the charge coupled layer rather than in the P-type substrate due to the change of the optical input mode, the optical input quantity is to be modulated again.
3) If the fourth photoelectric computing unit scheme is used, instead of the control gate, the drain of the reset transistor is used as the carrier control region connected in parallel.

Compared with the traditional matric vector multipliers, the use of this scheme for a matrix vector multiplication operation has the following advantages:

1. The level of integration is high, and the matrix vector multiplication operation can be realized by a few photoelectric computing units.
2. The optical input data can be stored and can be saved in the device for a long period of time after light is cut off, so it is unnecessary to perform the optical input operation again for a next operation.

Schemes for a Pooling Device

The present invention provides various specific implementations of photoelectric computation devices and photoelectric computing methods. An average pooling operation is realized by using the two photoelectric matrix vector multipliers described above.

1) Scheme Using the Matrix Vector Multiplier:

For the matrix vector multiplier, it is equivalent to perform the following operation:

$$A*W = [A_0 A_1 \ldots A_n] \begin{bmatrix} W_{00} & W_{01} & \ldots & W_{0m} \\ W_{10} & W_{11} & \ldots & W_{1m} \\ W_{20} & W_{21} & \ldots & W_{2m} \\ \ldots & \ldots & & \ldots \\ W_{n0} & W_{n1} & \ldots & W_{nm} \end{bmatrix} \quad (15\text{-}1\text{-}1)$$

where A is vector data input serially from a vector input terminal (i.e., an electrical input terminal); W is data input from a matrix input terminal (i.e., an electrical input terminal); and the output result is a vector having m*1 dimensions.

The pooling operation includes many types of operations, such as average pooling and maximum pooling. The pooling device described in the present invention is only for the average pooling operation.

The average pooling refers to averaging, for example, as shown in the equation (15-1-2):

$$A = \begin{bmatrix} A_{00} & A_{01} \\ A_{10} & A_{11} \end{bmatrix} \xrightarrow{average\ pooling} \frac{(A_{00} + A_{01} + A_{10} + A_{11})}{4} \quad (15\text{-}1\text{-}2)$$

It can be known from the equation (13-1-2) that the average pooling operation can be equivalent to the following vector multiplication operation:

$$A \xrightarrow{average\ pooling} [A_0 A_{01} A_{10} A_{11}] \begin{bmatrix} \frac{1}{4} \\ \frac{1}{4} \\ \frac{1}{4} \\ \frac{1}{4} \end{bmatrix} \quad (15\text{-}1\text{-}3)$$

Therefore, the above operation can be completed by the matrix vector multiplier, which is suitable for the operation of data from the matrix input terminal and has a dimension of an matrix (vector) having n rows and 1 column, and by n*1 photoelectric computing units.

Firstly, the number of elements in a matrix to be pooled is determined by a control system. Then, all elements in the matrix to be pooled are split in the control system, then recombined to obtain a one-dimensional vector and input from a vector input terminal of the matrix vector multiplier. The same optical input terminal data, that is equivalent to the reciprocal of the number of elements in the matrix, is input into all units in the matrix vector multiplier from the optical input terminal. One output quantity from the output terminal of the matrix vector multiplier is the result of average pooling of the matrix to be pooled. The control system may be a digital circuit, or may be various logic control units such as a computer, a single-chip microcomputer or an FPGA.

2) Scheme Using the High-Bit-Width Multiplier:

The above-mentioned high-bit-width multiplier is similar to the above-mentioned vector dot multiplier. The only difference is that the data at the input end of vector is input in parallel, and the operation speed is faster, but more photoelectric calculation units are needed. If the above-mentioned high-bit-width multiplier is used to calculate formula (15-1-3), 4*K photoelectric calculation units are needed, where K is the bit width of elements in the matrix A to be pooled, while only 4 photoelectric calculation units are needed to calculate by using the above-mentioned vector dot multiplier.

Compared with the traditional pooling computing unit, using this scheme for the pooling operation has the following advantages:

1. The integration is high, and several photoelectric calculation units can realize pooling operation.
2. The optical input data can be stored and can be saved in the device for a long period of time after light is cut off, so it is unnecessary to perform the optical input operation again for a next operation, which is especially advantageous in view of the fact that the average pooled denominator of multiple operations in pooling operation remains unchanged.

Schemes for a Convolver

The present invention provides various specific implementations of photoelectric computation devices and photoelectric computing methods. A convolution operation of a matrix is realized by using a plurality of light emitting units and a plurality of photoelectric computing units described in the above embodiments.

The number of output terminals of this convolver specifically depends on the number of output terminals of the used photoelectric computing unit. For example, if the photoelectric computing unit having two output terminals in the above embodiments is used, the convolver has two output terminals too. In the following detailed description, it is defaulted to use a photoelectric computing unit having one output terminal.

Like the schemes for the serial and parallel matrix vector multipliers, if the number of the used photoelectric computing units is greater than the number of photoelectric computing units actually required, the accuracy of the result of operation will not be influenced.

1) Scheme Using the First Embodiment of the Photoelectric Computing Unit:

By taking a convolution operation of a matrix A for a convolution kernel a as an example, the process of the convolution operation will be described briefly, where A is a 10*10 matrix, a is a 3*3 convolution kernel, and the step size is 1, as shown in the following equation (16-1-1):

$$A \xrightarrow{convolution} a = \begin{bmatrix} A_{00} & A_{01} & \cdots & A_{010} \\ A_{10} & A_{11} & \cdots & A_{110} \\ A_{20} & A_{21} & \cdots & A_{210} \\ \cdots & \cdots & \cdots & \cdots \\ A_{100} & A_{101} & \cdots & A_{1010} \end{bmatrix} \xrightarrow{convolution} \begin{bmatrix} a_{00} a_{01} a_{02} \\ a_{10} a_{11} a_{12} \\ a_{20} a_{21} a_{22} \end{bmatrix} \quad (16\text{-}1\text{-}1)$$

Figure 32:
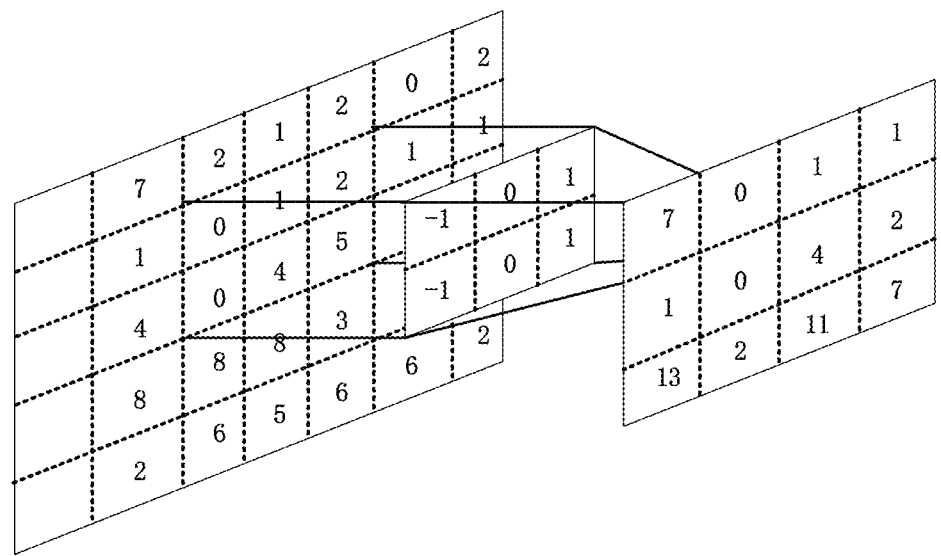
FIG. 32 shows a schematic view of a convolution operation according to the present invention.

As the rule for the convolution operation, the matrix to be convoluted is interacted with elements in the convolution kernel one by one under the mapping of the convolution kernel and the convolution kernel is moved according to a corresponding step size for a next mapping. As shown in FIG. 32, to solve the convolution operation in the equation (16-1-1), the following steps are to be executed.

1) Zero Padding:

The matrix A to be convoluted is expanded from a 10*10 matrix to a 12*12 matrix, that is, one row/column is added above the $0^{th}$ row, left the $0^{th}$ column, below the 10th row and the right the $10^{th}$ column, respectively. All the elements in the added rows/columns are 0, so this operation is called zero padding. Thus, the matrix A is changed to a matrix $A_0$, shown in the following equation (16-1-2):

$$A_0 = \begin{bmatrix} 0 & 0 & 0 & 0 & \cdots & 0 & 0 \\ 0 & A_{00} & A_{01} & A_{02} & \cdots & A_{010} & 0 \\ 0 & A_{10} & A_{11} & A_{12} & \cdots & A_{110} & 0 \\ 0 & \cdots & \cdots & \cdots & \cdots & \cdots & 0 \\ 0 & A_{100} & A_{101} & A_{102} & \cdots & A_{1010} & 0 \\ 0 & 0 & 0 & 0 & \cdots & 0 & 0 \end{bmatrix} \quad (16\text{-}1\text{-}2)$$

2) Determination of the Initial Position of the Convolution Kernel:

The initial position of the convolution kernel is superposed with the upper left corner of the matrix A, that is, 3 rows and 3 columns of the convolution kernel a correspond to the $0^{th}$, $1^{st}$ and $2^{nd}$ rows and the $0^{th}$, $1^{st}$ and $2^{nd}$ columns of the matrix $A_0$, respectively. Then, the elements in the convolution kernel are multiplied by the elements in the matrix $A_0$ at positions corresponding to the convolution kernel, shown in the equation (16-1-3), to obtain 9 results of multiplication. The 9 results of multiplication are accumulated to obtain a result of convolution operation corresponding to the current position of the convolution kernel, i.e., $R_{00}$. That is, the following operation shown in the equation (16-1-4) is completed:

$$\begin{bmatrix} (a_{00}*0)(a_{01}*0)(a_{02}*0) \\ (a_{10}*0)(a_{11}*A_{00})(a_{12}*A_{01}) \\ (a_{20}*0)(a_{21}*A_{10})(a_{22}*A_{11}) \end{bmatrix} \quad (16\text{-}1\text{-}3)$$

$$(a_{00}*0) + (a_{01}*0) + (a_{02}*0) + (a_{10}*0) + (a_{11}*A_{00}) + \quad (16\text{-}1\text{-}4)$$
$$(a_{12}*A_{01}) + (a_{20}*0) + (a_{21}*A_{10}) + (a_{22}*A_{11}) = R_{00}$$

3) Movement of the Convolution Kernel:

Since it is defined in advance that the step size for this convolution operation is 1, the convolution kernel is moved left by 1 column, that is, the 3 rows and 3 columns of the convolution kernel a moved left by 1 column correspond to the $0^{th}$, $1^{st}$ and $2^{nd}$ rows and the $1^{st}$, $2^{nd}$ and $3^{rd}$ columns of the matrix $A_0$, respectively. Then, the convolution operation is performed at the current position, and the result of convolution operation is called $R_{01}$.

4) After the convolution kernel traverses the whole matrix $A_0$, a total of $(10+2-2)^2$ results of convolution are obtained, and the results of convolution are arranged in a matrix according to the corresponding positions of the convolution kernel to obtain the following equation (16-1-5):

$$R = \begin{bmatrix} R_{00} R_{01} & \cdots & R_{010} \\ R_{10} R_{11} & \cdots & R_{110} \\ R_{20} R_{21} & \cdots & R_{210} \\ & \cdots & \\ R_{100} R_{101} & \cdots & R_{1010} \end{bmatrix} \quad (16\text{-}1\text{-}5)$$

The matrix R is the result of convolution operation of the matrix to be convoluted A under the action of the convolution kernel a and at the step size of 1.

It can be known from the steps of the convolution operation that the convolution operation refers to multiple operations of multiplying corresponding elements of two matrices in pairs and accumulating. In the two matrices in which the elements are to be multiplied in pairs, one matrix is the convolution kernel, which is an invariable quantity during multiple operations; and the other matrix is elements of the matrix to be convoluted corresponding to the position of the convolution kernel, which is a variable quantity during multiple operations. Therefore, the photoelectric computing unit using the first photoelectric computing unit scheme described in the invention 1 can be used. Based on the advantage that data can be stored in the optical input storage mode, the convolution kernel data is input from the optical input terminal and the to-be-convoluted matrix data is input from the electrical input terminal for the convolution operation. Thus, both the energy efficiency ratio and the operation speed can be greatly improved. Therefore, the electrical input terminal of the unit is a to-be-convoluted matrix data input terminal of the convolver, and the optical input terminal is a convolution kernel input terminal.

Like the matrix vector multiplication, the convolver can have a serial input mode and a parallel input mode. The main difference between the serial input mode and the parallel input mode lies in the number of the used units and the data input mode of the electrical input terminal. The serial input scheme will be described below.

Figure 33:
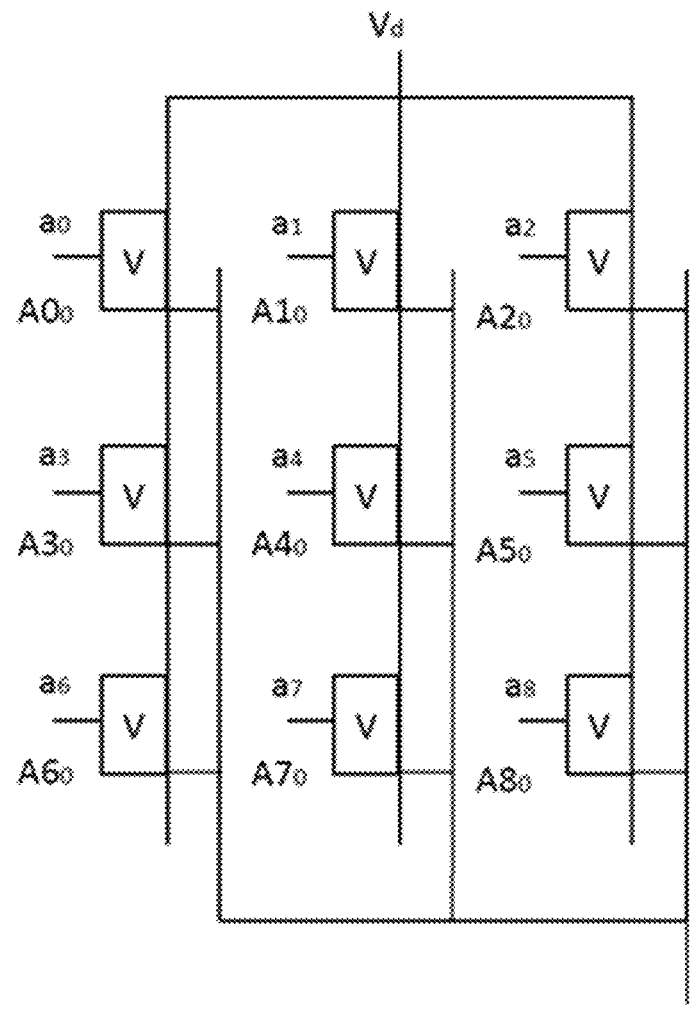
FIG. 33 shows a schematic view of a convolution unit array according to the present invention, with a 3*3 convolution kernel.

According to the convolution operation mode, the photoelectric computing units using the first scheme are used, the number of which is equal to the number of elements in the convolution kernel. The units are arranged in an array having the same dimension as the convolution kernel, and the output terminals of the readout regions in the carrier collection and readout regions are connected for convergence and addition. FIG. 33 shows an array of units for a convolution kernel having 3*3 dimensions. In FIG. 33, one block marked with V represents one photoelectric computing unit using the first scheme.

Firstly, the convolution kernel data is input into the units one by one from the optical input terminals. Then, the data, corresponding to the current position of the convolution kernel, in the matrix is converted into binary data, and the binary data is serially input into the array from the control gates as the carrier control regions. The output result is converged, subjected to AD conversion, input into the control system, and shifted and accumulated to obtain a result of convolution operation corresponding to the current position of the convolution kernel. Subsequently, the convolution kernel is moved. By using the convolution kernel data stored in advance by the optical input and directly inputting the electrical input data again, a result of convolution operation corresponding to the next position of the convolution kernel can be obtained. By that analogy, after the convolution kernel traverses the whole matrix to be convoluted, the output results of convolution are recombined to obtain a result matrix. In this way, the complete convolution operation is completed.

If a convolver using a parallel input mode is used, it is just required to change the number of the used units to k times of the original number, where k is the bit width of elements in the matrix to be convoluted. Meanwhile, the units are divided into k groups of arrays each having the same dimension as the convolution kernel, and all the output terminals are connected together. The electrical input terminal data is input in parallel by a method similar to that of the parallel matrix vector multiplier.

The control system may be a digital circuit, or may be various logic control units such as a computer, a single-chip microcomputer or an FPGA.

2) Schemes Using the Photoelectric Computing Units According to the Second, Third and Fourth Embodiments:

Like the first scheme, in the second, third and fourth schemes, the convolution operation can also be realized in a serial or parallel input mode. Therefore, the operation can also be completed by replacing the above-described convolver formed by the photoelectric computing units in the first scheme with a matrix vector multiplier formed by the photoelectric computing units in the second, third and fourth schemes, except for the following differences:

1) If the second photoelectric computation scheme is used, since the P-type substrate device is replaced with an N-type substrate device, the polarities of the voltages at the control gate and the substrate are reversed, and the magnitudes of the voltages are also to be modulated.
2) If the third photoelectric computing unit scheme is used, since collection is performed in the charge coupled layer rather than in the P-type substrate due to the change of the optical input mode, the optical input quantity is to be modulated again.
3) If the fourth photoelectric computing unit scheme is used, instead of the control gate, the drain of the reset transistor is used as the carrier control region.

Compared with the traditional convolvers, the use of this scheme for a convolution operation has the following advantages:

1. The level of integration is high, and the convolution operation can be realized by a few photoelectric computing units.
2. The optical input data can be stored and can be saved in the device for a long period of time after light is cut off, so it is unnecessary to perform the optical input operation again for a next operation; and, it is particularly advantageous to keep the convolution kernel unchanged during multiple operations of convolution.

Schemes for a Neural Network Accelerator

The present invention provides various specific implementations of photoelectric computation devices and photoelectric computing methods. The acceleration of neural network algorithm reasoning is realized by using the schemes for the serial matrix vector multiplier, the parallel matrix vector multiplier, the pooling device and the convolver and in combination with a corresponding control system.

Figure 34:
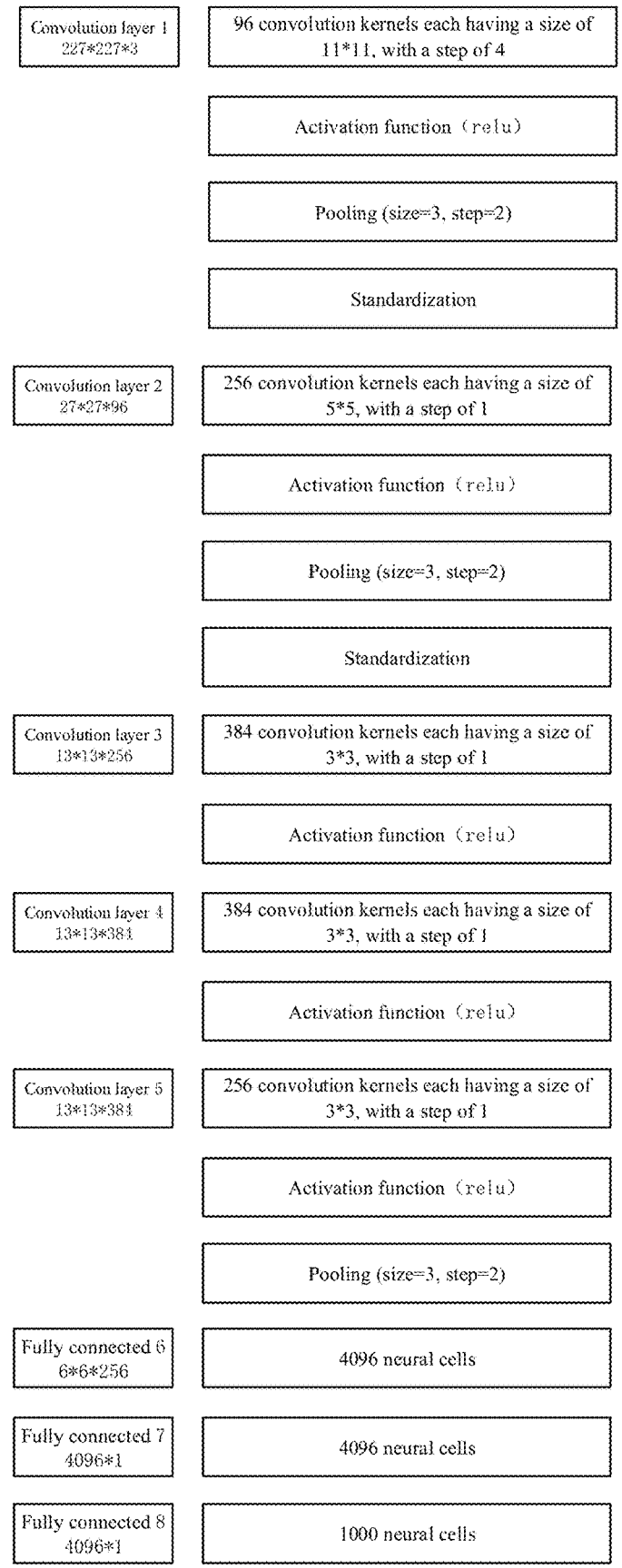
FIG. 34 shows a schematic view of an ALEXnet network according to the present invention.
Figure 35:
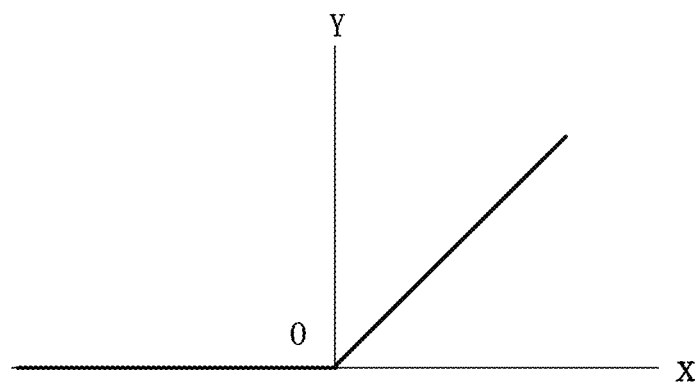
FIG. 35 shows a schematic view of a RELU function image according to the present invention.

The reasoning of neural network algorithms will be described by taking the most common ALEXnet network as an example. The ALEXnet network consists of a convolution later and a fully connected layer, and can perform various tasks such as face recognition. The detailed structure of the network is shown in FIG. 34, wherein the operations contained in the convolution layer include convolution operation, pooling operation and nonlinear function operation, and the operations contained in the fully connected layer include matrix vector multiplication operation, pooling operation and nonlinear function operation. It can be known that, except for the nonlinear function operation, the corresponding photoelectric operation accelerator schemes have been mentioned in the present invention for other operations. There are many nonlinear function operations, and the most common nonlinear function operation is RELU function. Its function image is shown in FIG. 35. It is easy to know that the output of the RELU function is 0 for any input less than 0, while the output is the RELU function itself for any input greater than 0. Therefore, the function itself is equivalent to a logic control unit to determine whether the input is greater than 0, and it is very convenient to complete the RELU function operation by the control system. Therefore, one complete neural network accelerator and one acceleration method can be formed by the photoelectric operators and photoelectric computing methods using the most common four computation modes in the neural network algorithms.

The greatest advantage of using photoelectric computing units to accelerate the neural network is the storage characteristic of the optical input. Still by taking an ALEXnet network as an example, for the ALEXnet network, the dimension of the output data from each layer is a fixed value. As described in the schemes for the convolver, during the convolution operation in the convolution layer, since the data of the convolution kernel is invariable during multiple operations, due to the storage characteristic of the optical input data, multiple or even all of convolution operations can be completed by once light emission. Thus, the time and energy consumption required by data interaction between the storage unit and the photoelectric computing units are greatly reduced.

The same is true for pooling. Since the dimension of the data input into and output from each layer of the network is a fixed value, the average denominator pooling (i.e., the number of elements in the matrix to be pooled) is an invariable quantity. Due to the storage characteristic of the optical input, the operation speed can also be greatly increased.

In the fully connected layer, the presence of a large amount of matrix vector multiplications is the most helpless for the conventional computing methods. However, in the matrix vector multiplications, the matrix data is a fixed weight obtained by training. Once the training is completed, the value of the weight will not be changed. Therefore, during reasoning, the weight is also input into the photoelectric computing unit in an optical input manner. Thus, the operation efficiency can be greatly improved.

The input data of the ALEXnet network is data of a three-dimensional matrix 227*227*3, and is firstly processed by a convolution layer 1, as shown in FIG. 34.

In the convolution layer 1, the size of the convolution kernel is 11*11, and there are 96 convolution operations each having a step size of 4. If the scheme for the convolver is used, at least 96 above-described convolvers for the convolution kernel having a size of 11*11 are required. The pooling operation in the convolution layer 1 is average pooling. Since the size of the kernel is 3*3, 9 numbers are averaged to 1 number, and at least one above-described pooling device for the 3*3 matrix input is required.

By that analogy, in the convolution layer 2, at least 256 above-described convolvers for the convolution kernel having a size of 5*5 are required, and at least one above-described pooling device for the 3*3 matrix input is required.

In the convolution layer 3, at least 384 above-described convolvers for the convolution kernel having a size of 3*3 are required.

In the convolution layer 4, at least 384 above-described convolvers for the convolution kernel having a size of 3*3 are required.

In the convolution layer 5, at least 256 above-described convolvers for the convolution kernel having a size of 3*3 are required, and at least one above-described pooling device for the 3*3 matrix input is required.

In the fully connected layer 1, at least one matrix vector multiplier supporting a 4096*9216 matrix and a 1*9216 vector is required, as described with respect to the serial and parallel matrix vector multipliers.

In the fully connected layer 2, at least one matrix vector multiplier supporting a 4096*4096 matrix and a 1*4096 vector is required, as described with respect to the serial and parallel matrix vector multipliers.

In the fully connected layer 3, at least one matrix vector multiplier supporting a 1000*4096 matrix and a 1*4096 vector is required, as described with respect to the serial and parallel matrix vector multipliers.

In conclusion, a complete ALEXnet network accelerator can be formed by the above number of matrix vector multipliers, pooling devices and convolvers and in combination a corresponding control system. If it is necessary to increase the computation speed, the parallel input mode can be taken into consideration. Accordingly, more computation devices will be used, and a higher computation speed is obtained.

The control system may be a digital circuit, or may be various logic control units such as a computer, a single-chip microcomputer or an FPGA.

Compared with the traditional neural network accelerators, the use of this scheme for neural network acceleration has the following advantages:

The level of integration is high, and the acceleration operation is completed by a few photoelectric computing units.

Based on the characteristic that the matrix weight, the convolution kernel and the average denominator in the matrix vector multiplication, the convolution operation and the pooling operation remain unchanged during multiple operations, inputting the operation quantities by optical inputting can fully utilize the storage characteristic of the optical input.

Schemes for a CT Algorithm Accelerator

The present invention provides various specific implementations of photoelectric computation devices and photoelectric computing methods. The acceleration of a CT algorithm is realized by using a plurality of light emitting units and a plurality of photoelectric computing units described in the above embodiments.

The number of output terminals of this CT algorithm accelerator specifically depends on the number of output terminals of the used photoelectric computing unit. For example, if the photoelectric computing unit having two output terminals in the above embodiments is used, the CT algorithm accelerator has two output terminals too. In the following detailed description, it is defaulted to use a photoelectric computing unit having one output terminal.

Like the serial and parallel matrix vector multipliers, if the number of the used photoelectric computing units is greater than the number of photoelectric computing units actually required, the accuracy of the result of operation will not be influenced.

Scheme Using the First Embodiment of the Photoelectric Computing Unit:

The CT algorithm will be roughly described below. CT, called computed tomography, uses a computer with high sensitivity to create cross-sectional images of a certain part of the human body by using precisely collimated X-rays, γ-rays, ultrasonic waves or the like. The CT has the characteristics of less scan time, clear images and the like.

Figure 36:
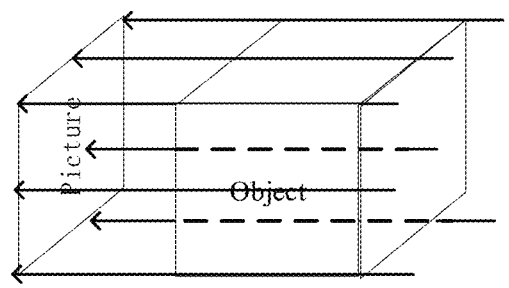
FIG. 36 shows a schematic view of X-ray photographing and CT photographing according to the present invention.
Figure 36:
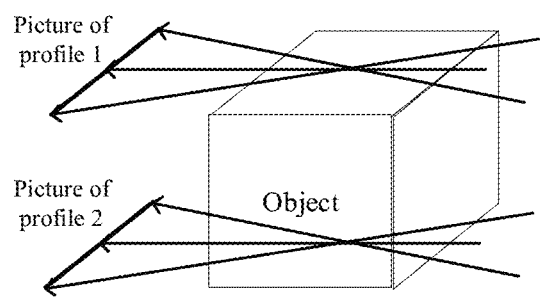

CT photographing greatly differs from X-ray photographing. As shown in FIG. 36 from the top down, an object is photographed by X-rays and by CT, respectively.

CT photographing is a method to determine the distribution of substances inside a profile by the received intensity of X-rays passing, from different angles, through the profile of an object to be observed. An algorithm of converting multiple groups of received one-dimensional intensities of X-rays incident into different profiles from different angles into multiple groups of two-dimensional distribution pictures of two-dimensional substances in different profiles is called CT algorithm.

Figure 37:
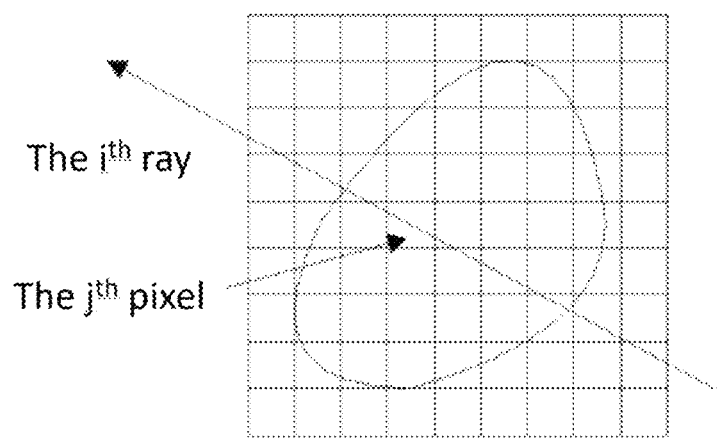
FIG. 37 shows a schematic view of a CT algorithm according to the present invention, where the $i^{th}$ ray passes through the $j^{th}$ pixel.

The CT algorithm will be roughly described below. As shown in FIG. 37, a sectional view of the profile of an irregularly-shaped object (i.e. an object to be photographed) is shown. A plurality of X-rays pass through the profile from different angles, where the $i^{th}$ ray passing through the profile is a ray incident from the angle shown in the figure. The sectional view of this object is a tomogram that is to be restored by CT photographing and the CT algorithm. This tomogram is divided into pixels. Starting from the first row and the first column, the first pixel is located in the first row and the first column. There are total N pixels. The $i^{th}$ X-ray exactly passes through the $j^{th}$ pixel.

The X-rays will be absorbed when passing through an object. The amount of absorption is different according to different types of substances (water, cell tissues, bones, etc.). The substances in the photographed object can be indirectly determined by determining the amount of absorption. In the sectional view shown in FIG. 37, there are different types of substances at the positions of different pixels. Therefore, X-rays will be absorbed to different extents after passing through these pixels. Due to different substances through which X-rays incident from different angles pass, the residual energy of the X-rays after being emergent from the object is different. It is defined that the gray value of each pixel in the cross-section of the object shown in FIG. 37 represents the residual energy of the X-ray after passing through this object per unit pixel area. If the gray value is higher, it is indicated that the loss of energy of the X-ray after passing through this pixel is less. Therefore, for the $i^{th}$ ray, if this ray passes through the object from the angle shown in FIG. 37, the residual energy $p_i$ is:

$$p_i = \omega_{i1}x_1 + \omega_{i2}x_2 \ldots + \omega_{iN}x_N \quad (18\text{-}1\text{-}1)$$

In the equation 18-1-1, $\omega$ represents the penetration coefficient, and $\omega_{ij}$ indicates whether the $i^{th}$ ray passes through the $j^{th}$ pixel. If the $i^{th}$ ray passes through the $j^{th}$ pixel, it is indicated that part of energy of the $i^{th}$ ray is absorbed by the object in the $j^{th}$ pixel, so $\omega_{ij}=1$. $x_j$ is the coefficient of absorption of the $j^{th}$ pixel to the X-ray, i.e., the gray value of the $j^{th}$ pixel in the tomogram to be reconstructed, and is a quantity to be solved. If the $i^{th}$ ray does not pass through the $j^{th}$ pixel, it is indicated that the $j^{th}$ pixel does not absorb energy of the $i^{th}$ ray, so $\omega_{ij}=0$, where $\omega$ is the projection coefficient.

In conclusion, if the equation for the $i^{th}$ ray is shown by (18-1-1), the equation for all rays (total L rays) is shown by (18-1-2):

$$\omega_{11}x_1 + \omega_{12}x_2 + \omega_{13}x_3 + \ldots + \omega_{1N}x_N = p_1 \quad (18\text{-}1\text{-}2)$$
$$\omega_{21}x_1 + \omega_{22}x_2 + \omega_{23}x_3 + \ldots + \omega_{2N}x_N = p_2$$
$$\ldots$$
$$\omega_{L1}x_1 + \omega_{L2}x_2 + \omega_{L3}x_3 + \ldots + \omega_{LN}x_N = p_L$$

The equation (18-1-2) is a system of multivariate equations, where x is the gray value of pixels in the tomogram to be reconstructed, i.e., a quantity to be solved, and other quantities are known quantities. It can be known from the knowledge of the linear algebra that, if L is greater than or equal to N, this equation has a unique solution, that is, the tomogram can be restored.

Generally, the method to solve the equation is called algebraic reconstruction algorithm.

If the equation (18-1-2) is a system of 2 equations each having 2 unknown quantities, rather than a system of L equations each having N unknown quantities, the two equations can represent two lines in a two-dimensional plane. Since the equations are solvable, the two lines must have an intersection, and the coordinates of this intersection is the solution of the system of equations. A method to quickly solve the system of equations includes the following steps:

One point in the plane is randomly selected as an initial iteration point.

A projection point of the initial iteration point on the line represented by the first equation in the system of equations is obtained, and this projection point is used as a second iteration point.

A projection point of the second iteration point on the line represented by the second equation in the system of equations is obtained, and this projection point is used as a third iteration point.

The third iteration point is further projected onto the first line and then onto the second line, the iterations are repeated until the convergence occurs, and the point is an intersection of the two lines, i.e., the solution for the equations.

Figure 38:
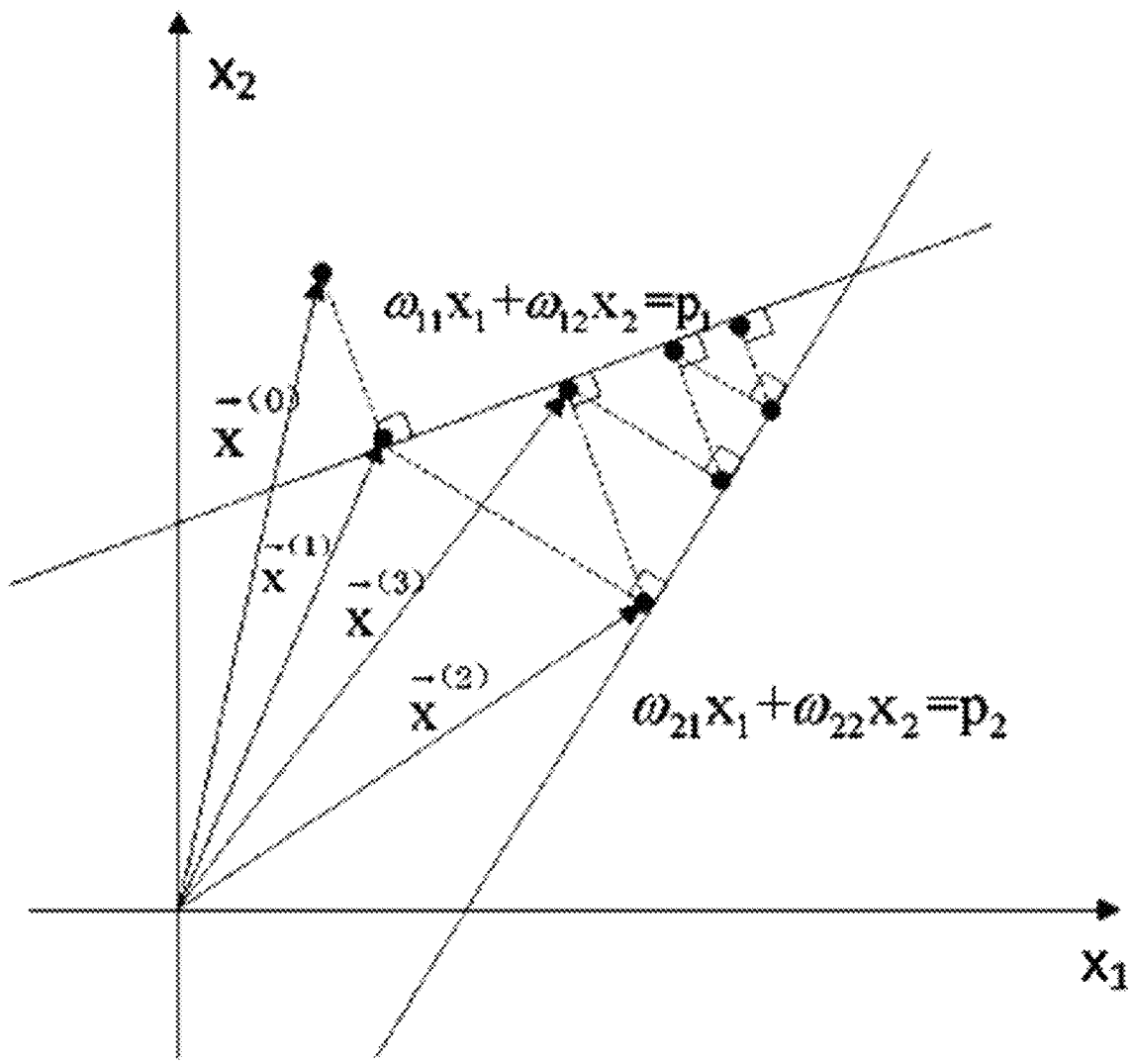
FIG. 38 shows a schematic view of a CT algorithm according to the present invention.

The process of the iterative projection is shown in FIG. 38.

The mathematical expression of the process is an iterative equation (18-1-3):

$$\vec{x}^{(i)} = \vec{x}^{(i-1)} - \frac{(\vec{x}^{(i-1)} \cdot \vec{\omega}_i - p_i)}{\vec{\omega}_i \cdot \vec{\omega}_i} \vec{\omega}_i \quad (18\text{-}1\text{-}3)$$

where $\vec{x}^{(i)} = (x_0^{(i)}, x_1^{(i)}, x_2^{(i)}, \ldots x_N^{(i)})$ is a projection point during the $i^{th}$ projection, i.e., a result vector during the $i^{th}$ iteration; and, $\vec{\omega}_i = (\omega_{i0}, \omega_{i1}, \omega_{i2}, \ldots \omega_{iN})$ is a coefficient for the multi-dimensional spatial plane during the $i^{th}$ projection (a coefficient for the system of equations) and is also a projection coefficient vector when the ray corresponding to this system of equations passes through the cross-section. For the equation (18-1-3), the solution $\vec{x}^{(i)}$ for the system of equations is more accurate if there are more iterations.

In the iterative equation (18-1-3), it is required to perform the vector-vector multiplication $\vec{x}^{(i)} * \vec{\omega}_i$ repeatedly, and the matrix formed by all vectors $\vec{\omega}_i$ is called a system matrix $\omega$ in the CT algorithm:

$$\begin{pmatrix} \omega_{11} & \omega_{12} & \ldots & \omega_{1N} \\ \omega_{21} & \omega_{22} & \ldots & \omega_{2N} \\ \vdots & \vdots & \ddots & \vdots \\ \omega_{L1} & \omega_{L2} & \ldots & \omega_{LN} \end{pmatrix} \quad (18\text{-}1\text{-}4)$$

The actual physical meaning of $\vec{\omega}_i$ is whether the ray passes through the pixel. If the ray passes through the pixel, it is 1; and, if the ray does not pass through the pixel, it is 0. Since the emission angle of rays of a CT machine is mostly a fixed angle, for multiple times of CT photographing, the system matrix $\omega$ is mostly a fixed value. Therefore, by inputting the data in the system matrix based on the storage characteristic of the optical input terminal of the photoelectric computing unit described in the first scheme of the invention 1, both the energy efficiency ratio and the operation speed will be greatly improved.

Figure 39:
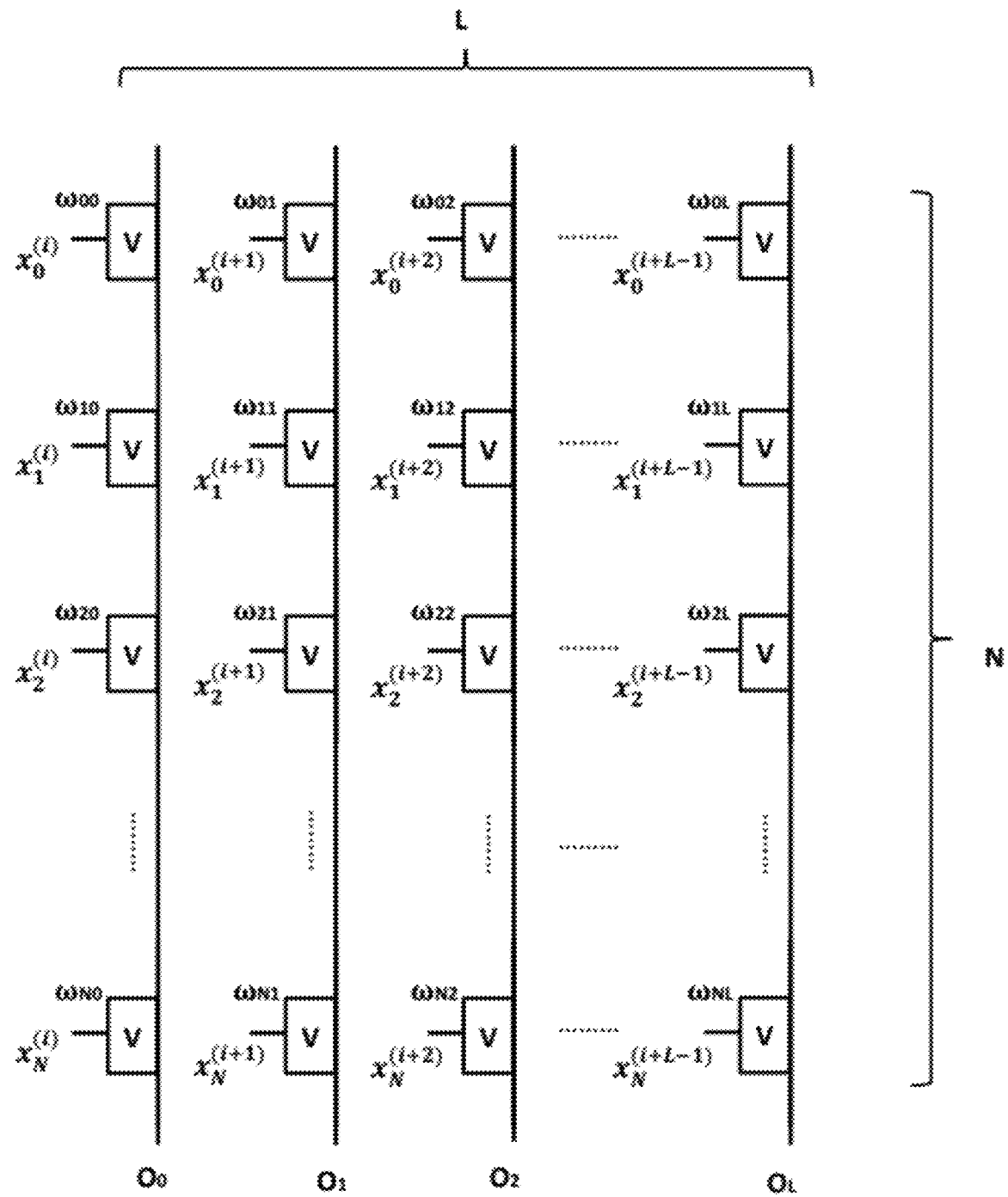
FIG. 39 shows a schematic view of a serial CT algorithm accelerator according to the present invention.

The key of the equation (18-1-3) is the vector-vector multiplication $\vec{x}^{(i)} * \vec{\omega}_j$. Therefore, the acceleration of computation in this step can be realized by using the unit array shown in FIG. 39, where each block marked with V represents one photoelectric computing unit using the first scheme. By taking a CT algorithm in which the system matrix is N*L in size and there are L X-rays as an example, if the electrical input terminal data is input serially, the number of the photoelectric computing units to be used is N*L. Those photoelectric computing units are arranged in N rows and L columns, and the output terminals of the P-type substrates, as the carrier collection and readout regions, of all units in a same column are connected together so that the results of operation are converged, and the control gates, as the carrier control regions, of all units are independent of each other.

When in use, all the pieces of data in the system matrix are input, in one-to-one correspondence, into an array having the same dimension as the system matrix from the optical input terminal. The optical input terminal is used as a system matrix input terminal of the CT algorithm accelerator. Then, iteration begins. During the first iteration, an initial iteration value is randomly generated and substituted into the equation (18-1-3). The initial iteration value is converted into binary data and then serially input into the units in the first column of the array from the electrical input terminal of the array. Similar to the serial matrix vector multiplier, after the optical input data and the electrical input data are multiplied, the data is converged and output in form of current. Then, the current is shifted and accumulated in the control system to obtain a result of vector multiplication during this iteration. Other operations, except for the vector multiplication, are completed in the control system. So far, this iteration is completed. The result of this iteration is used as an electrical input quantity for a next iteration, converted into binary data and then serially input into the units in the second column of the array. After the optical input data and the electrical input data are multiplied, the data is converged and output in form of current. Then, the current is shifted and accumulated in the control system to obtain a result of vector multiplication during this iteration. Other operations, except for the vector multiplication, are completed in the control system. So far, the second iteration is completed. By that analogy, after the $L^{th}$ iteration is performed in the $L^{th}$ column of the array, the input data of the $(L+1)^{th}$ iteration is input into the first column of the array until an accurate result of iteration is obtained. Then, this result is output to a display system by the control system. Then, the resulting CT image can be viewed.

If a CT algorithm accelerator using a parallel input mode is used, it is only required to change the number of the used units to k times of the original number, where k is the bit width of elements in the matrix to be convoluted. Meanwhile, the units are divided into k groups of arrays each having the same dimension as the system matrix, and all the output terminals of the units in a same column are connected together. The electrical input terminal data is input in parallel by a method similar to that for the parallel matrix vector multiplier.

The control system may be a digital circuit, or may be various logic control units such as a computer, a single-chip microcomputer or an FPGA.

Schemes Using the Photoelectric Computing Units According to the Second, Third and Fourth Embodiments:

Like the first scheme, in the second, third and fourth schemes, the CT algorithm acceleration can also be realized in a serial or parallel input mode. Therefore, the operation can also be completed by replacing the above-described CT algorithm accelerator formed by the photoelectric computing units in the first scheme with a matrix vector multiplier formed by the photoelectric computing units in the second, third and fourth schemes, except for the following differences:

If the second photoelectric computation scheme is used, since the P-type substrate device is replaced with an N-type substrate device, the polarities of the voltages at the control gate and the substrate are reversed, and the magnitudes of the voltages are also to be modulated.

If the third photoelectric computing unit scheme is used, since collection is performed in the charge coupled layer rather than in the P-type substrate due to the change of the optical input mode, the optical input quantity is to be modulated again.

If the fourth photoelectric computing unit scheme is used, instead of the control gate, the drain of the reset transistor is used as the carrier control region.

Compared with the traditional CT algorithm accelerators, the use of this scheme for CT algorithm acceleration has the following advantages:

The level of integration is high, and the acceleration operation is completed by a few photoelectric computing units.

Based on the characteristic that the system matrix in the CT algorithm remains unchanged during multiple operations, inputting the operation quantities by optical inputting can fully utilize the storage characteristic of the optical input.

Scheme for a Single-Precision Floating-Dot Multiplier

The present invention provides various specific implementations of photoelectric computation devices and photoelectric computing methods. An operation of multiplying two single-precision floating-dot numbers is realized by using the high-bit-width multiplier and the photoelectric adder selected from one of the first, second and third adders.

The single-precision floating-dot number is a real number with a fractional part expressed in a manner similar to the scientific notation. One single-precision floating-dot number is 32 bits wide, where 1 bit is a sign bit, which is used to indicate a positive or negative sign by a binary number; 8 bits are exponent bits, which are used to indicate numbers on the left of the decimal point by 8 binary numbers; and, 23 bits are mantissa bits, which are used to indicate numbers on the right of the decimal point by 23 binary numbers, as shown in the equation (19-1-1):

$$(1)_{sign\ bit}(10000111)_{exponent\ bit}$$
$$(10000000000000000000000)_{mantissa\ bit} = (-1)$$
$$1 * 2^{1000111 -}$$
$$01111111 * 1.10000000000000000000000 = -2^{135-}$$
$$127 * 1.5 = -384 \qquad (19\text{-}1\text{-}1)$$

Therefore, the process of multiplying two floating-dot numbers A and B is shown in the equation (19-1-2):

$$A = (A)_{sign\ bit}(A)_{exponent\ bit}(A)_{mantissa\ bit} \qquad (19\text{-}1\text{-}2)$$
$$B = (B)_{sign\ bit}(B)_{exponent\ bit}(B)_{mantissa\ bit}$$
$$A * B = (A)_{sign\ bit} * (B)_{sign\ bit} * 2^{(A)_{exponent\ bit} + (B)_{exponent\ bit} - 2*127} *$$

-continued $$(A)_{mantissa\ bit} * (B)_{mantissa\ bit} =$$

$$(A*B)_{sign\ bit}(A + B - 01111111)_{exponent\ bit}(A*B)_{mantissa\ bit}$$

It is easy to know that the multiplication of two single-precision floating-dot numbers is multiplying the sign bits of the two single-precision floating-dot numbers, adding the exponent bits and then subtracting 127 from it, and multiplying the mantissa bits.

In conclusion, in the photoelectric single-precision floating-dot multiplier, three operations, i.e., multiplication of operation sign bits, addition of exponent bits and multiplication of mantissa bits, are to be performed. For the sign bits, it is only required to determine whether the sign is a positive sign or a negative sign by a general logic. For the exponent bits, addends that are 8 bits wide are added and 01111111 is subtracted from the result of addition, and this operation can be performed simply by using the first, second and third adders. For the multiplication of two multiplier factors that are 23 bits wide at mantissa bits, due to the large bit width of the multiplier factors, the operation is to be performed by using the high-bit-width multiplier described above. The photoelectric computation multiplier selected from one of the multipliers described above is generally suitable for the multiplication of input multiplier factors that are 16 bits wide at most, with an input accuracy of the optical input terminal being about 8 bits.

The two single-precision floating-dot numbers to be multiplied are split into sign bits, exponent bits and mantissa bits by the control system, wherein the sign bits are determined to be positive signs or negative signs by the control system; the exponent bits are input into two high-bit-width multiplier factor input terminals of the high-bit-width multiplier; and the mantissa bits are input into two addend input terminals of the photoelectric adder. The three output results are returned to the control system, and recombined in the control system to obtain single-precision floating-dot numbers. In this way, the complete multiplication of single-precision floating-dot numbers is completed.

Based on the photoelectric properties of the semiconductor material, the present invention discloses a basic photoelectric hybrid operation method and an operation device. Since the semiconductor material can be highly sensitive to the incident photons and can store optical signals for a long period of time, and it is easy for the semiconductor material itself to improve the level of integration, the present invention can substantially improve the computing technology.

Compared with the traditional single-precision floating-dot multipliers, the use of this scheme for a single-precision floating-dot multiplication operation has the following advantages:
1. The level of integration is high, and the single-precision floating-dot multiplication operation can be realized by a few photoelectric computing units.
2. The optical input data can be stored and can be saved in the device for a long period of time after light is cut off, so it is unnecessary to perform the optical input operation again for a next operation.

Claims of a Digital Control Logic

The present invention provides a digital logic control system for a photoelectric computation module, which is used to control the state and data input/output of the photoelectric computation module.

The operation method of the digital control logic will be briefly described below by taking a digital logic control system for the parallel matrix vector multiplication photoelectric computation module as an example.

The matrix vector multiplication is operated by the parallel matrix vector multiplication photoelectric computation module:

$$A*W = [A_0 A_1 \ldots A_n] \begin{bmatrix} W_{00} & W_{01} & \ldots & W_{0m} \\ W_{10} & W_{11} & \ldots & W_{1m} \\ W_{20} & W_{21} & \ldots & W_{2m} \\ \ldots & \ldots & & \ldots \\ W_{n0} & W_{n1} & \ldots & W_{nm} \end{bmatrix} \quad (20\text{-}1\text{-}1)$$

If each element in the matrix W is 8 bits wide, a parallel-input matrix vector multiplication module capable of performing an operation of A*W is formed by at least 8 groups of photoelectric computing arrays each having n columns and m rows of units.

If units of the least number are used, a computation module is formed by 8 groups of units in n columns and m rows, the carrier control regions in a same row of a same array are connected, and the output terminals of the carrier collection and readout regions in a same column of a same array are connected, as described in the description 14.

Firstly, the digital control array for the photoelectric computation module is divided into the following portions: a data input portion, an optical input control portion, an optical reception control portion, an electrical input and reception control portion, an output control portion and a self-check control portion. The controlled object includes 8 groups of n*m photoelectric computing arrays, a power supply module for supplying power to these arrays, and a driver for driving a light emitting array.

The power supply module can supply various voltages required by functional regions of the photoelectric computing arrays in states such as receiving optical signals, receiving electrical signals, operating and outputting, resetting optical signals. For the first embodiment of the photoelectric computing unit in the invention 1, in the state of receiving optical signals, −3 V is to be applied to the P-type substrate; in the state of receiving electrical signals, 4 V or 0 V is to be applied to the control gate; in the state of outputting, 0.5 V is to be applied between the source and drain of the MOSFET in the readout region of the P-type substrate; and, in the state of resetting, 1 V is to be applied to the substrate. Thus, the power supply module for supplying power needs to at least supply voltages of −3 V, 0 V, 1 V and 4 V, and can supply the voltages to the corresponding parts of the units in the array at a desired moment under the control of the digital control logic.

The complete operation process will be described below.
1) Data Input

Matrix data W and vector data A are input into the data input portion, then transmitted to the optical input control portion and the electrical input and reception control portion by the data input portion, and stored in a register.
2) Optical Input Each element in the matrix data W in the register of the optical input control portion is converted into the duration for the light emitting units in the light emitting array to emit light; and the duration is transmitted to the driver of the light emitting array, and converted into pulse by the driver to drive the light emitting array to emit light. In this way, the optical input is realized.

3) Optical Reception

At the same time of the optical input, a state signal of receiving optical signals is transmitted to the power supply module by the optical reception control portion, and the power supply module changes the power supply voltage so that the units in the computing array enter an optical reception state. For example, if the photoelectric computing units according to the first embodiment in the invention 1 are used, upon receiving the state signal of receiving optical signals, the power supply module applies −3 V to the P-type substrate, floats the source and drain in the readout region and applies 0 V to the control gate, so that a depletion layer is formed in the P-type substrate. When photons are incident into the P-type substrate again, the photons will be absorbed to generate photo-generated carriers. In this way, the optical input is completed.

4) Electrical Input and Reception

At the end of the optical input, the driver is controlled by the optical input control portion to stop light emission. Then, a state signal of electrical input is transmitted to the power supply module by the electrical input receiving portion, so that the units in the computing array enter an electrical input state. The vector data A in the register is input, in parallel, into the carrier control regions of the computing array. If the photoelectric computing units according to the first embodiment in the invention 1 are used, the power supply module needs to apply a voltage of 0 V or 3 V to the control gate. The specific application of 0 V or 3 V is controlled by the electrical input and reception control portion. If the electrical input quantity for this unit should be 0, a voltage of 0 V is applied to the control gate; and, if the electrical input quantity is 1, a voltage of 3 V is applied to the control gate. Meanwhile, −3 V is still applied to the P-type substrate, and the source and drain in the readout region are still floating.

5) Operation and Readout Process

At the end of the electrical input, a state signal of outputting the result of operation is transmitted to the power supply module by the output control portion, so that the photoelectric computing units enter an output state. If the photoelectric computing units according to the first embodiment in the invention 1 are used, the power supply module needs to apply a voltage difference of 0.5 V between the source and drain in the readout region, and the voltage of −3 V at the P-type substrate and the voltage of 0 V/3 V at the control gate are maintained. The output current, as the result of operation, is converged and then subjected to AD conversion. The output control portion transmits a signal of starting AD conversion to an AD convertor. At the end of conversion, the AD convertor outputs a result of conversion and a conversion end signal to the output control portion. Upon receiving the conversion end signal, the output control portion transmits the received result of conversion to a shifter and an accumulator for shifting and accumulation to obtain a final result vector of the A*W operation. This result is stored in the register, and a state signal of ending the operation is transmitted to the power supply module. The power supply module ends this operation. If the photoelectric computing units according to the first embodiment in the invention 1 are used, the power supply module needs to cancel the voltage difference of 0.5 V applied between the source and drain in the readout region and the 0 V/3 V electrical input binary signal at the control gate when ending the operation. However, −3 V at the P-type substrate remains unchanged to maintain the "storage" of the optical input signals. The process waits for a next operation.

6) Resetting of the Optical Input Signal

If the optical input data does not participate in the subsequent operations and a next optical input operation is to be performed again after this operation is completed, an optical input data reset signal is transmitted to the power supply module by the output control portion, and the power supply module resets the optical input data in the units in the computing array. If the photoelectric computing units according to the first embodiment in the invention 1 are used, the power supply module needs to apply a voltage of 1 V to the P-type substrate and a voltage of 0 V to the control gate, and the source and drain in the readout region are maintained floating. At the end of resetting, the output control portion transmits a reset completion signal to the power supply module, and the power supply module stops supplying power. The process waits for a next optical input operation.

7) Self-Check Process

The self-check process occurs prior to the operation of the computation module, and is used to check whether the units in the computing array are damaged.

If it is necessary to perform self-check before the operation, the self-check control portion transmits a state signal to the power supply module, and the power supply module begins the self-check of the first row of all columns in all groups. If the photoelectric computing units according to the first embodiment in the invention 1 are used, the power supply module needs to apply a voltage of 3 V to the control gate and a voltage of 0.5 V between the source and drain in the readout region. The output current is output to the self-check control portion through the output terminals in each column. If it is found that there is no current output from the output terminals in a certain column, it is determined that the first unit in this column is damaged. Then, the voltage of 3 V at the control gate is cancelled, and 0.5 V is still maintained between the source and drain in the readout region. The output current in each column is determined by the self-check control portion. If it is found that there is still current at the output terminals in a certain column after the voltage of 3 V at the control gate is cancelled, it is determined that the first unit in this column is damaged.

After the self-check of the first row is completed, the self-check control portion controls row shifting and begins the self-check of the second row under the same self-check conditions. This process is repeated until the self-check of all rows is completed. Then, the whole self-check process is completed.

Figure 40:
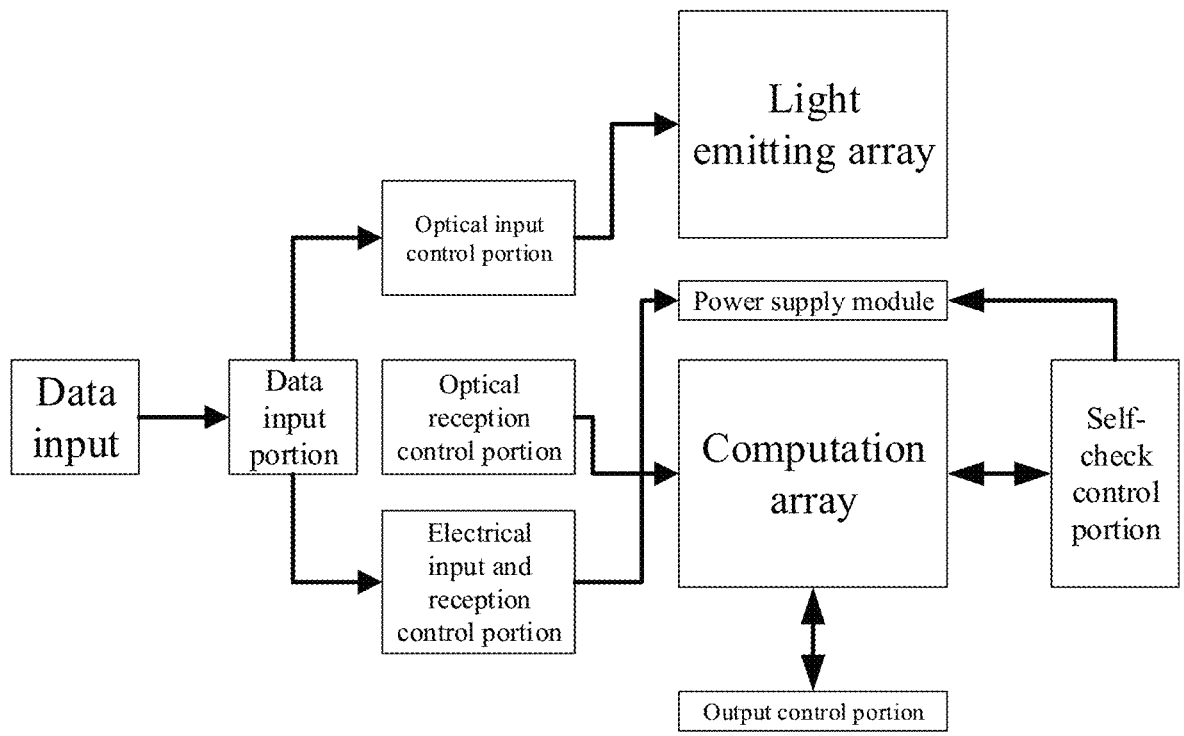
FIG. 40 shows a schematic view of a digital control logic according to the present invention.

The schematic view of the digital control logic is shown in FIG. 40.

The digital control logic can be specifically implemented as a digital circuit, a single-chip microcomputer, an FPGA or the like.

Further Embodiment

This embodiment provides an actually measured photo-response curve of a single photoelectric computing unit according to the first embodiment. Meanwhile, a model of the parallel-input matric vector multiplier and a model of the convolver are constructed by using the photo-response curve actually measured on this machine as a model of a single photoelectric computing unit, and a complete neural network accelerator constructed using the photoelectric computing unit according to the first embodiment is formed by means of the constructed models. By this accelerator model, the function of classifying and predicting images in a CIFAR-10 dataset by a complete AlexNet-like network (different from the standard AlexNet network mentioned in the scheme for the neural network accelerator) is simulated and inferred by the simulation software, and the accuracy of the result of operation is evaluated.

Figure 41:
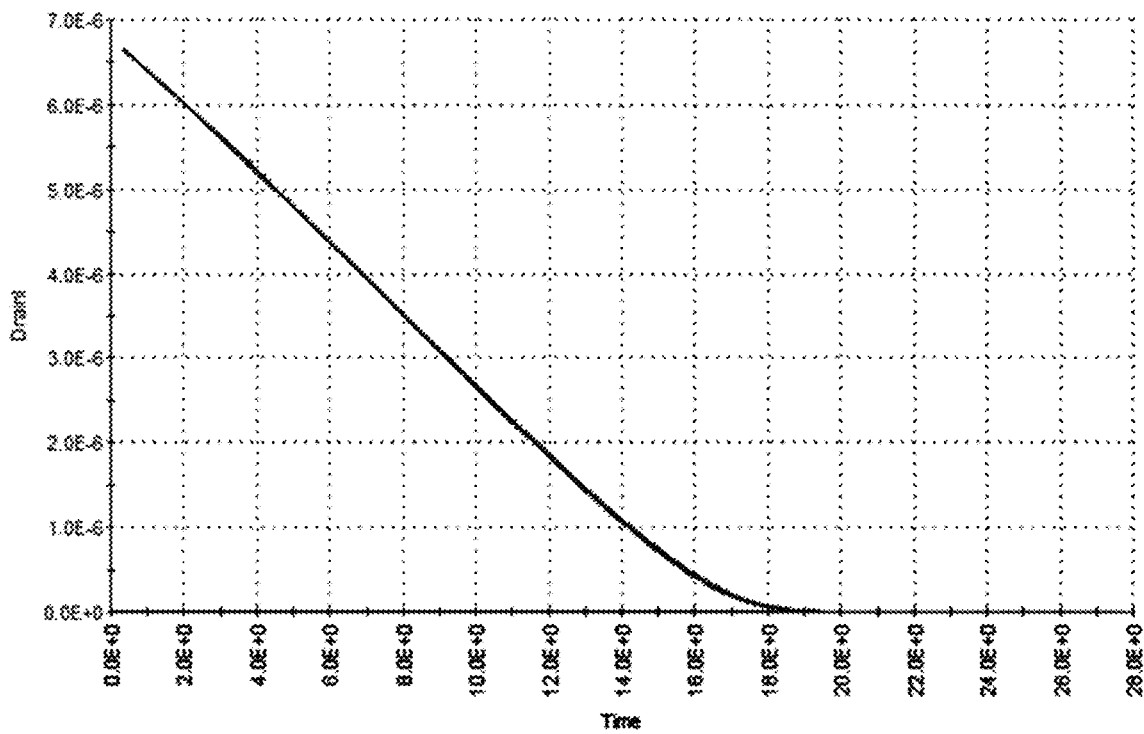
FIG. 41 shows a photo-response curve according to the present invention, when the photoelectric computing unit according to the first embodiment of the present invention is used.

Measured Result of a Single Photoelectric Computing Unit and Network Simulation Analysis Unit Parameters and Test Conditions The measured photo-response curve of the used photoelectric computing unit according to the first embodiment is shown in FIG. 41, wherein the x-coordinate is the number of incident photons X represented by the exposure time, the y-coordinate is the size of the result of operation from the output terminal of the MOSFET in the readout region in the P-type substrate as the carrier collection and readout region, and the result of operation is output in form of current. During tests, a voltage of 3 V is applied to the control gate as the carrier control region (i.e., $V_G$ plus 3 V), a voltage of −3 V is applied to the P-type substrate, and an output result corresponding to a proper source-drain voltage is provided.

It can be known that, except for the non-linearity at the end, the readout current of the photoelectric computing unit and the number of incident photons are good in linearity, as described in the equation (1-15) in the invention 1. In practical applications, higher accuracy of computation can be realized by removing the nonlinear part at the end.

To obtain a conservative result of simulation, the neural network accelerator is constructed by using the complete curve, without removing the nonlinear part at the end.

Network Structure and Dataset

The structure of the simulated AlexNet-like network model is shown in FIG. 42. The AlexNet-like network model consists of six convolution layers, five pooling layers and two fully connected layers, and uses ReLU as an activation function. To improve the running speed of the simulation program, no pooling device described above is used in the pooling layers. Instead, it is directly assumed that the pooling operation is performed by a general logic.

The function realized by this network is target recognition, and the used image dataset is a CIFAR-10 dataset. There are total 60000 color images in the dataset, and these images are 32*32*3 in size and classified into 10 categories each containing 6000 images. Among these images, 50000 images are used for training, and divided into 5 training batches each containing 10000 images; and the other 10000 images are used for testing, and form one batch. Firstly, the images in the dataset are used for training. After the converged weight is obtained, the weight is used in the network for inference, and the constructed neural network accelerator model is used to simulate and run the AlexNet-like network. Finally, the accuracy of the target recognition by the neural network accelerator model is obtained. Obviously, there are two factors resulting in the inaccuracy of the final recognition result. One factor is recognition error, which has nothing to do with the accuracy of computation during inference, resulted from the network itself and the imperfect weight obtained by training. The other factor is recognition error resulted from the computation error of the neural network accelerator model constructed by the single-transistor model of the computation device.

Accuracy of AD Conversion

It is easy to know from the description of the schemes for the parallel matrix vector multiplier and the convolver that, no matter at the output terminals in each column of the matrix vector multiplier or at the total output terminal of one convolution kernel of the convolver, one AD conversion must be provided to convert the simulated result of current operation into a digital quantity which is then fed into the control system to participate in the subsequent operations. Therefore, the accuracy of the AD conversion will greatly affect the accuracy of computation.

As described in the scheme for the parallel matrix vector multiplier, in the parallel matrix vector multiplier shown in FIG. 31, there are total k groups of arrays that are m*n in size. If one AD conversion is additionally provided in each column of each group of arrays, the value input from the optical input terminal is regarded to be within (−127,127), and the positive optical input value and the negative optical input value are input into different matrices, respectively (where the AD conversion is n bits wide, and there are m rows in the matrix in the matrix vector multiplication), the accuracy of the AD conversion is:

$$\frac{127*m}{2^{n+1}} \tag{21-1}$$

where 127 represents the maximum value of the output from a single photoelectric computing unit, i.e., the product of multiplying the maximum value 127 of the input from the optical input terminal by the maximum value 1 of the input from the electrical input terminal after binarization; and, 127*m is the maximum output value of the units in the whole column after current convergence. In a case where the optical input terminal data is input in form of positive and negative matrices, since there is a 50/50 chance for the numerical values in the positive matrix or negative matrix to be 0, during the actual computation, the value of m is to be divided by 2. The final accuracy of the AD conversion is shown in the equation 21-1.

By taking the fully connected layer 7 in the AlexNet-like network as an example, the matrix input in this layer is 2048*1024 in size, and the input vector is 2048*1 in size. If a single element in the vector is 8 bits wide, it is needed to use k=8 groups of arrays that are 2084 rows*1024 columns in size, and the AD conversion has 8 bits. In this case, the accuracy of the AD conversion is:

$$\frac{127*2048}{2^{8+1}} = 508 \tag{21-2}$$

That is, the minimum unit that can be recognized after the AD conversion is 508. The output less than this value will be abandoned. Consequently, the accuracy will be decreased to a certain extent.

Similarly, for the convolver, the accuracy will also be decreased due to AD conversion, and this will not be repeated.

Range of the Network Weight

For the fully connected layers in the network, the weight is matrix data.

The weight is derived from the training of the network. During training, the accuracy of the weight can be customized. For example, in the equation (21-2), the accuracy of the weight is regarded as 8 bit, i.e., (−127,127). During training, the higher the accuracy of the weight is, the higher the accuracy of the network is, if there is no any computation error. However, the operation load is higher. In an ideal network without any computation error, the results of the accuracy of the weight are shown in the following table. The results are the accuracy of target classification during inference.

|  | 8 bit (weight) | 7 bit (weight) | 6 bit (weight) | 5 bit (weight) | 4 bit (weight) |
|---|---|---|---|---|---|
| 8 bit (excitation) | 90.830 | 90.820 | 90.730 | 90.380 | 88.040 |

It can be known that, when the accuracy of the vector data is 8 bit, the difference between the weight accuracy of 8 bit and the weight accuracy of 4 bit is about 2%. Therefore, the weight accuracy of 4 bit is used for training; and after convergence, the trained 4 bit weight is input into the simulation model for simulation and inference. For the data in the convolution kernel in the convolution layer, 4 bit is used.

| Results of Network Simulation | |
|---|---|
| Layer No. | ITEM<br>Device Used |
| Conv1 | 128 3*3 convolvers |
| Conv2 | 128 3*3 convolvers |
| Conv3 | 256 3*3 convolvers |
| Conv4 | 256 3*3 convolvers |
| Conv5 | 512 3*3 convolvers |
| Conv6 | 512 3*3 convolvers |
| Fc1 | 2048*1024 matrix vector multiplier |
| Fc2 | 1024*10 matrix vector multiplier |
| Accuracy | 85.4% |
| Delay for a single layer | 0.164 ms |
| Total delay | 1.312 ms |

It can be known from the accuracy of simulation that, the accuracy of classification of the neural network accelerator model is 85.4%, which is only 3% less than the ideal accuracy result of 88% without any computation error. A higher accuracy is enough to accelerate the neural network.

Meanwhile, if the delay for a single AD conversion is 20 ns, the delay for each layer can be inferred as 0.164 ms, and one complete network inference needs 1.312 ms. This is a relatively short period of time compared to the retention time of the optical input data ranging from few seconds to few years (using the photoelectric computing unit according to the third embodiment). Even the retention time of few seconds is enough to perform thousands of complete network inferences within the time window of one optical input. If the neural network accelerator is applied in object recognition in video surveillance, the real-time video surveillance with hundreds of frames can be easily realized during the 1.312 ms for the complete network inference. To achieve this, regardless of the peripheral logic circuits, only about 2 million photoelectric computing units are to be used. It is supposed that the area of one photoelectric computing unit is 3 μm*3 μm, the chip will be less than 5 mm*5 mm in size. According to the measured results of a single photoelectric computing unit, the power of each photoelectric computing unit in the read state is only 0.1 μW. During the 1.312 ms for the whole network inference, each unit only needs to run for ⅛ of the time at most. The current leakage when the unit does not run can be ignored. Therefore, the total power of the chip is less than 0.05 W. With the same achieved computation capability, it is superior over the acceleration of the neural network inference by a GPU in terms of both the power consumption and the chip area.

Effects

The following table shows an estimated comparison diagram of a photoelectric in-memory computing chip and a TPU from Google in terms of power consumption, chip area, computation capability, manufacturing process and the like, where the parameters and performance indexes of the photoelectric in-memory computing chip are derived from the theoretical inference and simulation results.

| Name | TPU Google | Photoelectric in-memory computing chip |
|---|---|---|
| Computation capability | 92 TOPS (8 bits) | 256 TOPS (8 bits) |
| Power consumption (W) | 40 W | 4 W (where 1 W is for the computing array 3 W is for the digital control logic) |
| Operating frequency | 700 MHz | 10 MHz |
| Chip area | More than 300 mm$^2$ | Less than 150 mm2 |
| Process | 28 nm | 65 nm |
| Computation capability/power consumption | 2.3 TOPS/W | 64 TOPS/W |

It can be known that, even if the dominant operating frequency of the photoelectric in-memory computing chip is far less than that of the TPU chip, the number of operations per second of the photoelectric in-memory computing chip is far higher than that of the TPU chip. This is mainly because a single device in the computing array in the photoelectric in-memory computing chip can complete a multiplication operation, and the convergence of current realizes one addition operation. Therefore, a single unit can realize two operations within one mechanical period. Thus, the photoelectric in-memory computing chip is far superior to the TPU chip, and the chip area of the photoelectric in-memory computing chip is also less than that of the TPU chip. As another advantage of the photoelectric in-memory computing chip, since the optical input can be stored, the power consumption of the photoelectric in-memory computing chip will be far less than that of the TPU chip. In addition, the above parameters are obtained on the basis of 65 nm process, while the Google TPU chip is manufactured by a 28 nm process. This provides the possibility for the photoelectric in-memory computing chip to improve the device performance by reducing process nodes in future. Finally, it can be known that, according to the simulation and inference results, most of the power of the existing photoelectric in-memory computing chip is consumed by the digital control.

The foregoing description merely shows specific implementations of the present invention, and the protection scope of the present invention is not limited thereto. A person of ordinary skill in the art may easily conceive of various equivalent modifications or replacements within the technical scope disclosed by the present invention, and these modifications or replacements shall fall into the protection scope of the present invention. Therefore, the protection scope of the present invention shall be subject to the protection scope of the claims

What is claimed is:
1. A photoelectric computing unit, into which operation quantities are input in two manners, i.e., optical inputting and electrical inputting, the photoelectric computing unit comprising one semiconductor multifunctional area structure, wherein the semiconductor multifunctional area com- prises at least one carrier control region, at least one coupled region and at least one photo-generated carrier collection and readout region, wherein:

an operation quantity to be input optically, i.e., an optical input quantity, is input by converting incident photons into photo-generated carriers, and an operation quantity to be input electrically, i.e., an electrical input quantity, is input by directly injecting carriers;

the carrier control region is configured to control and modulate carriers in the photoelectric computing unit and used as an electrical input terminal of the photoelectric computing unit to be input with one operation quantity as an electrical input quantity; or, the carrier control region is configured to just control and modulate carriers in the photoelectric computing unit, with an electrical input quantity being input from other regions;

the coupled region is configured to connect a collection region with a readout region in the photo-generated carrier collection and readout region, so that photo-generated carriers generated by incidence of photons affect carriers in the photoelectric computing unit to form an operation relationship; and in the photo-generated carrier collection and readout region, the collection region is configured to absorb incident photons and collect the generated photo-generated carriers and is used as an optical input terminal of the photoelectric computing unit to be input with one operation quantity as an optical input quantity; the readout region is configured as an electrical input terminal of the photoelectric computing unit to be input with one operation quantity as an electrical input quantity and is also configured as an output terminal of the photoelectric computing unit to output carriers affected by the optical input quantity and the electrical input quantity as a unit output quantity; or, the electrical input quantity is input from other regions, and the readout region is used only as an output terminal of the photoelectric computing unit to output carriers affected by the optical input quantity and the electrical input quantity as a unit output quantity.

2. The photoelectric computing unit according to claim 1, comprising a control gate as the carrier control region, a charge coupled layer as the coupled region and a P-type substrate as the photo-generated carrier collection and readout region, wherein:

the P-type semiconductor substrate as the photo-generated carrier collection and readout region comprises a collection region on the left and a readout region on the right, wherein the collection region on the left is configured to form a depletion layer used for collecting photoelectrons, and the quantity of charges of the collected photoelectrons is read by the readout region on the right as an input quantity from the optical input terminal; and, the readout region on the right comprises a shallow trench isolation, an N-type drain terminal and an N-type source terminal and is used for reading, and can also be used as an electrical input terminal to be input with one operation quantity;

the charge coupled layer as the coupled region is configured to connect the collection region with the readout region in the photo-generated carrier collection and readout region, so that after a depletion region in the substrate in the collection region begins the collection of photoelectrons, the surface potential of the substrate in the collection region is affected by the number of the collected photoelectrons; and, through the connection by the charge coupled layer, the surface potential of the semiconductor substrate in the readout region is influenced by the surface potential of the semiconductor substrate in the collection region and further the magnitude of source-drain current in the readout region is influenced, and thus the number of photoelectrons collected in the collection region is read by determining the source-drain current in the readout region;

the control gate as the carrier control region is configured to form, in the readout region of the P-type semiconductor substrate, a depletion region used for exciting photoelectrons by applying one pulse voltage to the control gate, and can also be used as an electrical input terminal to be input with one operation quantity; and a bottom dielectric layer used for isolation is arranged between the P-type semiconductor substrate and the charge coupled layer, and a top dielectric layer used for isolation is arranged between the charge coupled layer and the control gate.

3. The photoelectric computing unit according to claim 1, comprising a control gate as the carrier control region, a charge coupled layer as the coupled region and a P-type substrate as the photo-generated carrier collection and readout region, wherein:

the P-type substrate as the photo-generated carrier collection and readout region comprises one N-type drain terminal and one N-type source terminal, is used for both light sensing and reading-out, and can also be used as an electrical input terminal to be input with one operation quantity;

the charge coupled layer as the coupled region is configured to store photoelectrons entering the charge coupled layer and change a unit threshold during reading to affect the source-drain current in the readout region, so that the number of photoelectrons generated during light sensing and entering the charge coupled layer is read by determining the source-drain current in the readout region;

the control gate as the carrier control region is configured to form, in the readout region of the P-type semiconductor substrate, a depletion region used for exciting photoelectrons by applying one pulse voltage to the control gate, and can also be used as an electrical input terminal to be input with one operation quantity; and a bottom dielectric layer used for isolation is arranged between the P-type semiconductor substrate and the charge coupled layer, and a top dielectric layer used for isolation is arranged between the charge coupled layer and the control gate.

4. The photoelectric computing unit according to claim 1, further comprising one light emitting unit optically corresponding to the photoelectric computing unit, the light emitting unit being configured to emit light to generate photo-generated carriers in the photoelectric computing unit, the photo-generated carriers being used as an optical input quantity for the photoelectric computing unit and interacting with an electrical input quantity that is input into the photoelectric computing unit from the electrical input terminal to obtain a result of photoelectric operation, wherein the light emitting unit is driven by one signal conversion driver, and the signal conversion driver is configured to convert a digital signal into the pulse width of a driving current pulse of the light emitting unit and drive a light emitting array formed by a plurality of light emitting units; or, a particular related light emitting unit is driven by addressing so that the related light emitting unit generates an optical signal of a corresponding duration, and the optical signal is set as an optical input quantity for the corresponding photoelectric computation unit, and the photoelectric computation unit is arranged in a two-dimensional or three-dimensional array to form a photoelectric computation module so as to realize various particular operations.

5. The photoelectric computing units according to claim 4, further comprising an optical structure of one layer or more layers between the light emitting array and the photoelectric computing array to realize a focusing mode of irradiating light from the light emitting array onto a predetermined position of the photoelectric computing array, so as to realize optical correspondence between the light emitting array and the photoelectric computing array.

6. A digital logic control method for a photoelectric computation module, which is used to control the photoelectric computation module according to claim 5, wherein:

a quantity to be operated is received by a data input portion of a digital control logic, data to be input optically is transmitted to an optical input control portion, and data to be input electrically is transmitted to an electrical input and reception control portion;

a driving device of a light emitting array is controlled by the optical input control portion of the digital control logic, so that the light emitting array generates photons representing the optical input quantity and the photons are incident into photoelectric computing units;

photoelectric computing units in a computing array are controlled by the optical input and reception control portion of the digital control logic, and according to specific operation steps, corresponding functional regions of the photoelectric computing units required to receive optical input data are set in an optical signal receiving state, to receive the incident photons representing the optical input quantity, thus to complete optical inputting;

the photoelectric computing units in the computing array are controlled by the electrical input and reception control portion of the digital control logic, and according to specific operation steps, corresponding functional regions of the photoelectric computing units required to receive electrical input data are set in an electrical signal receiving state, to receive the input carriers representing the electrical input quantity, thus to complete electrical inputting for the purpose of operation;

by an output control portion of the digital control logic, the output data generated by computation is correspondingly processed by different computing methods to output a desired result of computation; and a self-check signal is input into a photoelectric computing unit to be self-checked by a self-check control portion of the digital control logic, and a result of self-checking is obtained upon receiving a return signal from the photoelectric computing unit, thereby determining whether the photoelectric computing unit to be self-checked is abnormal.

7. The photoelectric computing unit according to claim 4, used as an adder, comprising one light emitting unit and one photoelectric computing unit, the photoelectric computing unit at least comprising a carrier control region, a coupled region and a photo-generated carrier collection and readout region, wherein:

the light emitting unit is configured to emit an optical signal representing a first addend;

the carrier control region is configured to control and modulate carriers in the photoelectric computing unit, and is used as an electrical input terminal of the photoelectric computing unit to be input with a second addend;

the coupled region is configured to connect the photo-generated carrier collection and readout region, and affect carriers in the readout region by using photo-generated carriers in the collection region in the photo-generated carrier collection and readout region; and the photo-generated carrier collection and readout region comprises one optical input terminal and at least one result output terminal, wherein the collection region in the photo-generated carrier collection and readout region is configured to absorb light emitted by the light emitting unit, generate and collect photo-generated carriers and input the first addend from the optical input terminal, both the first addend and the second addend affect carriers in the readout region in the photo-generated carrier collection and readout region, and the affected carriers are output, as a result of the adder, from the result output terminal, the photoelectric computation unit is used as an adder for adding a plurality of addends, comprising one light emitting unit and one photoelectric computation unit, the photoelectric computation unit at least comprising a carrier control region, a coupled region and a photo-generated carrier collection and readout region, wherein:

the light emitting unit is configured to emit an optical signal representing a first addend;

the carrier control region has a structure having a plurality of control regions arranged side by side to control and modulate carriers in the unit, and is used as an electrical input terminal of the adder to be input with a plurality of other addends;

the coupled region is configured to connect the photo-generated carrier collection and readout region, and affect carriers in the readout region by using photo-generated carriers in the collection region in the photo-generated carrier collection and readout region; and the photo-generated carrier collection and readout region comprises one optical input terminal and at least one result output terminal, wherein the collection region in the photo-generated carrier collection and readout region is configured to absorb light emitted by the light emitting unit and generate and collect photo-generated carriers, and is used as an optical input terminal of the adder to be input with one addend; a plurality of addends input from the electrical input terminal and the optical input terminal affect carriers in the readout region in the photo-generated carrier collection and readout region; and, the carriers in the photo-generated carrier readout region are output as a result of the adder from the result output terminal.

8. The photoelectric computing unit according to claim 4, used as an adder for adding at least two addends, comprising at least two light emitting units and at least two photoelectric computing units, each of the photoelectric computing units at least comprising a carrier control region, a coupled region and a photo-generated carrier collection and readout region, wherein:

the at least two light emitting units are configured to emit optical signals representing at least two addends;

output terminals of the at least two photoelectric computing units are configured to be connected to each other, wherein the carrier control regions of the at least two photoelectric computing units are configured to be input with a constant voltage value to control and drive carriers in the unit;

the coupled regions of the at least two photoelectric computing units are responsible for connecting the photo-generated carrier collection and readout regions, and are configured to affect carriers in the readout regions by using photo-generated carriers in the collection regions in the photo-generated carrier collection and readout regions; and each of the photo-generated carrier collection and readout regions of the at least two photoelectric computing units comprises one optical input terminal and at least one result output terminal, wherein the optical input terminals of the at least two photoelectric computing units are configured to receive the optical signals emitted by the at least two light emitting units, respectively, and the optical signals are used as addends of the adder, respectively; the at least two result output terminals are configured to output carriers in the readout regions in the photo-generated carrier collection and readout regions affected by the input quantities from the optical input terminals, and the carriers are output in form of current under the drive of a constant voltage; the current is then converged to obtain a final result, and the final result is output as the result of the addition operation.

9. The photoelectric computing unit according to claim 4, used as a multiplier, comprising one light emitting unit and one photoelectric computing unit, the photoelectric computing unit at least comprising a carrier control region, a coupled region and a photo-generated carrier collection and readout region, wherein:

the light emitting unit is configured to emit an optical signal representing a first multiplier factor;

the carrier control region is configured to be input with a constant voltage value to control and drive carriers in the unit;

the coupled region connects the photo-generated carrier collection and readout region, and is configured to affect carriers in the readout region by using photo-generated carriers in the collection region in the photo-generated carrier collection and readout region; and the photo-generated carrier collection and readout region comprises one optical input terminal, one electrical input terminal and at least one result output terminal, wherein the collection region in the photo-generated carrier collection and readout region is configured to absorb light emitted by the light emitting unit and generate and collect photo-generated carriers, and is used as an optical input terminal of the multiplier to be input with a first multiplier factor; the electrical input terminal is configured to be input with a second multiplier factor of the multiplier; and carriers affected by the first multiplier factor and the second multiplier factor in the readout region in the photo-generated carrier collection and readout region are used as carriers affected by the optical input quantity and the electrical input quantity and then output as a result from an output terminal of a photoelectron collection region and readout region.

10. The photoelectric computing unit according to claim 4, used as a multiplier, comprising one light emitting unit and one photoelectric computing unit, the photoelectric computing unit at least comprising a carrier control region, a coupled region and a photo-generated carrier collection and readout region, wherein:

the light emitting unit is configured to emit an optical signal representing a first multiplier factor;

the carrier control region is configured to control and modulate carriers in the unit and is used as an electrical input terminal of the photoelectric computing unit to serially input a second multiplier factor subjected to binary conversion in an order from high to low bits;

the coupled region is configured to connect the photo-generated carrier collection and readout region, and affect carriers in the readout region by using photo-generated carriers in the collection region in the photo-generated carrier collection and readout region; and the photo-generated carrier collection and readout region comprises one optical input terminal and at least one result output terminal, wherein the collection region in the photo-generated carrier collection and readout region is configured to absorb light emitted by the light emitting unit and generate and collect photo-generated carriers, and is used as an optical input terminal of the multiplier to be input with a first multiplier factor; the binarized input quantities at binary bits of the first multiplier factor and the second multiplier factor affect carriers in the readout region in the photo-generated carrier collection and readout region, and the carriers in the readout region are serially output, as a result of multiplication of values at bits of the first multiplier factor and the second multiplier factor, successively from the result output terminal and then shifted and spliced to obtain a final result of multiplication; or the photoelectric computation unit is used as a multiplier, comprising at least two light emitting units and at least two photoelectric computation units, each of the photoelectric computation units at least comprising a carrier control region, a coupled region and a photo-generated carrier collection and readout region, wherein:

the at least two light emitting units are configured to emit optical signals having a same numerical value, and the optical signals are used as a first multiplier factor;

the at least two photoelectric computation units are arranged in parallel without changing the optical correspondence between the light emitting units and the photoelectric computation units, wherein the carrier control regions of the at least two photoelectric computation units are configured to control and modulate carriers in the unit and input, in parallel and in an order from high to low bits, binarized data of a second multiplier factor subjected to binary conversion into the at least two photoelectric computation units arranged in parallel, as the electrical input terminal data of the multiplier, and the data is combined as the second multiplier factor;

the coupled regions of the at least two photoelectric computation units connect the photo-generated carrier collection and readout regions, and are configured to affect carriers in the readout regions by using photo-generated carriers in the collection regions in the photo-generated carrier collection and readout regions; and each of the photo-generated carrier collection and readout regions of the at least two photoelectric computation units comprises one optical input terminal and at least one result output terminal, wherein the optical input terminals of the at least two photoelectric computation units are configured to receive the optical signals emitted by the at least light emitting units; the at least two result output terminals are configured to output carriers in the readout regions in the photo-generated carrier collection and readout regions affected by bit data of the first multiplier factor and the second multiplier factor, the carriers are output from output terminals of at least two photoelectron collection region and readout regions and then shifted and accumulated to obtain a result, and the result is output as a result of the multiplier; or the photoelectric computation unit is used as a multiplier, comprising at least two light emitting units and at least two photoelectric computation units, each of the photoelectric computation units at least comprising a carrier control region, a coupled region and a photo-generated carrier collection and readout region, wherein:

the at least two light emitting units are configured to emit optical signals having a same numerical value, and the optical signals are used as a first multiplier factor;

the at least two photoelectric computation units are arranged in parallel without changing the optical correspondence between the light emitting units and the photoelectric computation units, and the output terminals are connected to each other, wherein the carrier control regions of the at least two photoelectric computation units are configured to control and modulate carriers in the unit and input, in parallel and in an order from high to low bits, binarized data of a second multiplier factor subjected to binary conversion into the at least two photoelectric computation units arranged in parallel as the electrical input terminal data of the multiplier, and the electrical input terminal data is used as the second multiplier factor;

the coupled regions of the at least two photoelectric computation units are responsible for connecting the photo-generated carrier collection and readout regions, and are configured to affect carriers in the readout regions by using photo-generated carriers in the collection regions in the photo-generated carrier collection and readout regions; and each of the photo-generated carrier collection and readout regions of the at least two photoelectric computation units comprises one optical input terminal, one electrical input terminal and at least two result output terminal, wherein the optical input terminals of the photoelectric computation units are configured to receive the optical signals emitted by the at least two light emitting units; the electrical input terminals are configured to be input with, in an order from high to low bits of input data in the carrier control regions, carriers representing bit weights; the at least two result output terminals output carriers in the readout regions in the photo-generated carrier collection and readout regions affected by both the bit data and bit weights of the first multiplier factor and the second multiplier factor; and the carriers are output in form of current under the drive of a constant voltage, and then converged and output as a final result of multiplication.

11. The photoelectric computing unit according to claim 4, which comprises a plurality of light emitting units and a plurality of photoelectric computing units to form a serial matrix vector multiplier, each of the photoelectric computing units at least comprising a carrier control region, a coupled region and a photo-generated carrier collection and readout region, wherein:

the light emitting units are configured to emit optical signals representing data in a matrix to be multiplied;

the photoelectric computing units are arranged in a unit array having the same number of rows and columns as the matrix to be multiplied, without changing the optical correspondence between the light emitting units and the photoelectric computing units, wherein output terminals of the photo-generated carrier collection and readout regions of all units in each column of the unit array are connected to each other, and the carrier control regions of all units in each row of the unit array are connected to each other;

the carrier control regions of all units in each row of the unit array are configured to control and modulate carriers in the unit and input, by column, carriers representing elements in vectors, and are used as vector data input terminals of the matrix vector multiplier, wherein, after the data of each element of the vector is converted into binarized data, the carriers representing the binarized data are input serially and bitwise into the carrier control region of each row;

the coupled regions of the photoelectric computing units are responsible for connecting the photo-generated carrier collection and readout regions, and are configured to affect carriers in the readout regions by using photo-generated carriers in the collection regions in the photo-generated carrier collection and readout regions; and in the photo-generated carrier collection and readout regions of the plurality of photoelectric computing units, each unit comprises one optical input terminal and at least one result output terminal, wherein the optical input terminals of the photoelectric computing units are configured to receive optical signals emitted by the corresponding light emitting units and input the data in the matrix, and are used as matrix data input terminals of the matrix vector multiplier; the result output terminals are configured to output carriers in the readout regions in the photo-generated carrier collection and readout regions affected by the matrix data and the vector data, the carriers are output in form of current under the drive of a constant voltage, and the current is then converged by column, and the result is output; the output result is shifted according to the input bits, and then accumulated to obtain a final result vector; or the photoelectric computation unit is used to form a parallel matrix vector multiplier and comprises a plurality of light emitting units and a plurality of photoelectric computation units, each of the photoelectric computation units at least comprising a carrier control region, a coupled region and a photo-generated carrier collection and readout region, wherein:

the light emitting units are configured to emit optical signals representing data in a matrix to be multiplied;

the photoelectric computation units are divided into multiple groups, and the units in each group are arranged in a unit array having the same number of rows and columns as the matrix to be multiplied, without changing the optical correspondence between the light emitting units and the photoelectric computation units, wherein output terminals of the photo-generated carrier collection and readout regions of all units in each column of the unit array are connected to each other, and the carrier control regions of all units in each row of the unit array are connected to each other;

the carrier control regions of all units in each row of each unit array are configured to control and modulate carriers in the unit and input, in parallel, by group and by column, carriers representing corresponding bit data of the elements in vectors after binarization, and the carrier control regions are used as vector data input terminals of the matrix vector multiplier;

the coupled regions of the plurality of photoelectric computation units are responsible for connecting the photo-generated carrier collection and readout regions, and are configured to affect carriers in the readout regions by using photo-generated carriers in the collection regions in the photo-generated carrier collection and readout regions; and in the photo-generated carrier collection and readout regions of the plurality of photoelectric computation units, each unit comprises one optical input terminal and at least one result output terminal, wherein the optical input terminals of the plurality of photoelectric computation units are configured to receive the optical signals emitted by the plurality of light emitting units and input the data in the matrix, and are used as matrix data input terminals of the matrix vector multiplier; the plurality of result output terminals are configured to output carriers in the readout regions in the photo-generated carrier collection and readout regions affected by the matrix data and the vector data, the carriers are output in form of current under the drive of a constant voltage, the current is then converged by column, shifted according to the input bits and accumulated to obtain a final result vector.

12. The photoelectric computing unit according to claim 11, which is used to form an average pooling calculator that performs a pooling operation on a matrix at least comprising two elements, the photoelectric matrix vector multiplier comprising one matrix input terminal, one vector input terminal and a result output terminal, wherein:

the photoelectric matrix vector multiplier, having one column and a same number of rows as the number of elements in the matrix to be pooled, is used as an average pooling calculator for the matrix to be pooled;

the vector input terminal of the photoelectric matrix vector multiplier, as an electrical input terminal to be input with different elements in the matrix to be pooled, is used as a to-be-pooled matrix input terminal of the pooling unit; and, the matrix input terminal, as an optical input terminal to be input with a matrix, which has one column and a same number of rows as the number of elements in the matrix to be pooled and in which each element is a reciprocal of the number of the elements in the matrix to be pooled, is used as an average denominator input terminal; and the result output terminal is configured to output a final average pooling result of the matrix to be pooled.

13. The photoelectric computing unit according to claim 4, which forms a serial convolver, each of the photoelectrical computing units at least comprising a carrier control region, a coupled region and a photo-generated carrier collection and readout region, wherein:

the light emitting units are configured to emit optical signals representing data in a convolution kernel;

the photoelectric computing units are arranged into an array having the same number of rows and columns as the convolution kernel, without changing the optical correspondence between the light emitting units and the photoelectric computing units, wherein the output terminals of the photo-generated carrier collection and readout regions of all units in the unit array are connected to each other to form an output terminal;

the carrier control regions of the photoelectric computing units in the array are configured to control and modulate carriers in the unit, and serially input carriers representing corresponding bit data of the elements in a matrix to be convoluted obtained after zero padding and the elements in a small matrix corresponding to the original position of the convolution kernel, and are used as to-be-convoluted matrix data input terminals of the convolver; and, the data in the small matrix is converted into binarized data, and the carriers representing the binarized data are input serially and bitwise into the carrier control regions of the units;

the coupled regions of the photoelectric computing units in the array connect the photo-generated carrier collection and readout regions, and are configured to make affect carriers in the readout regions by using photo-generated carriers in the collection regions in the photo-generated carrier collection and readout regions; and the photo-generated carrier collection and readout region of each photoelectric computing unit in the array comprises one optical input terminal and at least one result output terminal, wherein the optical input terminal is configured to receive the optical signal emitted by the light emitting unit and input the data in the convolution kernel, and is used as a convolution kernel input terminal of the convolver; the output terminal of each unit is configured to output carriers in the readout region in the photo-generated carrier collection and readout region affected by the corresponding bit data of the small matrix split from the matrix to be convoluted and the convolution kernel data; the carriers are output in form of current under the drive of a constant voltage, and the output current from all the photoelectric computing units in the array are converged by the output terminals connected in parallel, then shifted according to the input bits and accumulated to obtain a result of convolution operation corresponding to the current position of the convolutional kernel; the convolution kernel is moved according to the step size required by the convolution operation, data of the small matrix split from the data of the matrix to be convoluted corresponding to the current position of the convolution kernel is input again to obtain an output value, and then the convolution kernel is continuously moved until the whole convolution operation is completed; and, all the output values are recombined to obtain a matrix having a corresponding dimension, i.e., a final result of convolution operation; or the photoelectric computation unit forms a parallel convolver, the photoelectrical computation unit at least comprising a carrier control region, a coupled region and a photo-generated carrier collection and readout region, wherein:

the light emitting units are configured to emit optical signals representing data in a convolution kernel;

the photoelectric computation units are divided into multiple groups, and the photoelectric computation units in each group are arranged in an array having the same number of rows and columns as the convolution kernel, without changing the optical correspondence between the light emitting units and the photoelectric computation units, wherein the output terminals of the photo-generated carrier collection and readout regions of all units in the array of each group of photoelectric computation units are connected to each other to form an output terminal;

the carrier control regions of the photoelectric computation units in the array of each group of photoelectric computation units are configured to control and modulate carriers in the unit, and serially input carriers representing corresponding bit data of the elements in a matrix to be convoluted obtained after zero padding and the elements in a small matrix corresponding to the original position of the convolution kernel, and are used as to-be-convoluted matrix data input terminals of the convolver; and, the data in the small matrix is converted into binarized data, and the corresponding bit data is input into the unit array of the corresponding group;

the coupled regions of the photoelectric computation units in the array of each group of photoelectric computation units are responsible for connecting the photo-generated carrier collection and readout regions, and are configured to affect carriers in the readout regions by using photo-generated carriers in the collection regions in the photo-generated carrier collection and readout regions; and the photo-generated carrier collection and readout region of each photoelectric computation unit in the array of each group of photoelectric computation units comprises one optical input terminal and at least one result output terminal, wherein the optical input terminal is configured to receive the optical signal emitted by the light emitting unit and input the data in the convolution kernel, and is a convolution kernel input terminal of the convolver, and the arrays of different groups of photoelectric computation units receive the same optical input data; the output terminal of each unit is configured to output carriers in the readout region in the photo-generated carrier collection and readout region affected by the corresponding bit data of the small matrix split from the matrix to be convoluted and the convolution kernel data; the carriers are output in form of current under the drive of a constant voltage, and the output current from all the photoelectric computation units in the array are converged by the output terminals connected in parallel, then shifted according to the input bits and accumulated to obtain a result of convolution operation corresponding to the current position of the convolutional kernel; the convolution kernel is moved according to the step size required by the convolution operation, data of the small matrix split from the data of the matrix to be convoluted corresponding to the current position of the convolution kernel is input again to obtain an output value, and the convolution kernel is continuously moved until the whole convolution operation is completed; and, all the output values are recombined to obtain a matrix having a corresponding dimension, i.e., a final result of convolution operation.

14. The photoelectric computing unit according to claim 4, which is used to form a CT algorithm accelerator based on an algebraic reconstruction algorithm, each of the photoelectrical computing units at least comprising a carrier control region, a coupled region and a photo-generated carrier collection and readout region, wherein:

the light emitting units are configured to emit optical signals representing data in a system matrix in a CT algorithm;

the photoelectric computing units are arranged in an array having the same number of rows and columns as the system matrix, without changing the optical correspondence between the light emitting units and the photoelectric computing units, wherein output terminals of the readout regions in the photo-generated carrier collection and readout regions of all the photoelectric computing units in the same column of the unit array are connected to each other to form an output terminal, and output terminals in different columns are independent of each other;

the carrier control region of each photoelectric computing unit in the array is configured to control and modulate carriers in the unit and serially input carriers used as corresponding bit data of pixel data of a predicted image corresponding to the current number of iterations after binarization, and is used as a predicted image data input terminal of the CT algorithm accelerator;

the coupled regions of the photoelectric computing units in the array are responsible for connecting the photo-generated carrier collection and readout regions, and are configured to affect carriers in the readout regions by using photo-generated carriers in the collection regions in the photo-generated carrier collection and readout regions; and the photo-generated carrier collection and readout region of each photoelectric computing unit in the array comprises one optical input terminal and at least one result output terminal, wherein the optical input terminal is configured to receive the optical signal emitted by the light emitting unit and input data in the system matrix, and is used as a system matrix input terminal of the CT algorithm accelerator; the output terminal of each unit outputs carriers in the readout region in the photo-generated carrier collection and readout region affected by both the corresponding bit data of pixel data of the predicted image corresponding to the current iteration and the system matrix data, and the carriers are output in form of current under the drive of a constant voltage; the output current of all the photoelectric computing units in the array are converged by the output terminals connected in parallel in the same column, then shifted according to the input bits and accumulated, and subjected to a next iteration after other non-matrix vector multiplication operations in a control system are completed; during an initial iteration, the pixel data of the predicted image for the first iteration is input into the carrier control regions of the units in the first column of the array, and the output result obtained from the first column is processed by the control system and subjected to the second iteration; the pixel data of the predicted image for the second iteration is input into the carrier control regions of the units in the second column of the array; by that analogy, after the iterations of all columns are completed, a result is output and the iteration continues from first column again; and, after all iterations are completed, the data is output to the control system and then transmitted to a display system for imaging, so as to obtain a processed CT image; or the photoelectric computation unit is used to form a CT algorithm accelerator based on an algebraic reconstruction algorithm, the photoelectrical computation unit at least comprising a carrier control region, a coupled region and a photo-generated carrier collection and readout region, wherein:

the light emitting units are configured to emit optical signals representing data in a system matrix in a CT algorithm;

the photoelectric computation units are divided into multiple groups, and the photoelectric computation units in each group are arranged in an array having the same number of rows and columns as the system matrix, without changing the optical correspondence between the light emitting units and the photoelectric computation units, wherein output terminals of the readout regions in the photo-generated carrier collection and readout regions of all the photoelectric computation units in the same column of the array of each group of photoelectric computation units are connected to form an output terminal, and output terminals in different columns and in different groups of photoelectric computation units are independent of each other;

the carrier control region of each photoelectric computation unit in the array of each group of photoelectric computation units is configured to control and modulate carriers in the unit and input carriers used as corresponding bit data of pixel data of the predicted image corresponding to the current number of iterations after binarization in parallel, and is used as a predicted image data input terminal of the CT algorithm accelerator, wherein the predicted image data is converted into binarized data, and the corresponding bit data is input into the unit array of the corresponding group of photoelectric computation units;

the coupled regions of the photoelectric computation units in the array are responsible for connecting the photo-generated carrier collection and readout regions, and are configured to affect carriers in the readout regions by using photo-generated carriers in the collection regions in the photo-generated carrier collection and readout regions; and the photo-generated carrier collection and readout region of each photoelectric computation unit in the array comprises one optical input terminal and at least one result output terminal, wherein the optical input terminal is configured to receive the optical signal emitted by the light emitting unit and input data in the system matrix, and is used as a system matrix input terminal of the CT algorithm accelerator, and the arrays of different groups of photoelectric computation units receive the same optical input data; the output terminal of each unit outputs carriers in the readout region in the photo-generated carrier collection and readout region affected by the corresponding bit data of pixel data of the predicted image corresponding to the current iteration and the system matrix data, and the carriers are output in form of current under the drive of a constant voltage; the output current of all the photoelectric computation units in the array are converged by the output terminals connected in parallel in the same column, then shifted according to the input bits and accumulated, and subjected to a next iteration after other non-matrix vector multiplication operations in a control system are completed; during an initial iteration, the pixel data of the predicted image for the first iteration is input into the carrier control regions of the units in the first column of the array of each group of photoelectric computation units, and the output result obtained from the first column is processed by the control system and subjected to the second iteration; the pixel data of the predicted image for the second iteration is input into the carrier control regions of the units in the second column of the array of each group of photoelectric computation units; by that analogy, after the iterations of all columns are completed, a result is output and the iteration continues from first column again; and, after all iterations are completed, the data is output to the control system and then transmitted to a display system for imaging, so as to obtain a processed CT image.

15. A photoelectric computing method executed by a photoelectric computing unit, the photoelectric computing unit comprising at least one light emitting unit and at least one photoelectric computing unit, the photoelectric computing unit comprising one semiconductor multifunctional area structure, the semiconductor multifunctional area comprising a carrier control region, a coupled region and a photo-generated carrier collection and readout region, wherein the method comprises steps of:

configuring the light emitting unit to emit light, irradiating the light onto the photoelectric computing unit, and generating, under the control of the carrier control region, photo-generated carriers in a collection region in a photo-generated carrier collection and readout region as a first operation quantity for the photoelectric computing unit;

generating an electrical operation quantity in one region in the multifunctional area, and inputting corresponding carriers, the carriers being used as a second operation quantity for the photoelectric computing unit;

affecting carriers in the photo-generated carrier readout region by using both the photo-generated carriers as the first operation quantity and the carriers as the second operation quantity, the affected carriers being used as the result of photoelectric operation; and outputting, from an output terminal of the readout region in the photo-generated carrier collection and readout region, the carriers as the result of photoelectric operation.

16. The photoelectric computing method according to claim 15, which is used to perform an addition operation, wherein:

photo-generated carriers generated by photons emitted by the light emitting unit are used as a first addend;

carriers are injected into the carrier control region, and the carriers are used as a second addend; and in the photo-generated carrier collection and readout region, both the photo-generated carriers representing the first addend and the carriers representing the second addend affect carriers in the readout region in the photo-generated carrier collection and readout region, and the affected carriers are output, as a result of the addition operation, from the a photoelectron collection region and readout region; or the photoelectric computation method is used to perform an addition operation on a plurality of addends, wherein:

photo-generated carriers generated by photons emitted by the light emitting unit are used as a first addend;

the carrier control region is used as a multi-gate structure, and carriers input from a plurality of gates are used as a plurality of other addends; and in the photo-generated carrier collection and readout region, both the photo-generated carriers representing the first addend and the carriers representing other addends affect carriers in the readout region in the photo-generated carrier collection and readout region, and the affected carriers are output as a result of the addition operation from an output terminal of a photoelectron collection region and readout region.

17. The photoelectric computing method according to claim 15, which is used to perform an addition operation on at least two addends, wherein:

optical signals emitted by the at least two light emitting units are used as at least two addends of an adder, and are correspondingly irradiated onto at least two corresponding photoelectric computing units; and in the at least two photo-generated carrier collection and readout regions, photo-generated carriers representing the corresponding addends affect carriers in the read regions in the corresponding photo-generated carrier collection and readout regions, and the affected carriers are output in form of current under the drive of a constant voltage; the current is converged when flowing through the connected output terminals, and the converged current value is output as a result of the adder.

18. The photoelectric computing method according to claim 15, which is used to perform a multiplication operation, wherein:
photo-generated carriers generated by photons emitted by the light emitting unit are set as a first multiplier factor of the multiplier; and
in the photo-generated carrier collection and readout region, carriers input from the electrical input terminal of the readout region are used as a second multiplier factor of the multiplier, both the photo-generated carriers representing the first multiplier factor and the carriers representing the second addend affect carriers in the readout region in the photo-generated carrier collection and readout region, and the affected carriers are output as a result of the multiplier from an output terminal of a photoelectron collection region and readout region.

19. The photoelectric computing method according to claim 15, which is used to perform a multiplication operation, wherein:
photo-generated carriers generated by photons emitted by the light emitting unit are used as optical input terminal data of the multiplier, i.e., a first multiplier factor;
quantities representing a second multiplier factor are converted into binary quantities and serially injected from the carrier control region in form of modulated carriers in an order from high to low bits, and the modulated carriers are used the second multiplier factor of the multiplier and input from the electrical input terminal;
in the carrier collection and readout region, the photo-generated carriers representing the first multiplier factor and the carriers that represent the second multiplier factor and are serially input into the carrier control region successively affect carriers in the readout region in the corresponding photo-generated carrier collection and readout region; and
an output quantity from an output terminal of a photo-electron collection region and readout region is output as a result and then shifted and accumulated successively, and the obtained result is used as a final result of the multiplication operation; or
the photoelectric computation method is used to perform a multiplication operation, wherein:
photo-generated carriers generated by photons emitted by the at least two light emitting units are used as optical input terminal data of a multiplier, i.e., a first multiplier factor;
quantities representing a second multiplier factor are converted into binary quantities and are injected, in form of modulated carriers, into different units from the at least two carrier control regions in parallel in an order from high to low bits, and the modulated carriers are used as the second multiplier factor; and
in the at least two carrier collection and readout regions, the photo-generated carriers representing the first multiplier factor and the carriers in the carrier control regions representing binarized data at different bits of the second multiplier factor affect carriers in the readout regions in the at least two corresponding photo-generated carrier collection and readout regions, respectively, the affected carriers are output as a result from an output terminal of a photoelectron collection region and readout region, and the results are shifted and accumulated to obtain a final result of the multiplication operation; or
the photoelectric computation method is used to perform a multiplication operation, wherein:
photo-generated carriers generated by photons emitted by the at least two light emitting units are used as optical input terminal data of a multiplier, i.e., a first multiplier factor;
quantities used as a second multiplier factor are converted into binary quantities and are injected into different units from the at least two carrier control regions in parallel in form of modulated carriers in an order from high to low bits, and the modulated carriers are used as the second multiplier factor; and
in the photo-generated carrier collection and readout regions, carriers equivalent to bit weights of input data in the carrier control regions are input from electrical input terminals, and the photo-generated carriers representing the first multiplier factor, the carriers in the carrier control regions representing binarized data at different bits of the second multiplier factor, and the carriers representing the bit weights and being input from the electrical input terminals of the carrier collection and readout regions affect carriers in the readout regions in the at least two corresponding photo-generated carrier collection and readout regions, the affected carriers are output in form of current, and the current is converged to obtain a result that is output as a result of the multiplier.

20. The photoelectric computing method according to claim 15, which is used to perform a matrix vector multiplication operation, wherein:
photo-generated carriers generated by photons emitted by the light emitting units are used as optical input terminal data of a matrix vector multiplier, i.e., matrix data to be multiplied;
the photoelectric computing units are arranged in a unit array having the same number of rows and columns as the matrix to be multiplied, without changing the optical correspondence between the light emitting units and the photoelectric computing units, wherein output terminals of the photo-generated carrier collection and readout regions of all units in each column of the unit array are connected to each other, and the carrier control regions of all units in each row of the unit array are connected to each other;
each element of the vector data is converted into binarized data, and data not representing different elements are injected into different rows serially from the connected carrier control regions in the same row, in form of modulated carriers, in an order from high to low bits, as vector data to be multiplied; and
in the carrier collection and readout regions, the photo-generated carriers representing the matrix data and the carriers in the carrier control regions representing the binarized data at different bits of the vector data affect the carriers in the readout regions in the corresponding photo-generated carrier collection and readout regions, and the affected carriers are output in form of current under the drive of a constant voltage, the current is then converged by column and shifted and accumulated to obtain a final multiplication result vector; or the photoelectric computation method is used to perform a matrix vector multiplication operation, wherein:

photo-generated carriers generated by photons emitted by the plurality of light emitting units are used as optical input terminal data of a matrix vector multiplier, i.e., matrix data;

the plurality of photoelectric computation units are divided into multiple groups, and the units in each group are arranged in a unit array having the same number of rows and columns as the matrix to be multiplied, without changing the optical correspondence between the light emitting units and the photoelectric computation units, wherein output terminals of the photo-generated carrier collection and readout regions of all units in each column of the unit array are connected to each other, and the carrier control regions of all units in each row of the unit array are connected to each other;

each element of the vector data is converted into binarized data, and data representing different bits of different elements are injected into different rows of different groups serially from the connected carrier control regions in the same row in the corresponding group in form of modulated carriers in parallel, as vector data; and in the plurality of carrier collection and readout regions, the photo-generated carriers representing the matrix data and the carriers in the carrier control regions representing the binarized data at different bits of the vector data affect the carriers in the readout regions in the plurality of corresponding photo-generated carrier collection and readout regions, and the affected carriers are output in form of current under the drive of a constant voltage, the current is then converged by column and shifted and accumulated to obtain a final result vector.

21. The photoelectrical computing method according to claim 20 which is used to perform an average pooling operation, to perform an average pooling operation on a matrix having at least 2 elements, wherein:

a matrix to be pooled is split into independent elements, and all the split elements are recombined to obtain a vector having a dimension the same as the number of elements in the matrix to be pooled;

the matrix vector multiplier is suitable for performing a matrix vector operation on a matrix to be multiplied having a same number of as the number of elements in the matrix to be pooled and one column;

the vector recombined after splitting the matrix to be pooled is input into the matrix vector multiplier as a vector input terminal data, i.e., electrical input terminal data of the matrix vector multiplier; the matrix, in which the dimension is the same as the used matrix vector multiplier and each element is the reciprocal of the number of elements in the matrix to be pooled, is input into the matrix vector multiplier as the matrix input terminal data, i.e., optical input terminal data of the matrix vector multiplier, as the average denominator in the average pooling operation; and the output result from the result output terminal is a result of dividing each element in the matrix to be pooled by the number of elements and then adding, i.e., a result of average pooling of the matrix to be pooled.

22. The photoelectric computing method according to claim 15, which is used to perform a convolution operation, wherein:

photo-generated carriers generated by photons emitted by the light emitting units are used as the optical input terminal data of a convolver, i.e., convolution kernel data;

the photoelectric computing units are arranged in a unit array having the same number of rows and columns as the convolution kernel for the convolution operation, without changing the optical correspondence between the light emitting units and the photoelectric computing units, wherein the output terminals of the readout regions in all the photo-generated carrier collection and readout regions of the photoelectric computing units in the unit array are connected to form an output terminal;

a small matrix having a dimension the same as the size of the convolution kernel is split from the matrix to be convoluted after zero padding according to the current position of the convolution kernel, and each element in the small matrix is converted into binarized data and then serially input into each unit from the carrier control region in form of modulated carriers in an order from high to low bits to serve as data of the matrix to be convoluted;

in the carrier collection and readout regions of the units in the array, the photo-generated carriers representing the corresponding bit data of the small matrix split from the matrix to be convoluted and the carriers in the carrier control regions representing the convolution kernel data affect carriers in the readout regions in the corresponding photo-generated carrier collection and readout regions, and the affected carriers are output in form of current under the drive of a constant voltage, the current is then converged, and shifted and accumulated to obtain a result of convolution operation corresponding to the current position of the convolution kernel; and the convolution kernel is moved according to the step size required by the convolution operation, data of the small matrix split from the data of the matrix to be convoluted corresponding to the current position of the convolution kernel is input again to obtain an output value, and the convolution kernel is continuously moved until the whole convolution operation is completed; and, all the output values are recombined to obtain a matrix having a corresponding dimension, i.e., a final result of convolution operation; or the photoelectric computation method is used to perform a convolution operation, wherein:

photo-generated carriers generated by photons emitted by the light emitting units are used as optical input terminal data of a convolver, i.e., convolution kernel data;

the photoelectric computation units are divided into multiple groups, and the photoelectric computation units in each group are arranged in an array having the same number of rows and columns as the convolution kernel, without changing the optical correspondence between the light emitting units and the photoelectric computation units, wherein the output terminals of the readout regions in all the photo-generated carrier collection and readout regions of the photoelectric computation units in the unit array of each group are connected to form an output terminal;

a small matrix having a dimension the same as the size of the convolution kernel is split from the matrix to be convoluted after zero padding according to the current position of the convolution kernel, and each element in the small matrix is converted into binarized data, and the corresponding bit data is input, in parallel, into each unit from the carrier control region of the array of the corresponding group in form of modulated carriers to serve as data of the matrix to be convoluted;

in the carrier collection and readout regions of the photoelectric computation units, the photo-generated carriers representing the corresponding bit data of the small matrix split from the matrix to be convoluted and the carriers in the carrier control regions representing the convolution kernel data affect carriers in the readout regions in the corresponding photo-generated carrier collection and readout regions, the affected carriers are output in form of current under the drive of a constant voltage, and all the output current of the array of each group of photoelectric computation units is converged, and shifted and accumulated to obtain a result of convolution operation corresponding to the current position of the convolution kernel; and the convolution kernel is moved according to a step size required by the convolution operation, data of the small matrix split from the data of the matrix to be convoluted corresponding to the current position of the convolution kernel is input again to obtain an output value, and the convolution kernel is continuously moved until the whole convolution operation is completed; and, all the output values are recombined to obtain a matrix having a corresponding dimension, i.e., a final result of convolution operation.

23. The photoelectric computing method according to claim 15, which is used for CT algorithm acceleration, wherein:

photo-generated carriers generated by photons emitted by the light emitting units are used as optical input terminal data of a CT algorithm accelerator, i.e., system matrix data;

the photoelectric computing units are arranged in a unit array having the same number of rows and columns as the system matrix, without changing the optical correspondence between the light emitting units and the photoelectric computing units, wherein the output terminals of the readout regions in all the photo-generated carrier collection and readout regions of the photoelectric computing units in the same column of the unit array are connected to form an output terminal;

according to the current number of iterations, each element in a pixel data vector of the corresponding predicted image is converted into binarized data and then serially input into each unit from the carrier control regions, in form of modulated carriers, in an order from high to low bits, as predicted image data;

in the carrier collection and readout regions of the units in the array, the photo-generated carriers representing the corresponding bit data of pixel data of the predicted image corresponding to the current number of iterations and the carriers in the carrier control regions representing the system matrix data affect carriers in the readout regions in the corresponding photo-generated carrier collection and readout regions, and the affected carriers are output in form of current under the drive of a constant voltage, and the current is converged by column, shifted and accumulated, and subjected to a next iteration after other non-matrix vector multiplication operations in the control system are completed; and during an initial iteration, the pixel data of the predicated image for the first iteration is input into the carrier control regions of the units in the first column of the array, and the output result obtained from the first column is processed by the control system and subjected to the second iteration; the pixel data of the predicted image for the second iteration is input into the carrier control regions of the units in the second column of the array; by that analogy, after the iterations of all columns are completed, a result is output and the iteration continues from first column again; and, after all iterations are completed, the data is output to the control system and then transmitted to a display system for imaging, so as to obtain a processed CT image; or the photoelectric computation method is used for CT algorithm acceleration, wherein:

photo-generated carriers generated by photons emitted by the light emitting units are used as optical input terminal data of a CT algorithm accelerator, i.e., system matrix data;

the photoelectric computation units are divided into multiple groups, and the photoelectric computation units in each group are arranged in an array having the same number of rows and columns as the system matrix, without changing the optical correspondence between the light emitting units and the photoelectric computation units, wherein the output terminals of the readout regions in all the photo-generated carrier collection and readout regions of the photoelectric computation units in the same column of the unit array are connected to form an output terminal;

according to the current number of iterations, each element in a pixel data vector of the corresponding predicted image is converted into binarized data, and the corresponding bit data is input, in parallel, into each unit from the carrier control regions in the array of the corresponding group of photoelectric computation units, in form of modulated carriers, as predicted image data;

in the carrier collection and readout regions of the units in the array, the photo-generated carriers representing the corresponding bit data of pixel of the predicted image corresponding to the current number of iterations and the carriers in the carrier control regions representing the system matrix data affect carriers in the readout regions in the corresponding photo-generated carrier collection and readout regions, the affected carriers are output in form of current under the drive of a constant voltage, and the current is converged, shifted and accumulated and then subjected to a next iteration after other non-matrix vector multiplication operations in the control system are completed; and during an initial iteration, the pixel data of the predicated image for the first iteration is input into the carrier control regions of the units in the first column of the array of each group of photoelectric computation units, and the output result obtained from the first column is processed by the control system and subjected to the second iteration; the pixel data of the predicted image for the second iteration is input into the carrier control regions of the units in the second column of the array of each group of photoelectric computation units; by that analogy, after the iterations of all columns are completed, a result is output and the iteration continues from first column again; and, after all iterations are completed, the data is output to the control system and then transmitted to a display system for imaging, so as to obtain a processed CT image.

24. A neural network algorithm acceleration device, comprising a photoelectric computation unit, into which operation quantities are input in two manners, i.e., optical inputting and electrical inputting, the photoelectric computation unit comprising one semiconductor multifunctional area structure, wherein the semiconductor multifunctional area comprises at least one carrier control region, at least one coupled region and at least one photo-generated carrier collection and readout region, wherein:

an operation quantity to be input optically, i.e., an optical input quantity, is input by converting incident photons into photo-generated carriers, and an operation quantity to be input electrically, i.e., an electrical input quantity, is input by directly injecting carriers;

the carrier control region is configured to control and modulate carriers in the photoelectric computation unit and used as an electrical input terminal of the photoelectric computation unit to be input with one operation quantity as an electrical input quantity; or, the carrier control region is configured to just control and modulate carriers in the photoelectric computation unit, with an electrical input quantity being input from other regions;

the coupled region is configured to connect a collection region with a readout region in the photo-generated carrier collection and readout region, so that photo-generated carriers generated by incidence of photons affect carriers in the photoelectric computation unit to form an operation relationship; and in the photo-generated carrier collection and readout region, the collection region is configured to absorb incident photons and collect the generated photo-generated carriers and is used as an optical input terminal of the photoelectric computation unit to be input with one operation quantity as an optical input quantity; the readout region is configured as an electrical input terminal of the photoelectric computation unit to be input with one operation quantity as an electrical input quantity and is also configured as an output terminal of the photoelectric computation unit to output carriers affected by the optical input quantity and the electrical input quantity as a unit output quantity; or, the electrical input quantity is input from other regions, and the readout region is used only as an output terminal of the photoelectric computation unit to output carriers affected by the optical input quantity and the electrical input quantity as a unit output quantity, the photoelectric computation unit further comprising one light emitting unit optically corresponding to the photoelectric computation unit, the light emitting unit being configured to emit light to generate photo-generated carriers in the photoelectric computation unit, the photo-generated carriers being used as an optical input quantity for the photoelectric computation unit and interacting with an electrical input quantity that is input into the photoelectric computation unit from the electrical input terminal to obtain a result of photoelectric operation, wherein the light emitting unit is driven by one signal conversion driver, and the signal conversion driver is configured to convert a digital signal into the pulse width of a driving current pulse of the light emitting unit and drive a light emitting array formed by a plurality of light emitting units; or, a particular related light emitting unit is driven by addressing so that the related light emitting unit generates an optical signal of a corresponding duration, and the optical signal is set as an optical input quantity for the corresponding photoelectric computation unit, and the photoelectric computation unit is arranged in a two-dimensional or three-dimensional array to form a photoelectric computation module so as to realize various particular operations, the photoelectric computation unit further comprising a plurality of light emitting units and a plurality of photoelectric computation units to form a serial matrix vector multiplier, each of the photoelectric computation units at least comprising a carrier control region, a coupled region and a photo-generated carrier collection and readout region, wherein:

the light emitting units are configured to emit optical signals representing data in a matrix to be multiplied;

the photoelectric computation units are arranged in a unit array having the same number of rows and columns as the matrix to be multiplied, without changing the optical correspondence between the light emitting units and the photoelectric computation units, wherein output terminals of the photo-generated carrier collection and readout regions of all units in each column of the unit array are connected to each other, and the carrier control regions of all units in each row of the unit array are connected to each other;

the carrier control regions of all units in each row of the unit array are configured to control and modulate carriers in the unit and input, by column, carriers representing elements in vectors, and are used as vector data input terminals of the matrix vector multiplier, wherein, after the data of each element of the vector is converted into binarized data, the carriers representing the binarized data are input serially and bitwise into the carrier control region of each row;

the coupled regions of the photoelectric computation units are responsible for connecting the photo-generated carrier collection and readout regions, and are configured to affect carriers in the readout regions by using photo-generated carriers in the collection regions in the photo-generated carrier collection and readout regions; and in the photo-generated carrier collection and readout regions of the plurality of photoelectric computation units, each unit comprises one optical input terminal and at least one result output terminal, wherein the optical input terminals of the photoelectric computation units are configured to receive optical signals emitted by the corresponding light emitting units and input the data in the matrix, and are used as matrix data input terminals of the matrix vector multiplier; the result output terminals are configured to output carriers in the readout regions in the photo-generated carrier collection and readout regions affected by the matrix data and the vector data, the carriers are output in form of current under the drive of a constant voltage, and the current is then converged by column, and the result is output; the output result is shifted according to the input bits, and then accumulated to obtain a final result vector; or the photoelectric computation unit is used to form a parallel matrix vector multiplier and comprises a plurality of light emitting units and a plurality of photoelectric computation units, each of the photoelectric computation units at least comprising a carrier control region, a coupled region and a photo-generated carrier collection and readout region, wherein:

the light emitting units are configured to emit optical signals representing data in a matrix to be multiplied;

the photoelectric computation units are divided into multiple groups, and the units in each group are arranged in a unit array having the same number of rows and columns as the matrix to be multiplied, without changing the optical correspondence between the light emitting units and the photoelectric computation units, wherein output terminals of the photo-generated carrier collection and readout regions of all units in each column of the unit array are connected to each other, and the carrier control regions of all units in each row of the unit array are connected to each other;

the carrier control regions of all units in each row of each unit array are configured to control and modulate carriers in the unit and input, in parallel, by group and by column, carriers representing corresponding bit data of the elements in vectors after binarization, and the carrier control regions are used as vector data input terminals of the matrix vector multiplier;

the coupled regions of the plurality of photoelectric computation units are responsible for connecting the photo-generated carrier collection and readout regions, and are configured to affect carriers in the readout regions by using photo-generated carriers in the collection regions in the photo-generated carrier collection and readout regions; and in the photo-generated carrier collection and readout regions of the plurality of photoelectric computation units, each unit comprises one optical input terminal and at least one result output terminal, wherein the optical input terminals of the plurality of photoelectric computation units are configured to receive the optical signals emitted by the plurality of light emitting units and input the data in the matrix, and are used as matrix data input terminals of the matrix vector multiplier; the plurality of result output terminals are configured to output carriers in the readout regions in the photo-generated carrier collection and readout regions affected by the matrix data and the vector data, the carriers are output in form of current under the drive of a constant voltage, the current is then converged by column, shifted according to the input bits and accumulated to obtain a final result vector, the photoelectric computation unit is used to form an average pooling calculator that performs a pooling operation on a matrix at least comprising two elements, the photoelectric matrix vector multiplier comprising one matrix input terminal, one vector input terminal and a result output terminal, wherein:

the photoelectric matrix vector multiplier, having one column and a same number of rows as the number of elements in the matrix to be pooled, is used as an average pooling calculator for the matrix to be pooled;

the vector input terminal of the photoelectric matrix vector multiplier, as an electrical input terminal to be input with different elements in the matrix to be pooled, is used as a to-be-pooled matrix input terminal of the pooling unit; and, the matrix input terminal, as an optical input terminal to be input with a matrix, which has one column and a same number of rows as the number of elements in the matrix to be pooled and in which each element is a reciprocal of the number of the elements in the matrix to be pooled, is used as an average denominator input terminal; and the result output terminal is configured to output a final average pooling result of the matrix to be pooled, and the photoelectric computation unit forms a serial convolver, each of the photoelectrical computation units at least comprising a carrier control region, a coupled region and a photo-generated carrier collection and readout region, wherein:

the light emitting units are configured to emit optical signals representing data in a convolution kernel;

the photoelectric computation units are arranged into an array having the same number of rows and columns as the convolution kernel, without changing the optical correspondence between the light emitting units and the photoelectric computation units, wherein the output terminals of the photo-generated carrier collection and readout regions of all units in the unit array are connected to each other to form an output terminal;

the carrier control regions of the photoelectric computation units in the array are configured to control and modulate carriers in the unit, and serially input carriers representing corresponding bit data of the elements in a matrix to be convoluted obtained after zero padding and the elements in a small matrix corresponding to the original position of the convolution kernel, and are used as to-be-convoluted matrix data input terminals of the convolver; and, the data in the small matrix is converted into binarized data, and the carriers representing the binarized data are input serially and bitwise into the carrier control regions of the units;

the coupled regions of the photoelectric computation units in the array connect the photo-generated carrier collection and readout regions, and are configured to make affect carriers in the readout regions by using photo-generated carriers in the collection regions in the photo-generated carrier collection and readout regions; and the photo-generated carrier collection and readout region of each photoelectric computation unit in the array comprises one optical input terminal and at least one result output terminal, wherein the optical input terminal is configured to receive the optical signal emitted by the light emitting unit and input the data in the convolution kernel, and is used as a convolution kernel input terminal of the convolver; the output terminal of each unit is configured to output carriers in the readout region in the photo-generated carrier collection and readout region affected by the corresponding bit data of the small matrix split from the matrix to be convoluted and the convolution kernel data; the carriers are output in form of current under the drive of a constant voltage, and the output current from all the photoelectric computation units in the array are converged by the output terminals connected in parallel, then shifted according to the input bits and accumulated to obtain a result of convolution operation corresponding to the current position of the convolutional kernel; the convolution kernel is moved according to the step size required by the convolution operation, data of the small matrix split from the data of the matrix to be convoluted corresponding to the current position of the convolution kernel is input again to obtain an output value, and then the convolution kernel is continuously moved until the whole convolution operation is completed; and, all the output values are recombined to obtain a matrix having a corresponding dimension, i.e., a final result of convolution operation; or the photoelectric computation unit forms a parallel convolver, the photoelectrical computation unit at least comprising a carrier control region, a coupled region and a photo-generated carrier collection and readout region, wherein:

the light emitting units are configured to emit optical signals representing data in a convolution kernel;

the photoelectric computation units are divided into multiple groups, and the photoelectric computation units in each group are arranged in an array having the same number of rows and columns as the convolution kernel, without changing the optical correspondence between the light emitting units and the photoelectric computation units, wherein the output terminals of the photo-generated carrier collection and readout regions of all units in the array of each group of photoelectric computation units are connected to each other to form an output terminal;

the carrier control regions of the photoelectric computation units in the array of each group of photoelectric computation units are configured to control and modulate carriers in the unit, and serially input carriers representing corresponding bit data of the elements in a matrix to be convoluted obtained after zero padding and the elements in a small matrix corresponding to the original position of the convolution kernel, and are used as to-be-convoluted matrix data input terminals of the convolver; and, the data in the small matrix is converted into binarized data, and the corresponding bit data is input into the unit array of the corresponding group;

the coupled regions of the photoelectric computation units in the array of each group of photoelectric computation units are responsible for connecting the photo-generated carrier collection and readout regions, and are configured to affect carriers in the readout regions by using photo-generated carriers in the collection regions in the photo-generated carrier collection and readout regions; and the photo-generated carrier collection and readout region of each photoelectric computation unit in the array of each group of photoelectric computation units comprises one optical input terminal and at least one result output terminal, wherein the optical input terminal is configured to receive the optical signal emitted by the light emitting unit and input the data in the convolution kernel, and is a convolution kernel input terminal of the convolver, and the arrays of different groups of photoelectric computation units receive the same optical input data; the output terminal of each unit is configured to output carriers in the readout region in the photo-generated carrier collection and readout region affected by the corresponding bit data of the small matrix split from the matrix to be convoluted and the convolution kernel data; the carriers are output in form of current under the drive of a constant voltage, and the output current from all the photoelectric computation units in the array are converged by the output terminals connected in parallel, then shifted according to the input bits and accumulated to obtain a result of convolution operation corresponding to the current position of the convolutional kernel; the convolution kernel is moved according to the step size required by the convolution operation, data of the small matrix split from the data of the matrix to be convoluted corresponding to the current position of the convolution kernel is input again to obtain an output value, and the convolution kernel is continuously moved until the whole convolution operation is completed; and, all the output values are recombined to obtain a matrix having a corresponding dimension, i.e., a final result of convolution operation, wherein:

a matrix input terminal of the matrix vector multiplier is configured to be input with a network weight, and output data or initial data of an upper-level network is input from a vector input terminal;

an average denominator input terminal of the average pooling calculator is configured to be input with a reciprocal of the number of elements in a matrix to be pooled, and a to-be-pooled matrix input terminal is configured to be input with data to be pooled;

a convolution kernel input terminal of the convolver is configured to be input with data in a convolution kernel, and small matrix data in a matrix to be convoluted corresponding to the current position of the convolution kernel is input from a to-be-convoluted matrix input terminal; and a nonlinear function module consists of electrical computation components, and is configured to operate nonlinear functions; and a general logic operation module comprises an electrical operator and/or is based on the photoelectric computing unit, and is configured to integrate and control operation functions of the matrix vector multiplier, the average pooling calculator and the convolver.

25. A method for accelerating neural network operations, which uses a photoelectric computation method executed by a photoelectric computation unit, the photoelectric computation unit comprising at least one light emitting unit and at least one photoelectric computation unit, the photoelectric computation unit comprising one semiconductor multifunctional area structure, the semiconductor multifunctional area comprising a carrier control region, a coupled region and a photo-generated carrier collection and readout region, wherein the method comprises steps of:

configuring the light emitting unit to emit light, irradiating the light onto the photoelectric computation unit, and generating, under the control of the carrier control region, photo-generated carriers in a collection region in a photo-generated carrier collection and readout region as a first operation quantity for the photoelectric computation unit;

generating an electrical operation quantity in one region in the multifunctional area, and inputting corresponding carriers, the carriers being used as a second operation quantity for the photoelectric computation unit;

affecting carriers in the photo-generated carrier readout region by using both the photo-generated carriers as the first operation quantity and the carriers as the second operation quantity, the affected carriers being used as the result of photoelectric operation; and outputting, from an output terminal of the readout region in the photo-generated carrier collection and readout region, the carriers as the result of photoelectric operation, the photoelectric computing method is used to perform a matrix vector multiplication operation, wherein:

photo-generated carriers generated by photons emitted by the light emitting units are used as optical input terminal data of a matrix vector multiplier, i.e., matrix data to be multiplied;

the photoelectric computation units are arranged in a unit array having the same number of rows and columns as the matrix to be multiplied, without changing the optical correspondence between the light emitting units and the photoelectric computation units, wherein output terminals of the photo-generated carrier collection and readout regions of all units in each column of the unit array are connected to each other, and the carrier control regions of all units in each row of the unit array are connected to each other;

each element of the vector data is converted into binarized data, and data not representing different elements are injected into different rows serially from the connected carrier control regions in the same row, in form of modulated carriers, in an order from high to low bits, as vector data to be multiplied; and in the carrier collection and readout regions, the photo-generated carriers representing the matrix data and the carriers in the carrier control regions representing the binarized data at different bits of the vector data affect the carriers in the readout regions in the corresponding photo-generated carrier collection and readout regions, and the affected carriers are output in form of current under the drive of a constant voltage, the current is then converged by column and shifted and accumulated to obtain a final multiplication result vector; or the photoelectric computation method is used to perform a matrix vector multiplication operation, wherein:

photo-generated carriers generated by photons emitted by the plurality of light emitting units are used as optical input terminal data of a matrix vector multiplier, i.e., matrix data;

the plurality of photoelectric computation units are divided into multiple groups, and the units in each group are arranged in a unit array having the same number of rows and columns as the matrix to be multiplied, without changing the optical correspondence between the light emitting units and the photoelectric computation units, wherein output terminals of the photo-generated carrier collection and readout regions of all units in each column of the unit array are connected to each other, and the carrier control regions of all units in each row of the unit array are connected to each other;

each element of the vector data is converted into binarized data, and data representing different bits of different elements are injected into different rows of different groups serially from the connected carrier control regions in the same row in the corresponding group in form of modulated carriers in parallel, as vector data; and in the plurality of carrier collection and readout regions, the photo-generated carriers representing the matrix data and the carriers in the carrier control regions representing the binarized data at different bits of the vector data affect the carriers in the readout regions in the plurality of corresponding photo-generated carrier collection and readout regions, and the affected carriers are output in form of current under the drive of a constant voltage, the current is then converged by column and shifted and accumulated to obtain a final result vector, the photoelectrical computation method is used to perform an average pooling operation, to perform an average pooling operation on a matrix having at least 2 elements, wherein:

a matrix to be pooled is split into independent elements, and all the split elements are recombined to obtain a vector having a dimension the same as the number of elements in the matrix to be pooled;

the matrix vector multiplier is suitable for performing a matrix vector operation on a matrix to be multiplied having a same number of as the number of elements in the matrix to be pooled and one column;

the vector recombined after splitting the matrix to be pooled is input into the matrix vector multiplier as a vector input terminal data, i.e., electrical input terminal data of the matrix vector multiplier; the matrix, in which the dimension is the same as the used matrix vector multiplier and each element is the reciprocal of the number of elements in the matrix to be pooled, is input into the matrix vector multiplier as the matrix input terminal data, i.e., optical input terminal data of the matrix vector multiplier, as the average denominator in the average pooling operation; and the output result from the result output terminal is a result of dividing each element in the matrix to be pooled by the number of elements and then adding, i.e., a result of average pooling of the matrix to be pooled, and the photoelectrical computation method is used to perform a convolution operation, wherein:

photo-generated carriers generated by photons emitted by the light emitting units are used as the optical input terminal data of a convolver, i.e., convolution kernel data;

the photoelectric computation units are arranged in a unit array having the same number of rows and columns as the convolution kernel for the convolution operation, without changing the optical correspondence between the light emitting units and the photoelectric computation units, wherein the output terminals of the readout regions in all the photo-generated carrier collection and readout regions of the photoelectric computation units in the unit array are connected to form an output terminal;

a small matrix having a dimension the same as the size of the convolution kernel is split from the matrix to be convoluted after zero padding according to the current position of the convolution kernel, and each element in the small matrix is converted into binarized data and then serially input into each unit from the carrier control region in form of modulated carriers in an order from high to low bits to serve as data of the matrix to be convoluted;

in the carrier collection and readout regions of the units in the array, the photo-generated carriers representing the corresponding bit data of the small matrix split from the matrix to be convoluted and the carriers in the carrier control regions representing the convolution kernel data affect carriers in the readout regions in the corresponding photo-generated carrier collection and readout regions, and the affected carriers are output in form of current under the drive of a constant voltage, the current is then converged, and shifted and accumulated to obtain a result of convolution operation corresponding to the current position of the convolution kernel; and the convolution kernel is moved according to the step size required by the convolution operation, data of the small matrix split from the data of the matrix to be convoluted corresponding to the current position of the convolution kernel is input again to obtain an output value, and the convolution kernel is continuously moved until the whole convolution operation is completed; and, all the output values are recombined to obtain a matrix having a corresponding dimension, i.e., a final result of convolution operation; or the photoelectric computation method is used to perform a convolution operation, wherein:

photo-generated carriers generated by photons emitted by the light emitting units are used as optical input terminal data of a convolver, i.e., convolution kernel data;

the photoelectric computation units are divided into multiple groups, and the photoelectric computation units in each group are arranged in an array having the same number of rows and columns as the convolution kernel, without changing the optical correspondence between the light emitting units and the photoelectric computation units, wherein the output terminals of the readout regions in all the photo-generated carrier collection and readout regions of the photoelectric computation units in the unit array of each group are connected to form an output terminal;

a small matrix having a dimension the same as the size of the convolution kernel is split from the matrix to be convoluted after zero padding according to the current position of the convolution kernel, and each element in the small matrix is converted into binarized data, and the corresponding bit data is input, in parallel, into each unit from the carrier control region of the array of the corresponding group in form of modulated carriers to serve as data of the matrix to be convoluted;

in the carrier collection and readout regions of the photoelectric computation units, the photo-generated carriers representing the corresponding bit data of the small matrix split from the matrix to be convoluted and the carriers in the carrier control regions representing the convolution kernel data affect carriers in the readout regions in the corresponding photo-generated carrier collection and readout regions, the affected carriers are output in form of current under the drive of a constant voltage, and all the output current of the array of each group of photoelectric computation units is converged, and shifted and accumulated to obtain a result of convolution operation corresponding to the current position of the convolution kernel; and the convolution kernel is moved according to a step size required by the convolution operation, data of the small matrix split from the data of the matrix to be convoluted corresponding to the current position of the convolution kernel is input again to obtain an output value, and the convolution kernel is continuously moved until the whole convolution operation is completed; and, all the output values are recombined to obtain a matrix having a corresponding dimension, i.e., a final result of convolution operation, wherein the method comprises steps of:

inputting a network weight from a matrix input terminal of a related matrix vector multiplier, and inputting, from a vector input terminal of the matrix vector multiplier, output data or initial data of an upper-level network;

inputting, from an average denominator input terminal of a related average pooling calculator, a reciprocal of the number of elements in a matrix to be pooled, and inputting data to be pooled from a to-be-pooled matrix input terminal of the average pooling calculator;

inputting data in a convolution kernel from a convolution kernel input terminal of a related convolver, and inputting, from a to-be-convoluted matrix input terminal of the convolver, small matrix data in a matrix to be convoluted corresponding to the current position of the convolution kernel;

using a nonlinear function module including electrical computation components to operate nonlinear functions; and using a general logic operation module, comprising an electrical operator and/or is based on the photoelectric computing unit.

* * * * *